United States Patent
Koezuka et al.

(10) Patent No.: US 9,748,403 B2
(45) Date of Patent: Aug. 29, 2017

(54) SEMICONDUCTOR DEVICE AND DISPLAY DEVICE INCLUDING THE SEMICONDUCTOR DEVICE

(71) Applicant: Semiconductor Energy Laboratory Co., Ltd., Atsugi-shi, Kanagawa-ken (JP)

(72) Inventors: Junichi Koezuka, Tochigi (JP); Masami Jintyou, Tochigi (JP); Yukinori Shima, Gunma (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/160,059

(22) Filed: May 20, 2016

(65) Prior Publication Data

US 2016/0343868 A1 Nov. 24, 2016

(30) Foreign Application Priority Data

May 22, 2015 (JP) ................................. 2015-104495

(51) Int. Cl.
*H01L 29/786* (2006.01)
*H01L 27/12* (2006.01)
(Continued)

(52) U.S. Cl.
CPC ...... *H01L 29/7869* (2013.01); *H01L 27/1225* (2013.01); *H01L 29/045* (2013.01);
(Continued)

(58) Field of Classification Search
CPC ........... H01L 29/7869; H01L 29/78693; H01L 29/18696; H01L 27/1225; H01L 29/66742; H01L 29/66969; H01L 29/786
See application file for complete search history.

(56) References Cited

U.S. PATENT DOCUMENTS 5,731,856 A   3/1998 Kim et al.
5,744,864 A   4/1998 Cillessen et al.
(Continued)

FOREIGN PATENT DOCUMENTS

EP   1737044 A   12/2006
EP   2226847 A   9/2010
(Continued)

OTHER PUBLICATIONS

International Search Report (Application No. PCT/IB2016/052812) Dated Nov. 1, 2016.
(Continued)

*Primary Examiner* — Ermias Woldegeorgis
(74) *Attorney, Agent, or Firm* — Fish & Richardson P.C.

(57) ABSTRACT

The reliability of a transistor including an oxide semiconductor is improved. The transistor in a semiconductor device includes a first oxide semiconductor film over a first insulating film, a gate insulating film over the first oxide semiconductor film, a second oxide semiconductor film over the gate insulating film, and a second insulating film over the first oxide semiconductor film and the second oxide semiconductor film. The first oxide semiconductor film includes a channel region overlapping with the second oxide semiconductor film, a source region and a drain region each in contact with the second insulating film. The channel region includes a first layer and a second layer in contact with a top surface of the first layer and covering a side surface of the first layer in the channel width direction. The second oxide semiconductor film has a higher carrier density than the first oxide semiconductor film.

25 Claims, 35 Drawing Sheets

(51) Int. Cl.
  *H01L 29/24* (2006.01)
  *H01L 29/04* (2006.01)
  *H01L 29/66* (2006.01)

(52) U.S. Cl.
  CPC ........ *H01L 29/24* (2013.01); *H01L 29/78693* (2013.01); *H01L 29/78696* (2013.01); *H01L 29/66742* (2013.01); *H01L 29/66969* (2013.01); *H01L 29/786* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 8,384,076 B2 | 2/2013 | Park et al. |
| 8,421,083 B2 | 4/2013 | Yamazaki et al. |
| 8,502,221 B2 | 8/2013 | Yamazaki |
| 8,624,240 B2 | 1/2014 | Sato et al. |
| 8,883,556 B2 | 11/2014 | Yamazaki |
| 8,884,282 B2 | 11/2014 | Yamazaki |
| 8,936,965 B2 | 1/2015 | Imoto et al. |
| 8,952,377 B2 | 2/2015 | Yamazaki et al. |
| 9,012,993 B2 | 4/2015 | Yamazaki |
| 9,130,049 B2 | 9/2015 | Sano et al. |
| 9,263,589 B2 | 2/2016 | Endo et al. |
| 9,281,410 B2 | 3/2016 | Okazaki et al. |
| 9,530,892 B2 | 12/2016 | Koezuka et al. |
| 9,583,637 B2 | 2/2017 | Sano et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0236596 A1 | 9/2009 | Itai |
| 2009/0278122 A1 | 11/2009 | Hosono et al. |
| 2009/0280600 A1 | 11/2009 | Hosono et al. |
| 2009/0283763 A1 | 11/2009 | Park et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117999 A1 | 5/2010 | Matsunaga et al. |
| 2010/0163874 A1 | 7/2010 | Koyama et al. |
| 2011/0127519 A1 | 6/2011 | Kang et al. |
| 2011/0140100 A1 | 6/2011 | Takata et al. |
| 2011/0240990 A1 | 10/2011 | Yamazaki |
| 2011/0240992 A1 | 10/2011 | Yamazaki |
| 2011/0284844 A1 | 11/2011 | Endo et al. |
| 2012/0032173 A1 | 2/2012 | Sato et al. |
| 2012/0132902 A1 | 5/2012 | Imoto et al. |
| 2012/0161126 A1 | 6/2012 | Yamazaki |
| 2012/0319183 A1* | 12/2012 | Yamazaki ........... H01L 29/7782 257/288 |
| 2013/0009209 A1* | 1/2013 | Yamazaki ........... H01L 27/1225 257/192 |
| 2013/0075732 A1 | 3/2013 | Saito et al. |
| 2013/0244374 A1 | 9/2013 | Okazaki et al. |
| 2013/0277672 A1 | 10/2013 | Sano et al. |
| 2014/0014948 A1 | 1/2014 | Matsukura |
| 2014/0034954 A1 | 2/2014 | Yamazaki et al. |
| 2014/0070209 A1 | 3/2014 | Yamazaki et al. |
| 2014/0110708 A1 | 4/2014 | Koezuka et al. |
| 2014/0239290 A1 | 8/2014 | Kim |
| 2014/0299874 A1 | 10/2014 | Yamazaki |
| 2014/0361289 A1 | 12/2014 | Suzawa |
| 2015/0053977 A1 | 2/2015 | Yamazaki |
| 2015/0228799 A1 | 8/2015 | Koezuka et al. |
| 2015/0325707 A1 | 11/2015 | Sano et al. |

(56) References Cited

U.S. PATENT DOCUMENTS

| | | | |
|---|---|---|---|
| 2016/0240562 | A1 | 8/2016 | Miyake et al. |
| 2016/0260837 | A1 | 9/2016 | Koezuka et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006/165529 | 6/2006 |
| JP | 2009/278115 | 11/2009 |
| JP | 2010-040552 A | 2/2010 |
| JP | 2011-243745 A | 12/2011 |
| JP | 2012/009836 | 1/2012 |
| JP | 2012-033836 A | 2/2012 |
| JP | 2012-129511 A | 7/2012 |
| JP | 2012-151461 A | 8/2012 |
| JP | 2013-219336 A | 10/2013 |
| JP | 2015-015458 A | 1/2015 |
| TW | 201234598 | 8/2012 |
| WO | WO-2004/114391 | 12/2004 |
| WO | WO-2008/126884 | 10/2008 |
| WO | WO-2012/090973 | 7/2012 |

OTHER PUBLICATIONS

Written Opinion (Application No. PCT/IB2016/052812) Dated Nov. 1, 2016.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3,

(56) References Cited

OTHER PUBLICATIONS and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B. (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

(56) References Cited

OTHER PUBLICATIONS

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

9100

9101

9102

9200

9201

9201

9201

SEMICONDUCTOR DEVICE AND DISPLAY DEVICE INCLUDING THE SEMICONDUCTOR DEVICE

TECHNICAL FIELD

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

Attention has been focused on a technique for forming a transistor using a semiconductor thin film formed over a substrate having an insulating surface (also referred to as a field-effect transistor (FET) or a thin film transistor (TFT)). Such transistors are used for a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention.

For example, a technique for forming a transistor using an amorphous oxide containing In, Zn, Ga, Sn, and the like as an oxide semiconductor is disclosed (see Patent Document 1). In addition, a technique for forming a self-aligned top-gate transistor using an oxide thin film is disclosed (see Patent Document 2).

Furthermore, a semiconductor device including, as a base insulating layer of an oxide semiconductor layer in which a channel is formed, an insulating layer that releases oxygen by heating to reduce oxygen vacancies in the oxide semiconductor layer is disclosed (see Patent Document 3).

REFERENCES

Patent Document

[Patent Document 1] Japanese Published Patent Application No. 2006-165529
[Patent Document 2] Japanese Published Patent Application No. 2009-278115
[Patent Document 3] Japanese Published Patent Application No. 2012-009836

DISCLOSURE OF INVENTION

As examples of a transistor including an oxide semiconductor film, an inverted staggered transistor (also referred to as a bottom-gate transistor) and a staggered transistor (also referred to as a top-gate transistor) can be given. As a transistor which includes an oxide semiconductor film and is used for a display device, an inverted staggered transistor is used more often than a staggered transistor because its manufacturing process is relatively simple and its manufacturing cost is low. However, an inverted staggered transistor has the following drawback: as the screen size of a display device increases or the resolution of an image of a display device increases, a typical example of which is a high-resolution display device with 4K×2K pixels (3840 pixels in the horizontal direction and 2160 pixels in the vertical direction) or 8K×4K pixels (7680 pixels in the horizontal direction and 4320 pixels in the vertical direction), signal delay or the like due to parasitic capacitance between a gate electrode and source and drain electrodes of the transistor becomes more severe, and accordingly, the image quality of the display device degrades. Thus, regarding a staggered transistor including an oxide semiconductor film, a structure with stable semiconductor characteristics and high reliability is desired to be developed.

Furthermore, in the case where a transistor is formed using an oxide semiconductor film for a channel region, an oxygen vacancy which is formed in the channel region of the oxide semiconductor film adversely affects the transistor characteristics. For example, the oxygen vacancy in the channel region of the oxide semiconductor film causes carrier generation. The carrier generation in the channel region of the oxide semiconductor film causes a change in the electrical characteristics, typically, a shift of the threshold voltage, of the transistor including the channel region in the oxide semiconductor film. Furthermore, there is a problem in that electrical characteristics vary among transistors. Therefore, it is preferable that the number of oxygen vacancies in the channel region of the oxide semiconductor film be as small as possible. Meanwhile, the transistor including the channel region in the oxide semiconductor film preferably has the following structure: to reduce the contact resistance of the oxide semiconductor film with a source electrode and a drain electrode, regions of the oxide semiconductor film which are in contact with the source electrode and the drain electrode include as many oxygen vacancies as possible and have as low resistance as possible.

In view of the foregoing problems, an object of one embodiment of the present invention is to improve the reliability of a transistor including an oxide semiconductor by suppressing a change in electrical characteristics. Another object of one embodiment of the present invention is to provide a staggered transistor including an oxide semiconductor. Another object of one embodiment of the present invention is to provide a transistor including an oxide semiconductor and having high on-state current. Another object of one embodiment of the present invention is to provide a transistor including an oxide semiconductor and having low off-state current. Another object of one embodiment of the present invention is to provide a semiconductor device with low power consumption. Another object of one embodiment of the present invention is to provide a novel semiconductor device.

Note that the description of the above objects does not disturb the existence of other objects. One embodiment of the present invention does not necessarily achieve all the objects. Other objects are apparent from and can be derived from the description of the specification and the like.

One embodiment of the present invention is a semiconductor device including a transistor. The transistor includes a first oxide semiconductor film over a first insulating film, a gate insulating film over the first oxide semiconductor film, a second oxide semiconductor film over the gate insulating film, and a second insulating film over the first oxide semiconductor film and the second oxide semiconductor film. The first oxide semiconductor film includes a channel region overlapping with the second oxide semiconductor film, a source region in contact with the second insulating film, and a drain region in contact with the second insulating film. The channel region includes a first layer and a second layer which is in contact with a top surface of the first layer and covers a side surface of the first layer in the channel width direction. The second oxide semiconductor film has a higher carrier density than the first oxide semiconductor film.

Another embodiment of the present invention is a semiconductor device including a transistor. The transistor includes a first oxide semiconductor film over a first insulating film, a gate insulating film over the first oxide semiconductor film, a second oxide semiconductor film over the gate insulating film, and a second insulating film over the first oxide semiconductor film and the second oxide semiconductor film. The first oxide semiconductor film includes a channel region overlapping with the second oxide semiconductor film, a source region in contact with the second insulating film, and a drain region in contact with the second insulating film. The channel region includes a first layer, a second layer which is in contact with a top surface of the first layer and covers a side surface of the first layer in the channel width direction, and a third layer in contact with a bottom surface of the first layer. The second oxide semiconductor film has a higher carrier density than the first oxide semiconductor film.

Another embodiment of the present invention is a semiconductor device including a transistor. The transistor includes a first oxide semiconductor film over a first insulating film, a gate insulating film over the first oxide semiconductor film, a second oxide semiconductor film over the gate insulating film, a conductive film over the second oxide semiconductor film, and a second insulating film over the first oxide semiconductor film and the conductive film. The first oxide semiconductor film includes a channel region overlapping with the second oxide semiconductor film, a source region in contact with the second insulating film, and a drain region in contact with the second insulating film. The channel region includes a first layer and a second layer which is in contact with a top surface of the first layer and covers a side surface of the first layer in the channel width direction. The second oxide semiconductor film has a higher carrier density than the first oxide semiconductor film.

Another embodiment of the present invention is a semiconductor device including a transistor. The transistor includes a first oxide semiconductor film over a first insulating film, a gate insulating film over the first oxide semiconductor film, a second oxide semiconductor film over the gate insulating film, a conductive film over the second oxide semiconductor film, and a second insulating film over the first oxide semiconductor film and the conductive film. The first oxide semiconductor film includes a channel region overlapping with the second oxide semiconductor film, a source region in contact with the second insulating film, and a drain region in contact with the second insulating film. The channel region includes a first layer, a second layer which is in contact with a top surface of the first layer and covers a side surface of the first layer in the channel width direction, and a third layer in contact with a bottom surface of the first layer. The second oxide semiconductor film has a higher carrier density than the first oxide semiconductor film.

In the above embodiment, an upper end portion of the gate insulating film is preferably aligned with or positioned further outward than a lower end portion of the second oxide semiconductor film.

In the above embodiment, the second insulating film preferably contains nitrogen and/or hydrogen.

In the above embodiment, the transistor preferably further includes a third insulating film over the second insulating film, a source electrode connected to the source region through an opening in the second insulating film and the third insulating film, and a drain electrode connected to the drain region through an opening in the second insulating film and the third insulating film.

In the above embodiment, the source region and the drain region preferably each include a region having the same hydrogen concentration as the second oxide semiconductor film. In the above embodiment, the source region and the drain region preferably each contain at least one of hydrogen, boron, carbon, nitrogen, fluorine, phosphorus, sulfur, and a rare gas.

In the above embodiment, the first oxide semiconductor film and/or the second oxide semiconductor film preferably contain/contains oxygen, In, Zn, and M (M is Al, Ga, Y, or Sn). In the above embodiment, the first oxide semiconductor film and/or the second oxide semiconductor film preferably include/includes a crystal part. The crystal part preferably has c-axis alignment.

Another embodiment of the present invention is a display device including a display element and the semiconductor device of any one of the above embodiments. Another embodiment of the present invention is a display module including the display device and a touch sensor. Another embodiment of the present invention is an electronic device including the semiconductor device of any one of the above embodiments, the display device, or the display module; and an operation key or a battery.

According to one embodiment of the present invention, the reliability of a transistor including an oxide semiconductor can be improved by suppressing a change in electrical characteristics. According to another embodiment of the present invention, a staggered transistor including an oxide semiconductor can be provided. According to another embodiment of the present invention, a transistor including an oxide semiconductor and having high on-state current can be provided. According to another embodiment of the present invention, a transistor including an oxide semiconductor and having low off-state current can be provided. According to another embodiment of the present invention, a semiconductor device with low power consumption can be provided. According to another embodiment of the present invention, a novel semiconductor device can be provided.

Note that the description of these effects does not disturb the existence of other effects. One embodiment of the present invention does not necessarily have all the effects. Other effects are apparent from and can be derived from the description of the specification, the drawings, the claims, and the like.

BEST MODE FOR CARRYING OUT THE INVENTION

Figure 1A:
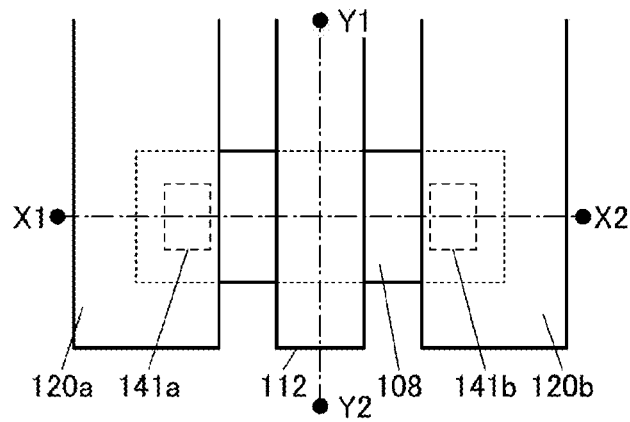
FIGS. 1A to 1C show a top view and cross-sectional views of a semiconductor device.

Hereinafter, embodiments will be described with reference to the drawings. Note that embodiments can be carried out in many different modes, and it is easily understood by those skilled in the art that modes and details can be modified in various ways without departing from the spirit and the scope of the present invention. Therefore, the present invention should not be interpreted as being limited to the following description of the embodiments.

In the drawings, the size, the layer thickness, or the region is exaggerated for clarity in some cases. Therefore, one embodiment of the present invention is not limited to such a scale. Note that the drawings schematically show ideal examples, and embodiments of the present invention are not limited to shapes or values shown in the drawings.

In this specification, ordinal numbers such as "first", "second", and "third" are used in order to avoid confusion among components, and the terms do not limit the components numerically.

In this specification, terms for explaining arrangement, such as "over" and "under," are used for convenience to describe the positional relation between components with reference to drawings. The positional relation between components is changed as appropriate in accordance with the direction in which the components are described. Thus, the positional relation is not limited by a term used in the specification and can be described with another term as appropriate depending on the situation.

In this specification and the like, a transistor is an element having at least three terminals: a gate, a drain, and a source. A channel region is formed between the drain (a drain terminal, a drain region, or a drain electrode) and the source (a source terminal, a source region, or a source electrode), and current can flow through the drain, the channel region, and the source. In this specification and the like, a channel region refers to a region through which current mainly flows.

Furthermore, functions of a source and a drain are sometimes replaced with each other when a transistor of opposite polarity is used or when the direction of current flow is changed in circuit operation, for example. Therefore, the terms "source" and "drain" can be used to denote the drain and the source, respectively, in this specification and the like.

In this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other. For example, in some cases, the term "conductive film" can be used instead of the term "conductive layer", and the term "insulating layer" can be used instead of the term "insulating film".

Unless otherwise specified, off-state current in this specification and the like refers to drain current of a transistor in an off state (also referred to as a non-conducting state and a cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to drain current that flows when the gate-source voltage $V_{gs}$ is lower than the threshold voltage $V_{th}$.

The off-state current of a transistor depends on $V_{gs}$ in some cases. Therefore, "the off-state current of a transistor is I or lower" may mean that the off-state current of the transistor is I or lower at a certain $V_{gs}$. The off-state current of a transistor may refer to off-state current at a given $V_{gs}$, at $V_{gs}$ in a given range, at $V_{gs}$ at which sufficiently low off-state current is obtained, or the like.

As an example, an assumption is made that an n-channel transistor has a threshold voltage $V_{th}$ of 0.5 V and a drain current of $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it may be said that the off-state current of the transistor is $1\times10^{-19}$ A or lower. Since the drain current of the transistor is $1\times10^{-22}$ A or lower at a certain $V_{gs}$, it may be said that the off-state current of the transistor is $1\times10^{-22}$ A or lower.

In this specification and the like, the off-state current of a transistor with a channel width W is sometimes represented by a current value per channel width W or by a current value per given channel width (e.g., 1 μm). In the latter case, the off-state current may be represented by current per length (e.g., A/μm).

The off-state current of a transistor depends on temperature in some cases. Unless otherwise specified, the off-state current in this specification may be off-state current at room temperature, 60° C., 85° C., 95° C., or 125° C. Alternatively, the off-state current may be off-state current at a temperature at which the reliability of a semiconductor device or the like including the transistor is ensured or a temperature at which the semiconductor device or the like including the transistor is used (e.g., a temperature in the range of 5° C. to 35° C.). The state in which the off-state current of a transistor is I or lower may indicate that the off-state current of the transistor at room temperature, 60° C., 85° C., 95° C., 125° C., a temperature at which the reliability of a semiconductor device or the like including the transistor is ensured, or a temperature at which the semiconductor device or the like including the transistor is used (e.g., a temperature in the range of 5° C. to 35° C.) is I or lower at a certain $V_{gs}$.

The off-state current of a transistor depends on the voltage at $V_{ds}$ between its drain and source in some cases. Unless otherwise specified, the off-state current in this specification may be off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at $V_{ds}$ at which the reliability of a semiconductor device or the like including the transistor is ensured or at $V_{ds}$ used in the semiconductor device or the like including the transistor. The state in which the off-state current of a transistor is I or lower may indicate that the off-state current of the transistor at $V_{ds}$ of 0.1 V, 0.8 V, 1 V, 1.2 V, 1.8 V, 2.5 V, 3 V, 3.3 V, 10 V, 12 V, 16 V, or 20 V, at $V_{ds}$ at which the reliability of a semiconductor device or the like including the transistor is ensured, or at $V_{ds}$ used in the semiconductor device or the like including the transistor is I or lower at a certain $V_{gs}$.

In the above description of the off-state current, a drain may be replaced with a source. That is, the off-state current sometimes refers to current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

In this specification and the like, an impurity in a semiconductor refers to an element that is not a main component of the semiconductor. For example, an element with a concentration lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of an impurity which changes the characteristics of the semiconductor include Group 1 elements, Group 2 elements, Group 14 elements, Group 15 elements, and transition metals other than the main components; specific examples are hydrogen (included in water), lithium, sodium, silicon, boron, phosphorus, carbon, and nitrogen. In an oxide semiconductor, an oxygen vacancy may be formed by entry of an impurity such as hydrogen. Furthermore, in the case where the semiconductor includes silicon, examples of an impurity which changes the characteristics of the semiconductor include oxygen, Group 1 elements except hydrogen, Group 2 elements, Group 13 elements, and Group 15 elements.

Embodiment 1

In this embodiment, examples of a semiconductor device including a transistor and a method for manufacturing the semiconductor device will be described with reference to FIGS. 1A to 22C.

<1-1. Structural Example 1 of Semiconductor Device>

Figure 1B:
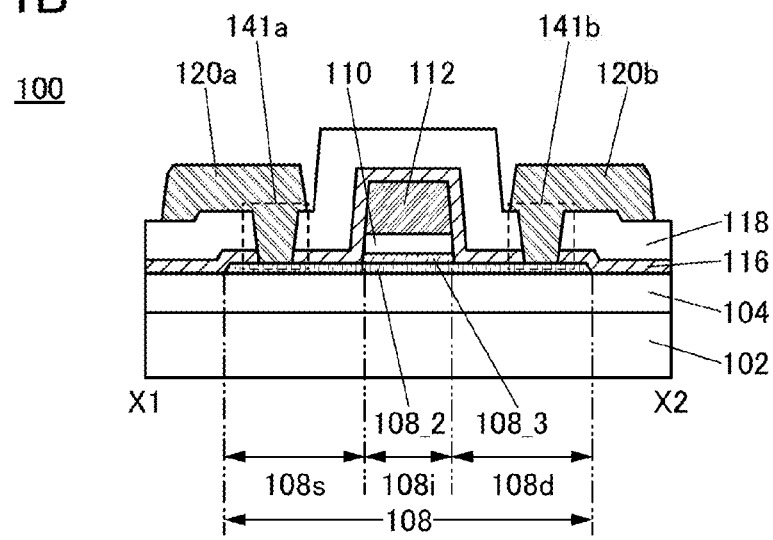
Figure 1C:
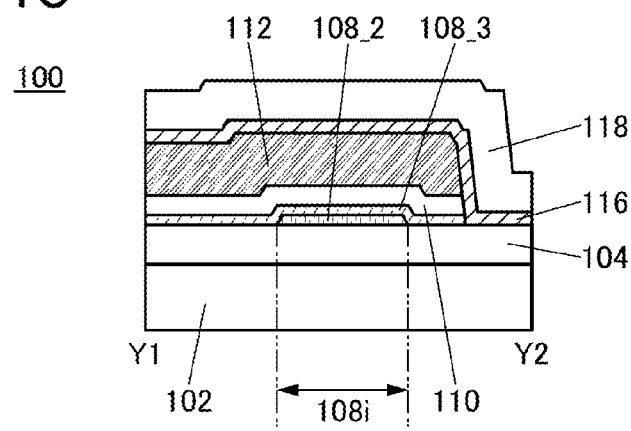

FIGS. 1A to 1C illustrate an example of a semiconductor device including a transistor. Note that the transistor in FIGS. 1A to 1C has a top-gate structure.

FIG. 1A is a top view of a transistor 100. FIG. 1B is a cross-sectional view taken along dashed-dotted line X1-X2 in FIG. 1A. FIG. 1C is a cross-sectional view taken along dashed-dotted line Y1-Y2 in FIG. 1A. For clarity, FIG. 1A does not illustrate some components such as an insulating film 110. As in FIG. 1A, some components are not illustrated in some cases in top views of transistors described below. Furthermore, the direction of dashed-dotted line X1-X2 may be referred to as a channel length (L) direction, and the direction of dashed-dotted line Y1-Y2 may be referred to as a channel width (W) direction.

The transistor 100 in FIGS. 1A to 1C includes an insulating film 104 formed over a substrate 102, an oxide semiconductor film 108 over the insulating film 104, the insulating film 110 over the oxide semiconductor film 108, an oxide semiconductor film 112 over the insulating film 110, and an insulating film 116 over the insulating film 104, the oxide semiconductor film 108, and the oxide semiconductor film 112. The oxide semiconductor film 108 includes a channel region 108i overlapping with the oxide semiconductor film 112, a source region 108s in contact with the insulating film 116, and a drain region 108d in contact with the insulating film 116. The channel region 108i includes a layer 108_2 and a layer 108_3 which is in contact with a top surface of the layer 108_2 and covers side surfaces of the layer 108_2 in the channel width direction.

The transistor 100 may further include an insulating film 118 over the insulating film 116, a conductive film 120a electrically connected to the source region 108s through an opening 141a provided in the insulating films 116 and 118, and a conductive film 120b electrically connected to the drain region 108d through an opening 141b provided in the insulating films 116 and 118.

In this specification and the like, the insulating film 104 may be referred to as a first insulating film, the insulating film 116 may be referred to as a second insulating film, and the insulating film 118 may be referred to as a third insulating film. The insulating film 110 functions as a gate insulating film, and the oxide semiconductor film 112 functions as a gate electrode. The conductive film 120a and the conductive film 120b function as a source electrode and a drain electrode, respectively.

A side surface of the channel region 108i in the channel width (W) direction or a region in the vicinity of the side surface is easily damaged by processing, resulting in a defect (e.g., oxygen vacancy), or easily contaminated by an impurity attached thereto. Therefore, even when the channel region 108i is substantially intrinsic, stress such as an electric field applied thereto activates the side surface of the channel region 108i in the channel width (W) direction or the region in the vicinity of the side surface and turns it into a low-resistance (n-type) region easily. Moreover, if the side surface of the channel region 108i in the channel width (W) direction or the region in the vicinity of the side surface is an n-type region, a parasitic channel may be formed because the n-type region serves as a carrier path.

In the semiconductor device of one embodiment of the present invention, the channel region 108i has a stacked-layer structure and side surfaces of one of the stacked layers in the channel width (W) direction are covered with the other layer. This structure can reduce defects on the side surfaces of the channel region 108i or in regions in the vicinity of the side surfaces or reduce impurities attached thereto.

Note that the stacked-layer structure of the channel region 108i is not limited to the two-layer structure including the layer 108_2 and the layer 108_3 in FIGS. 1B and 1C. For example, the stacked-layer structure illustrated in FIGS. 2A and 2B may be employed.

Figure 2A:
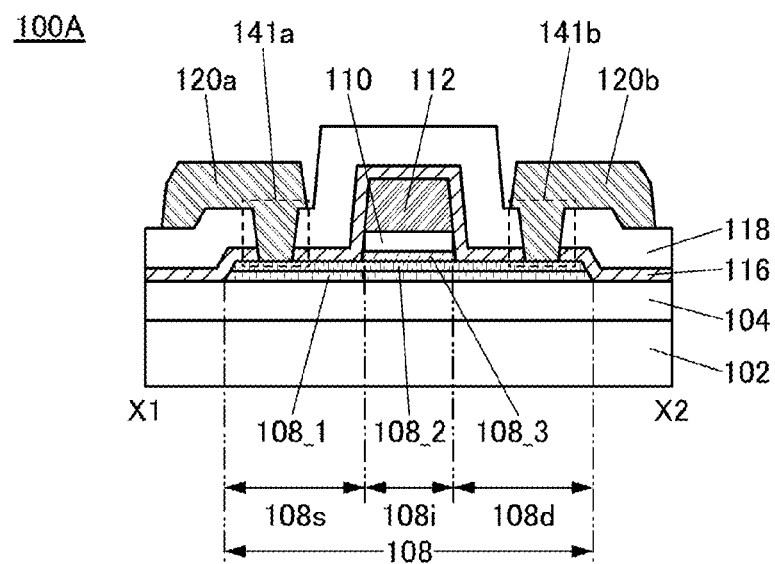
FIGS. 2A and 2B show cross-sectional views of a semiconductor device.
Figure 2B:
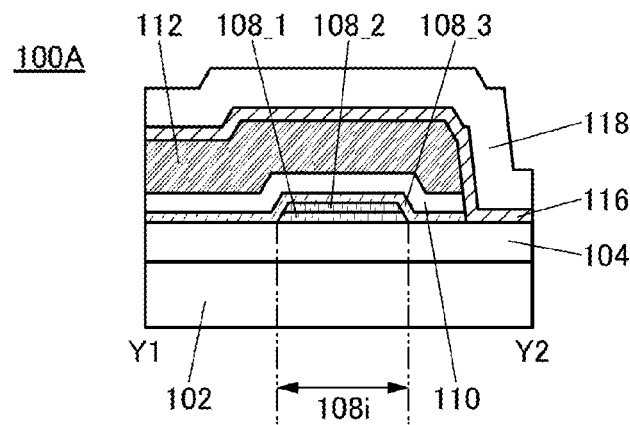

FIGS. 2A and 2B are cross-sectional views of a transistor 100A. A top view of the transistor 100A is similar to that of the transistor 100 in FIG. 1A and will be described with reference to FIG. 1A. The cross-sectional view in FIG. 2A is taken along dashed-dotted line X1-X2 in FIG. 1A, and the cross-sectional view in FIG. 2B is taken along dashed-dotted line Y1-Y2 in FIG. 1A.

The oxide semiconductor film 108 of the transistor 100A includes the channel region 108i overlapping with the oxide semiconductor film 112, the source region 108s in contact with the insulating film 116, and the drain region 108d in contact with the insulating film 116. The channel region 108i includes the layer 108_2, the layer 108_3 which is in contact with a top surface of the layer 108_2 and covers side surfaces of the layer 108_2 in the channel width direction, and a layer 108_1 in contact with a bottom surface of the layer 108_2.

As described above, the transistor 100A is different from the transistor 100 in the structure of the oxide semiconductor film 108. Except that, the transistor 100A has a structure and an effect similar to those of the transistor 100.

The layer 108_1, the layer 108_2, and the layer 108_3 in the oxide semiconductor film 108 include at least one element in common. Accordingly, interface scattering is less likely to occur at the interface between the layer 108_1 and the layer 108_2 or the interface between the layer 108_2 and the layer 108_3. Thus, the transistor 100 and the transistor 100A have high field-effect mobility (sometimes referred to simply as mobility or μFE) because the transfer of carriers is not hindered at the interfaces.

The layers 108_1, 108_2, and 108_3 preferably each include a metal oxide. The metal oxide preferably contains at least indium (In) or zinc (Zn).

An oxide semiconductor film containing In has high carrier mobility (electron mobility), for example. In addition, an oxide semiconductor film containing Zn is easily crystallized.

An oxide semiconductor film containing an element M that functions as a stabilizer has a large energy gap ($E_g$), for example. The energy gap of an oxide semiconductor film which is favorably used for one embodiment of the present invention is greater than or equal to 2 eV, preferably greater than or equal to 2.5 eV, further preferably greater than or equal to 3 eV. The use of a metal oxide having such a large energy gap for the oxide semiconductor film 108 can reduce the off-state current of the transistors 100 and 100A. Note that the element M is an element having high bonding energy with oxygen, which is higher than that of In.

Typically, an In—Zn oxide, an In-M oxide, or an In-M-Zn oxide can be used for the oxide semiconductor film which is favorably used for the semiconductor device of one embodiment of the present invention. It is particularly preferable to use an In-M-Zn oxide (M represents aluminum (Al), gallium (Ga), yttrium (Y), or tin (Sn)). Specifically, it is preferable to use an In-M-Zn oxide where M is Ga (i.e., an In—Ga—Zn oxide; hereinafter also referred to as IGZO).

In the case where the layer 108_2 includes an In-M-Zn oxide, the proportions of In and M, not taking Zn and oxygen into consideration, are preferably higher than 25 atomic % and lower than 75 atomic %, respectively, further preferably higher than 34 atomic % and lower than 66 atomic %, respectively. In particular, the layer 108_2 preferably includes a region in which the atomic proportion of In is higher than or equal to the atomic proportion of M.

The layer 108_2 including the region in which the atomic proportion of In is higher than or equal to the atomic proportion of M enables the transistors to have high field-effect mobility. Specifically, the field-effect mobility of each of the transistors 100 and 100A can be higher than 10 $cm^2/Vs$, preferably higher than 30 $cm^2/Vs$.

For example, the channel width of a transistor having high field-effect mobility can be small. Therefore, the use of the transistor for a scan line driver circuit that generates a gate signal (the circuit is also referred to as a gate driver) or for a demultiplexer connected to an output terminal of a shift register included in the scan line driver circuit can reduce the size of the scan line driver circuit, leading to a semiconductor device or a display device having a narrow frame. Since the transistor can be driven by a low gate voltage, the power consumption of a display device can be reduced.

With the transistor having high field-effect mobility, the resolution of a display device can be increased. For example, the transistor can be favorably used for a pixel circuit or a driver circuit of a high-resolution display device typified by a display device with 4K×2K pixels (3840 pixels in the horizontal direction and 2160 pixels in the vertical direction) or 8K×4K pixels (7680 pixels in the horizontal direction and 4320 pixels in the vertical direction).

In the case of including the region in which the atomic proportion of In is higher than or equal to the atomic proportion of M, the layer 108_2 has a small energy gap ($E_g$); thus, the electrical characteristics of the transistors are likely to be changed by light irradiation. However, in the semiconductor device of one embodiment of the present invention, the layer 108_3 is formed over the layer 108_2. In another embodiment, the layer 108_2 is formed over the layer 108_1.

Furthermore, the layer 108_1 and the layer 108_3 each include a region in which the atomic proportion of In is lower than that in the layer 108_2, and therefore, their energy gaps ($E_g$) are larger than that of the layer 108_2. Accordingly, with the stacked-layer structure including the layer 108_2 and the layer 108_3 or the stacked-layer structure including the layer 108_1, the layer 108_2, and the layer 108_3, the transistor can have higher resistance to a negative bias stress test with light irradiation.

In the case where each of the layers 108_1 and 108_3 includes an In-M-Zn oxide, the proportions of In and M, not taking Zn and oxygen into consideration, are preferably lower than 75 atomic % and higher than 25 atomic %, respectively, further preferably lower than 66 atomic % and higher than 34 atomic %, respectively. In particular, the layer 108_1 and the layer 108_3 preferably each include a region in which the atomic proportion of M is higher than or equal to the atomic proportion of In.

The layers 108_1 and 108_3 in which the atomic proportion of the element M is higher than or equal to that of In may have any of the following effects: (1) the energy gap increases, (2) the electron affinity decreases, (3) an impurity from the outside is blocked, and (4) an insulating property improves. Furthermore, since the element M is a metal element that is strongly bonded to oxygen, an oxygen vacancy is less likely to be generated in the layers in which the atomic proportion of M is higher than or equal to that of In.

The atomic proportion of the element M in the layer 108_1 or 108_3 is preferably higher than or equal to the atomic proportion of M in the layer 108_2. Typically, the atomic proportion of the element M in the layer 108_1 or 108_3 is preferably 1.5 times or more, further preferably twice or more of the atomic proportion of the element M in the layer 108_2.

The atomic proportion of In in the layer 108_2 is preferably higher than or equal to the atomic proportion of In in the layer 108_1 or 108_3. Typically, the atomic proportion of In in the layer 108_2 is preferably 1.5 times or more, further preferably twice or more of the atomic proportion of In in the layer 108_1 or 108_3. In this case, the layer 108_2 can function as a channel region of each of the transistors 100 and 100A. With the above structure, the transistors 100 and 100A can have high on-state current and high field-effect mobility. Note that a transistor having high field-effect mobility has a negative threshold voltage (normally-on characteristics) in some cases for the following reason: an oxygen vacancy included in an oxide semiconductor film of the transistor causes charge generation and reduces the resistance of the oxide semiconductor film. The transistor having normally-on characteristics causes various problems in that a malfunction is likely to occur when in operation and that power consumption is increased when not in operation, for example. Therefore, the layer 108_2 preferably includes a CAAC-OS described later, which includes few impurities or defects (e.g., oxygen vacancies).

<1-2. Band Structure>

Next, band structures of the oxide semiconductor films and insulating films in contact with the oxide semiconductor films in the transistor 100 in FIGS. 1A to 1C and the transistor 100A in FIGS. 2A and 2B will be described with reference to FIGS. 15A and 15B.

Figure 15A:
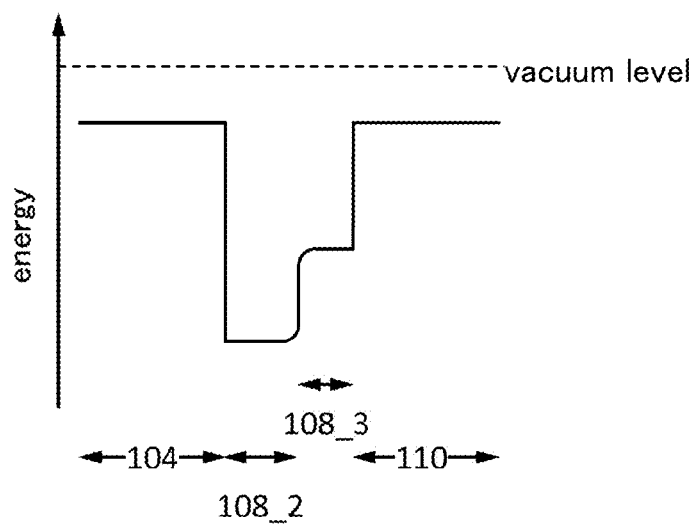
FIGS. 15A and 15B illustrate band structures.

FIG. 15A illustrates the band structure in the thickness direction of a region including the insulating film 104, the layer 108_2, the layer 108_3, and the insulating film 110. FIG. 15B illustrates the band structure in the thickness direction of a region including the insulating film 104, the layer 108_1, the layer 108_2, the layer 108_3, and the insulating film 110. For easy understanding, the band structures show the energy levels of the conduction band minimum ($E_c$) of the insulating film 104, the layers 108_1, 108_2, and 108_3, and the insulating film 110.

Here, a silicon oxide film is used as each of the insulating films 104 and 110, an oxide semiconductor film formed using a metal oxide target having an atomic ratio of metal elements of In:Ga:Zn=1:1:1.2 is used as each of the layers 108_1 and 108_3, and an oxide semiconductor film formed using a metal oxide target having an atomic ratio of metal elements of In:Ga:Zn=4:2:4.1 is used as the layer 108_2.

Figure 15B:
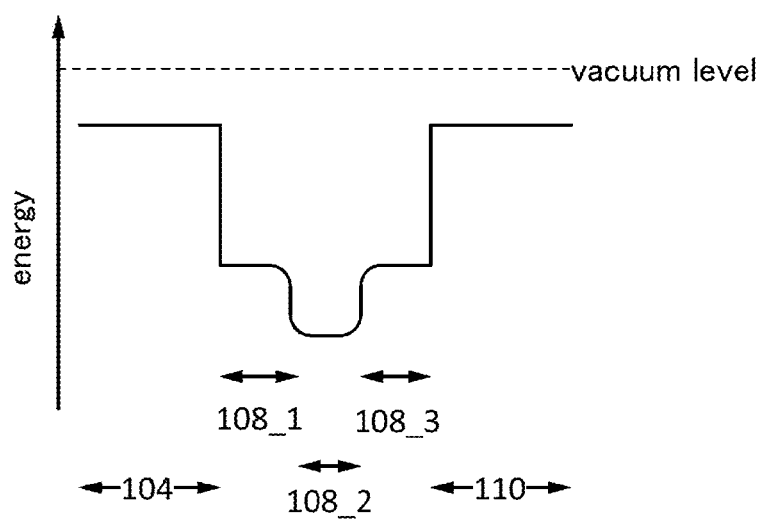

As illustrated in FIGS. 15A and 15B, there is no energy barrier between the layer 108_1 and the layer 108_2 and between the layer 108_2 and the layer 108_3, and the energy of the conduction band minimum gradually changes. In other words, the energy of the conduction band minimum continuously changes or a continuous junction is formed. Therefore, such an energy band structure is also referred to as a buried channel structure.

Such a band structure is obtained because oxygen is transferred between the layer 108_1, the layer 108_2, and the layer 108_3, which contain an element in common, so that a mixed layer is formed. To obtain such a band structure, a stacked-layer structure is employed in which no impurity that forms a defect state such as a trap center or a recombination center exists at the interface between the layer 108_1 and the layer 108_2 or the interface between the layer 108_2 and the layer 108_3.

If no continuous junction is formed and an impurity exists at the interface between the layer 108_1 and the layer 108_2 or the interface between the layer 108_2 and the layer 108_3, the continuity of the energy band is damaged, and a carrier is trapped or recombined at the interface and then disappears.

To form a continuous junction, the films are preferably successively stacked without exposure to the air by using a multi-chamber deposition apparatus (sputtering apparatus) provided with a load lock chamber. Each chamber of the sputtering apparatus is preferably evacuated to be a high vacuum (to a degree of approximately $5 \times 10^{-7}$ Pa to $1 \times 10^{-4}$ Pa) with an adsorption vacuum pump such as a cryopump in order to remove water or the like, which serves as an impurity against the oxide semiconductor film, as much as possible. Alternatively, a turbo molecular pump and a cold trap are preferably combined to prevent a backflow of a gas, especially a gas containing carbon or hydrogen, from an exhaust system into the chamber.

In the structures in FIGS. 15A and 15B, the channel region of the transistor 100 including the layer 108_2 and the layer 108_3 and the channel region of the transistor 100A including the layer 108_1, the layer 108_2, and the layer 108_3 are formed in the layer 108_2 which serves as a well.

Even when a trap state due to an impurity or a defect is formed at or in the vicinity of the interface between the layer 108_3 and the insulating film 110 in the transistor 100, the layer 108_3 enables the layer 108_2 to be distanced from the region in which the trap state is formed. Even when trap states due to impurities or defects are formed at or in the vicinity of the interface between the layer 108_1 and the insulating film 104 and at or in the vicinity of the interface between the layer 108_3 and the insulating film 110 in the transistor 100A, the layers 108_1 and 108_3 enable the layer 108_2 to be distanced from the regions in which the trap states are formed.

However, in the case where the energy level of the trap state is lower than the energy level of the conduction band minimum ($E_c$) of the layer 108_2 functioning as a channel region, an electron is likely to be captured by the trap state. When electrons are captured by the trap states and accumulated, negative fixed charge is generated on the surface of the insulating film, so that the threshold voltage of the transistor is shifted in the positive direction. Therefore, the energy level of the trap state is preferably higher than the energy level of the conduction band minimum ($E_c$) of the layer 108_2. Such a structure inhibits accumulation of electrons in the trap states. As a result, the on-state current and the field-effect mobility of the transistor can be increased. In addition, such a structure is favorable because a change in the threshold voltage of the transistor is reduced and stable electrical characteristics are obtained.

To prevent the layer 108_1 and the layer 108_3 from functioning as part of the channel region, a material having lower conductivity than the layer 108_2 is preferably used for the layer 108_1 and the layer 108_3. Thus, each of the layers 108_1 and 108_3 can also be referred to as an oxide insulating film owing to their physical properties and/or functions. In addition, the layers 108_1 and 108_3 are preferably formed using a material having the following features: the electron affinity (difference between the vacuum level and the energy level of the conduction band minimum) of the material is lower than that of the layer 108_2, and a difference (band offset) exists between the energy level of the conduction band minimum of the material and that of the layer 108_2. Furthermore, to prevent the threshold voltage from varying depending on the drain voltage, the layers 108_1 and 108_3 are preferably formed using a material whose energy level of the conduction band minimum is closer to the vacuum level than the energy level of the conduction band minimum of the layer 108_2. For example, the difference between the energy level of the conduction band minimum of the layer 108_2 and the energy level of the conduction band minimum of each of the layers 108_1 and 108_3 is 0.2 eV or more, preferably 0.5 eV or more.

In the channel region 108i with such a structure, the layer 108_2 serves as a main current path. That is, the layer 108_2 functions as a channel region, and the layers 108_1 and 108_3 function as oxide insulating films. In addition, since the layers 108_1 and 108_3 contain one or more metal elements contained in the layer 108_2 in which the channel region is formed, interface scattering is less likely to occur at the interface between the layer 108_1 and the layer 108_2 or the interface between the layer 108_2 and the layer 108_3. Thus, the transistor has high field-effect mobility because the transfer of carriers is not hindered at the interfaces.

<1-3. Oxide Semiconductor Film Functioning as Gate Electrode>

Next, an oxide semiconductor film functioning as a gate electrode will be described. The oxide semiconductor film 112 functioning as a gate electrode has a function of supplying oxygen to the insulating film 110. The oxide semiconductor film 112 having a function of supplying oxygen to the insulating film 110 enables the insulating film 110 to contain excess oxygen. When the insulating film 110 includes an excess oxygen region, excess oxygen can be supplied to the oxide semiconductor film 108, specifically, the channel region 108i. Thus, oxygen vacancies in the channel region 108i are filled with excess oxygen, so that a highly reliable semiconductor device can be obtained.

The insulating film 104, which is formed under the oxide semiconductor film 108, may contain excess oxygen to be supplied to the oxide semiconductor film 108. However, in the case where the insulating film 104 contains excess oxygen, excess oxygen contained in the insulating film 104 is also possibly supplied to the source region 108s and the drain region 108d of the oxide semiconductor film 108. If excess oxygen is supplied to the source region 108s and the drain region 108d, the resistance of the source region 108s and the drain region 108d might be increased.

In contrast, in the structure in which the insulating film 110 formed over the oxide semiconductor film 108 contains excess oxygen, excess oxygen can be selectively supplied to the channel region 108i. Alternatively, after excess oxygen is supplied to the channel region 108i, the source region 108s, and the drain region 108d, the carrier density in the source region 108s and the drain region 108d may be selectively increased.

The insulating film 116 contains nitrogen and/or hydrogen. From the insulating film 116 containing nitrogen and/or hydrogen, nitrogen and/or hydrogen can be supplied to the oxide semiconductor film 108 and the oxide semiconductor film 112.

The carrier density in the oxide semiconductor film 112 having supplied oxygen to the insulating film 110 is increased by nitrogen and/or hydrogen supplied from the insulating film 116. In other words, the oxide semiconductor film 112 also functions as an oxide conductor (OC). Thus, the oxide semiconductor film 112 has a higher carrier density than the oxide semiconductor film 108 and can function as a gate electrode.

Furthermore, the oxide semiconductor film 112 and the source region 108s and the drain region 108d of the oxide semiconductor film 108 may each contain an element that forms an oxygen vacancy. Typical examples of the element that forms an oxygen vacancy are hydrogen, boron, carbon, nitrogen, fluorine, phosphorus, sulfur, chorine, and a rare gas element. Typical examples of the rare gas element are helium, neon, argon, krypton, and xenon.

An impurity element added to the oxide semiconductor film cuts a bond between a metal element and oxygen in the oxide semiconductor film, so that an oxygen vacancy is formed. Alternatively, when an impurity element is added to the oxide semiconductor film, oxygen bonded to a metal element in the oxide semiconductor film is bonded to the impurity element and detached from the metal element, so that an oxygen vacancy is formed. As a result, the oxide semiconductor film has a higher carrier density, and thus, the conductivity thereof becomes higher.

Each of the transistors 100 and 100A preferably has a region in which a side end portion of the insulating film 110 is aligned with a side end portion of the oxide semiconductor film 112. In other words, in the transistor 100, an upper end portion of the insulating film 110 is substantially aligned with a lower end portion of the oxide semiconductor film 112. The above structure can be obtained by processing the insulating film 110 with the use of the oxide semiconductor film 112 as a mask, for example.

As described above, in the semiconductor device of one embodiment of the present invention, the insulating film which covers the side surfaces of the oxide semiconductor film serving as a channel region and is formed over the channel region contains excess oxygen supplied from the oxide semiconductor film functioning as a gate electrode. A semiconductor device with such a structure can have high reliability.

Next, details of the components of the semiconductor device in FIGS. 1A to 1C will be described.

<1-4. Components of Semiconductor Device>

[Substrate]

As the substrate 102, a variety of substrates can be used without particular limitation. Examples of the substrate include a semiconductor substrate (e.g., a single-crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper containing a fibrous material, and a base material film. As examples of the glass substrate, a barium borosilicate glass substrate, an aluminoborosilicate glass substrate, and a soda lime glass substrate can be given. Examples of materials of the flexible substrate, the attachment film, the base film, and the like are plastics typified by polyethylene terephthalate (PET), polyethylene naphthalate (PEN), and polyether sulfone (PES). Another example is a synthetic resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, and paper. In particular, a transistor formed using a semiconductor substrate, a single-crystal substrate, an SOI substrate, or the like can have little variation in characteristics, size, shape, or the like, high current capability, and a small size. Such a transistor can achieve lower power consumption or higher integration of a circuit.

Alternatively, a flexible substrate may be used as the substrate 102, and the transistor may be formed directly on the flexible substrate. Alternatively, a separation layer may be provided between the substrate 102 and the transistor. The separation layer can be used when part or the whole of a semiconductor device formed over the separation layer is separated from the substrate 102 and transferred to another substrate. In such a case, the transistor can be transferred to even a substrate having low heat resistance or a flexible substrate. For example, the above separation layer can be an organic resin film of polyimide or the like formed over the substrate or a stack including inorganic films (e.g., a tungsten film and a silicon oxide film).

Examples of a substrate to which a transistor is transferred include, in addition to the above substrates over which the transistor can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupra, rayon, or regenerated polyester), and the like), a leather substrate, and a rubber substrate. When such a substrate is used, a transistor with excellent characteristics or a transistor with low power consumption can be formed, a device with high durability can be manufactured, high heat resistance can be provided, or a reduction in weight or thickness can be achieved.

[First Insulating Film]

The insulating film 104 can be formed by a sputtering method, a CVD method, an evaporation method, a pulsed laser deposition (PLD) method, a printing method, a coating method, or the like as appropriate. For example, the insulating film 104 can be formed to have a single-layer structure or stacked-layer structure including an oxide insulating film and/or a nitride insulating film. To improve the properties of the interface with the oxide semiconductor film 108, at least a region of the insulating film 104 which is in contact with the oxide semiconductor film 108 is preferably formed using an oxide insulating film. When the insulating film 104 is formed using an oxide insulating film from which oxygen is released by heating, oxygen contained in the insulating film 104 can be moved to the oxide semiconductor film 108 by heat treatment.

The thickness of the insulating film 104 can be greater than or equal to 50 nm, greater than or equal to 100 nm and less than or equal to 3000 nm, or greater than or equal to 200 nm and less than or equal to 1000 nm. By increasing the thickness of the insulating film 104, the amount of oxygen released from the insulating film 104 can be increased, and interface states at the interface between the insulating film 104 and the oxide semiconductor film 108 and oxygen vacancies included in the channel region 108i of the oxide semiconductor film 108 can be reduced.

For example, the insulating film 104 can be formed to have a single-layer structure or stacked-layer structure including silicon oxide, silicon oxynitride, silicon nitride oxide, silicon nitride, aluminum oxide, hafnium oxide, gallium oxide, a Ga—Zn oxide, or the like. In this embodiment, the insulating film 104 has a stacked-layer structure including a silicon nitride film and a silicon oxynitride film. With the insulating film 104 having such a stack-layer structure including a silicon nitride film as a lower layer and a silicon oxynitride film as an upper layer, oxygen can be efficiently introduced into the oxide semiconductor film 108.

[Oxide Semiconductor Film]

The oxide semiconductor film 108 can be formed using any of the materials described above. The oxide semiconductor film 108 and/or the oxide semiconductor film 112 are/is formed using a metal oxide such as an In-M-Zn oxide (M is Al, Ga, Y, or Sn). Alternatively, an In—Ga oxide or an In—Zn oxide may be used for the oxide semiconductor film 108 and the oxide semiconductor film 112. It is particularly preferable that the oxide semiconductor film 108 and the oxide semiconductor film 112 be formed using metal oxides containing the same elements because manufacturing cost can be reduced.

In the case where the oxide semiconductor film 108 and the oxide semiconductor film 112 each include an In-M-Zn oxide, the proportions of In and M, the sum of which is assumed to be 100 atomic %, are as follows: the proportion of In is higher than 25 atomic % and the proportion of M is lower than 75 atomic %, or the proportion of In is higher than 34 atomic % and the proportion of M is lower than 66 atomic %.

The energy gap of each of the oxide semiconductor films 108 and 112 is preferably 2 eV or more, 2.5 eV or more, or 3 eV or more.

The thickness of the oxide semiconductor film 108 is greater than or equal to 3 nm and less than or equal to 200 nm, preferably greater than or equal to 3 nm and less than or equal to 100 nm, further preferably greater than or equal to 3 nm and less than or equal to 60 nm. The thickness of the oxide semiconductor film 112 is greater than or equal to 5 nm and less than or equal to 500 nm, preferably greater than or equal to 10 nm and less than or equal to 300 nm, further preferably greater than or equal to 20 nm and less than or equal to 100 nm.

In the case where the oxide semiconductor film 108 and the oxide semiconductor film 112 each include an In-M-Zn oxide, the atomic ratio of metal elements in a sputtering target used for depositing the In-M-Zn oxide preferably satisfies In≥M and Zn≥M. As the atomic ratio of metal elements in such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, In:M:Zn=5:1:7, or the like is preferable. Note that the atomic ratios of metal elements in the deposited oxide semiconductor films 108 and 112 may each vary from the above atomic ratio of metal elements in the sputtering target within a range of approximately ±40%. For example, when a sputtering target with an atomic ratio of In:Ga:Zn=4:2:4.1 is used, the atomic ratio of In to Ga and Zn in the deposited oxide semiconductor film may be approximately 4:2:3.

When contained in the oxide semiconductor film 108, silicon or carbon, which are elements belonging to Group 14, may cause oxygen vacancies to be increased and the oxide semiconductor film to have n-type conductivity. To prevent this, the concentration of silicon or carbon (measured by secondary ion mass spectrometry) in the oxide semiconductor film 108, particularly in the channel region 108i, is preferably lower than or equal to $2\times10^{18}$ atoms/cm$^3$ or lower than or equal to $2\times10^{17}$ atoms/cm$^3$. As a result, the transistor has a positive threshold voltage (normally-off characteristics).

Furthermore, the concentration of alkali metal or alkaline earth metal in the channel region 108i, which is measured by secondary ion mass spectrometry, is preferably lower than or equal to $1\times10^{18}$ atoms/cm$^3$ or lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the channel region 108i. As a result, the transistor has a positive threshold voltage (normally-off characteristics).

If nitrogen is contained in the channel region 108i, electrons serving as carriers are generated and the carrier density is increased, so that the channel region 108i may have n-type conductivity. Thus, a transistor including an oxide semiconductor film containing nitrogen is likely to have normally-on characteristics. For this reason, nitrogen in the channel region 108i is preferably reduced as much as possible. For example, the nitrogen concentration measured by secondary ion mass spectrometry may be $5\times10^{18}$ atoms/cm$^3$ or lower.

By reducing impurity elements in the channel region 108i, the carrier density in the oxide semiconductor film can be reduced. Therefore, the channel region 108i can have a carrier density lower than or equal to $1\times10^{17}$/cm$^3$, lower than or equal to $1\times10^{15}$/cm$^3$, lower than or equal to $1\times10^{13}$/cm$^3$, or lower than or equal to $1\times10^{11}$/cm$^3$.

When an oxide semiconductor film with a low impurity concentration and a low density of defect states is used as the channel region 108i, the transistor can have more excellent electrical characteristics. Here, the state in which the impurity concentration is low and the density of defect states is low (the number of oxygen vacancies is small) is referred to as "highly purified intrinsic", "substantially highly purified intrinsic", "intrinsic", or "substantially intrinsic". A highly purified intrinsic or substantially highly purified intrinsic oxide semiconductor has few carrier generation sources and thus can have a low carrier density in some cases. Thus, a transistor whose channel region is formed in the oxide semiconductor film is likely to have a positive threshold voltage (normally-off characteristics). The highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film enables extremely low off-state current. Thus, the transistor whose channel region is formed in the oxide semiconductor film has little variation in electrical characteristics and high reliability in some cases.

Meanwhile, the source region 108s, the drain region 108d, and the oxide semiconductor film 112 are in contact with the insulating film 116. Hydrogen and/or nitrogen are/is added from the insulating film 116 to the source region 108s, the drain region 108d, and the oxide semiconductor film 112 in contact with the insulating film 116, so that the carrier densities in the source region 108s, the drain region 108d, and the oxide semiconductor film 112 are increased.

Furthermore, the oxide semiconductor film 108 and/or the oxide semiconductor film 112 may have a non-single-crystal structure. The non-single-crystal structure includes a c-axis aligned crystalline oxide semiconductor (CAAC-OS) described later, a polycrystalline structure, a microcrystalline structure described later, or an amorphous structure, for example. Among the non-single-crystal structures, the amorphous structure has the highest density of defect states, whereas the CAAC-OS has the lowest density of defect states.

Note that the oxide semiconductor film 108 may be a single film or stacked films including two or more of the following regions: a region having an amorphous structure, a region having a microcrystalline structure, a region having a polycrystalline structure, a CAAC-OS region, and a region having a single-crystal structure. The oxide semiconductor film 112 may also be a single film or stacked films including two or more of the following regions: a region having an amorphous structure, a region having a microcrystalline structure, a region having a polycrystalline structure, a CAAC-OS region, and a region having a single-crystal structure.

In the oxide semiconductor film 108, the crystallinity of the channel region 108i may be different from that of the source region 108s and the drain region 108d. Specifically, in the oxide semiconductor film 108, the source region 108s and the drain region 108d may have lower crystallinity than the channel region 108i. This is because the source region 108s and the drain region 108d are damaged by the impurity addition, which results in a decrease in the crystallinity of the source region 108s and the drain region 108d.

[Insulating Film Functioning as Gate Insulating Film]

The insulating film 110 can be formed to have a single-layer structure or stacked-layer structure including an oxide insulating film and/or a nitride insulating film. To improve the properties of the interface with the oxide semiconductor film 108, at least a region of the insulating film 110 which is in contact with the oxide semiconductor film 108 is preferably formed using an oxide insulating film. For example, the insulating film 110 can be formed to have a single-layer structure or stacked-layer structure including silicon oxide, silicon oxynitride, silicon nitride oxide, silicon nitride, aluminum oxide, hafnium oxide, gallium oxide, a Ga—Zn oxide, or the like.

Furthermore, by providing an insulating film having an effect of blocking oxygen, hydrogen, water, and the like as the insulating film 110, it is possible to prevent outward diffusion of oxygen from the oxide semiconductor film 108 and entry of hydrogen, water, and the like into the oxide semiconductor film 108 from the outside. As examples of the insulating film having an effect of blocking oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

The insulating film 110 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, in which case the gate leakage current of the transistor can be reduced.

When the insulating film 110 is formed using an oxide insulating film from which oxygen is released by heating, oxygen contained in the insulating film 110 can be moved to the oxide semiconductor film 108 by heat treatment.

The thickness of the insulating film 110 can be greater than or equal to 5 nm and less than or equal to 400 nm, greater than or equal to 5 nm and less than or equal to 300 nm, or greater than or equal to 10 nm and less than or equal to 250 nm.

[Second Insulating Film]

The insulating film 116 contains nitrogen and/or hydrogen. The insulating film 116 is a nitride insulating film, for example. The nitride insulating film can be formed using silicon nitride, silicon nitride oxide, aluminum nitride, aluminum nitride oxide, or the like. The hydrogen concentration in the insulating film 116 is preferably higher than or equal to $1 \times 10^{22}$ atoms/cm$^3$. Furthermore, the insulating film 116 is in contact with the source region 108s and the drain region 108d of the oxide semiconductor film 108. The insulating film 116 is also in contact with the oxide semiconductor film 112. Therefore, the hydrogen concentrations in the source region 108s, the drain region 108d, and the oxide semiconductor film 112 in contact with the insulating film 116 are increased; thus, the carrier densities in the source region 108s, the drain region 108d, and the oxide semiconductor film 112 can be increased. Since the source region 108s, the drain region 108d, and the oxide semiconductor film 112 are in contact with the insulating film 116, they have regions with the same hydrogen concentration in some cases.

[Third Insulating Film]

The insulating film 118 can be formed to have a single-layer structure or stacked-layer structure including an oxide insulating film and/or a nitride insulating film. For example, the insulating film 118 can be formed to have a single-layer structure or stacked-layer structure including silicon oxide, silicon oxynitride, silicon nitride oxide, silicon nitride, aluminum oxide, hafnium oxide, gallium oxide, a Ga—Zn oxide, or the like.

Furthermore, the insulating film 118 preferably functions as a barrier film against hydrogen, water, and the like from the outside.

The thickness of the insulating film 118 can be greater than or equal to 30 nm and less than or equal to 500 nm, or greater than or equal to 100 nm and less than or equal to 400 nm.

[Conductive Film]

The conductive films 120a and 120b can be formed by a sputtering method, a vacuum evaporation method, a pulsed laser deposition (PLD) method, a thermal CVD method, or the like. The conductive films 120a and 120b can be formed using, for example, a metal element selected from aluminum, chromium, copper, tantalum, titanium, molybdenum, nickel, iron, cobalt, and tungsten, an alloy containing the metal element as a component, or an alloy containing any of the metal elements in combination. Furthermore, one or more metal elements selected from manganese and zirconium may be used. In addition, the conductive films 120a and 120b may have a single-layer structure or a stacked-layer structure of two or more layers. For example, the following structure may be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a two-layer structure in which a copper film is stacked over a titanium film; a three-layer structure in which a titanium film, an aluminum film, and a titanium film are stacked in this order; or a three-layer structure in which a copper film containing manganese, a copper film, and a copper film containing manganese are stacked in this order. Alternatively, an alloy film or a nitride film in which aluminum and one or more elements selected from titanium, tantalum, tungsten, molybdenum, chromium, neodymium, and scandium are combined may be used.

The conductive films 120a and 120b can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide containing silicon (also referred to as an In—Sn—Si oxide or ITSO). It is also possible to employ a stacked-layer structure including the above light-transmitting conductive material and the above metal element.

The thickness of the conductive films 120a and 120b can be greater than or equal to 30 nm and less than or equal to 500 nm, or greater than or equal to 100 nm and less than or equal to 400 nm.

<1-5. Structural Example 2 of Semiconductor Device>

Next, a structure of a semiconductor device different from that in FIGS. 1A to 1C will be described with reference to FIGS. 3A and 3B.

Figure 3A:
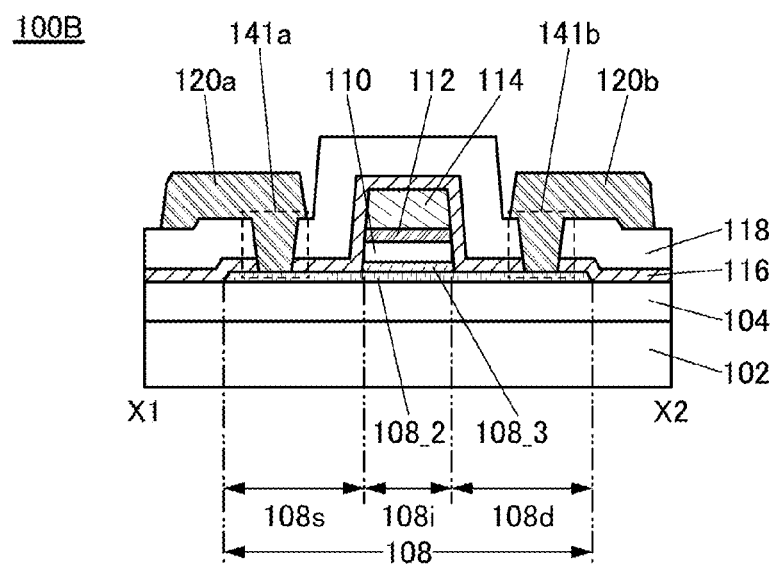
FIGS. 3A and 3B show cross-sectional views of a semiconductor device.
Figure 3B:
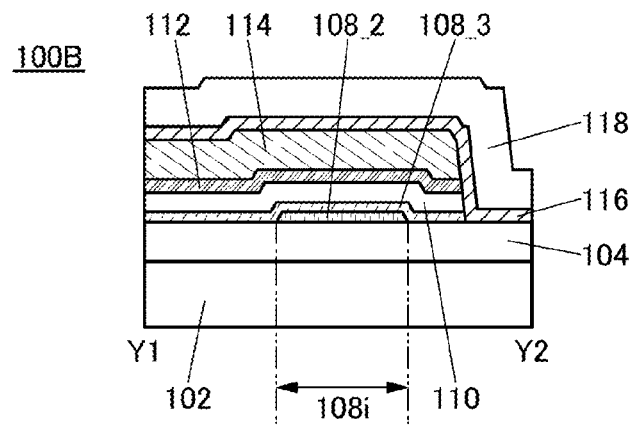

FIGS. 3A and 3B are cross-sectional views of a transistor 100B. A top view of the transistor 100B is similar to that of the transistor 100 in FIG. 1A and will be described with reference to FIG. 1A. The cross-sectional view in FIG. 3A is taken along dashed-dotted line X1-X2 in FIG. 1A, and the cross-sectional view in FIG. 3B is taken along dashed-dotted line Y1-Y2 in FIG. 1A.

The transistor 100B is different from the transistor 100 described above in the structure of a conductive film functioning as a gate electrode. Except that, the transistor 100B has a structure and an effect similar to those of the transistor 100.

A gate electrode of the transistor 100B includes the oxide semiconductor film 112 and a conductive film 114 over the oxide semiconductor film 112.

The conductive film 114 may be formed using any of the above-mentioned materials that can be used for the conductive films 120a and 120b.

As seen above, in the transistor of one embodiment of the present invention, the conductive film functioning as a gate electrode can have a stacked-layer structure including the oxide semiconductor film 112 and the conductive film 114 over the oxide semiconductor film 112. For example, the conductive film 114 is formed using a low-resistance conductive material, whereby the wiring resistance of the gate electrode can be reduced.

Figure 4A:
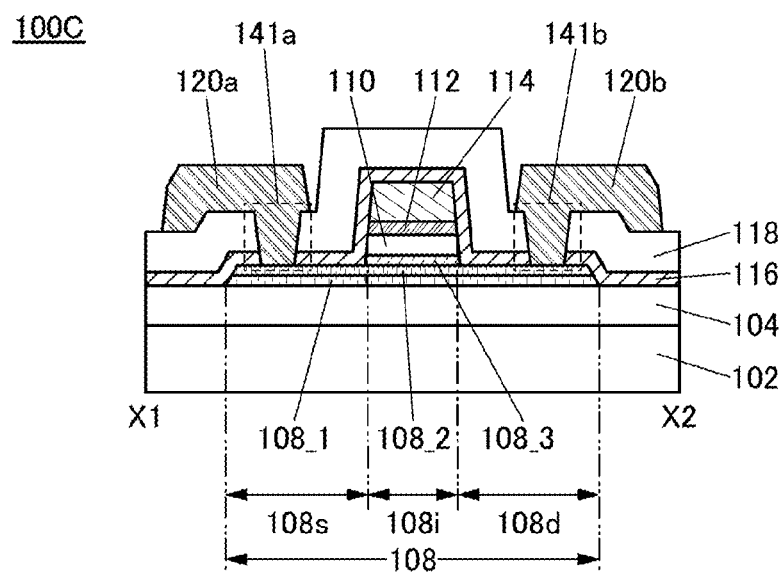
FIGS. 4A and 4B show cross-sectional views of a semiconductor device.
Figure 4B:
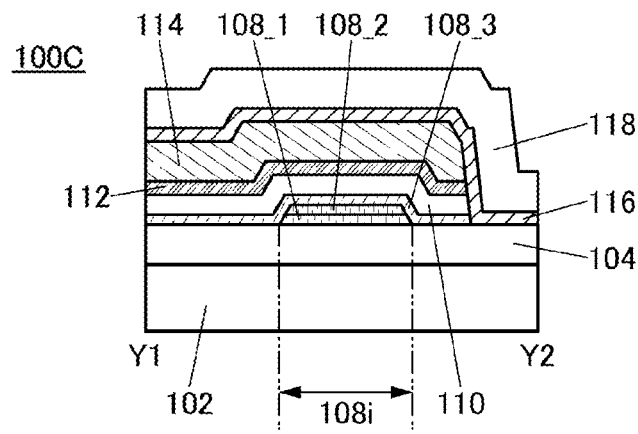

As in the transistor 100B, the gate electrode of the transistor 100A described above can have the stacked-layer structure including the oxide semiconductor film 112 and the conductive film 114 over the oxide semiconductor film 112. FIGS. 4A and 4B illustrate an example in this case. FIGS. 4A and 4B are cross-sectional views of a transistor 100C.

In this manner, the structure of the transistor of one embodiment of the present invention can be combined with that of the above-described transistor as appropriate.

<1-6. Structural Example 3 of Semiconductor Device>

Next, a structure of a semiconductor device different from that in FIGS. 1A to 1C will be described with reference to FIGS. 5A and 5B.

Figure 5A:
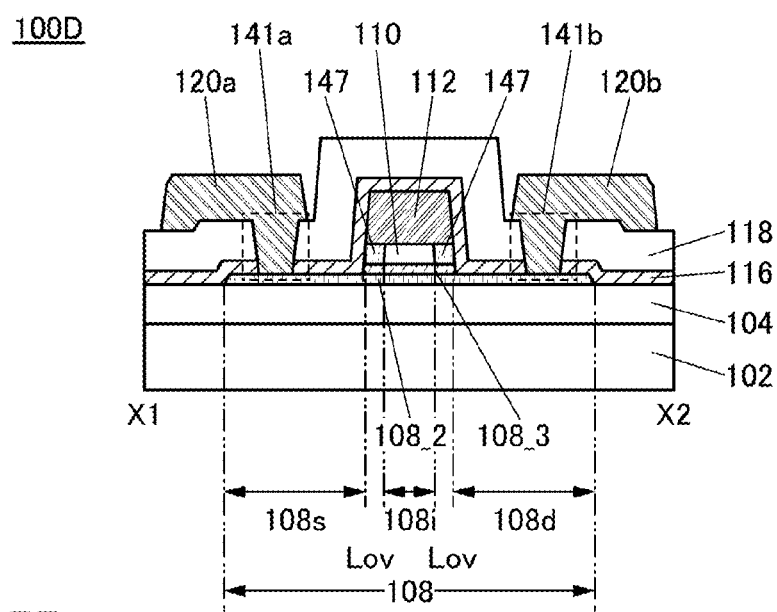
FIGS. 5A and 5B show cross-sectional views of a semiconductor device.
Figure 5B:
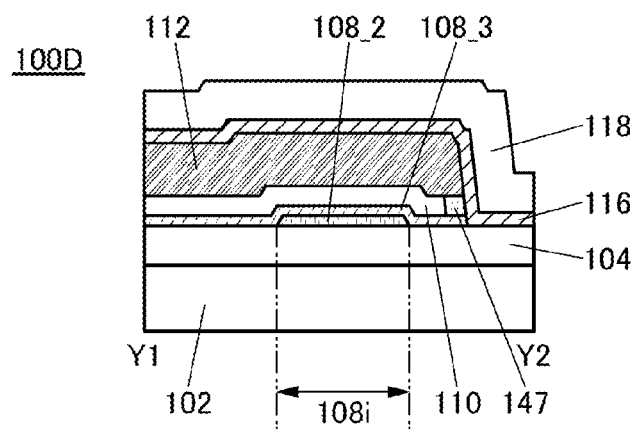

FIGS. 5A and 5B are cross-sectional views of a transistor 100D. The transistor 100D is different from the transistor 100 described above in the shape of the insulating film 110. Except that, the transistor 100D has a structure and an effect similar to those of the transistor 100 described above.

The insulating film 110 included in the transistor 100D is positioned further inward than the oxide semiconductor film 112. In other words, side surfaces of the insulating film 110 are positioned further inward than lower end portions of the oxide semiconductor film 112. For example, the structure in FIGS. 5A and 5B can be obtained by side etching of the insulating film 110 with an etchant or the like after processing of the oxide semiconductor film 112. When the insulating film 110 has the above structure, hollow regions 147 are formed under the oxide semiconductor film 112.

The hollow regions 147 contain air and function as part of a gate insulating film. Note that the dielectric constant of the hollow regions 147 is substantially equal to that of the air, that is, approximately 1. Accordingly, in the case where a voltage is applied to the oxide semiconductor film 112 functioning as a gate electrode in the structure of the transistor 100D, the voltage applied to the oxide semiconductor film 108 under the hollow regions 147 is lower than the voltage applied to the oxide semiconductor film 108 (the channel region 108i) under the insulating film 110. Thus, the oxide semiconductor film 108 under the hollow regions 147 effectively functions as overlap regions (also referred to as Lov regions). The Lov regions in the oxide semiconductor film 108 can relieve electric field concentration at the source edge and the drain edge. Note that the Lov regions overlap with the oxide semiconductor film 112 functioning as a gate electrode and have lower resistance than the channel region 108i.

Figure 6A:
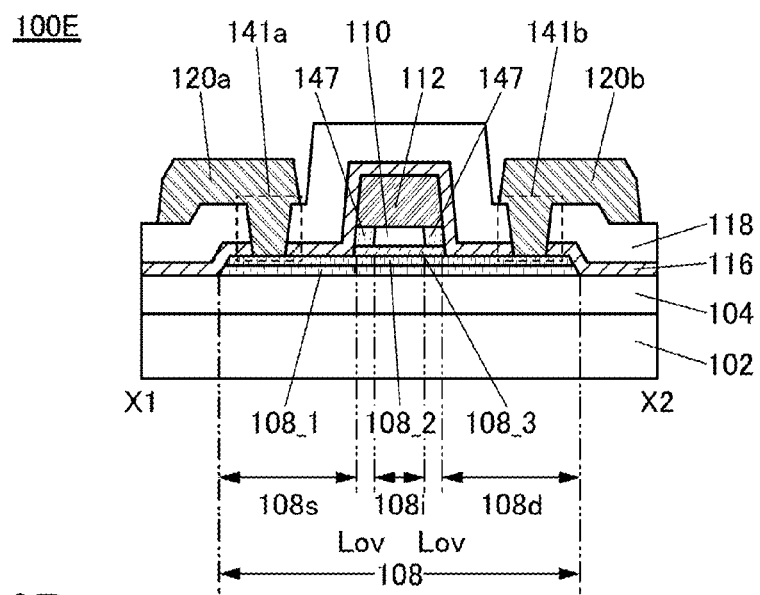
FIGS. 6A and 6B show cross-sectional views of a semiconductor device.
Figure 6B:
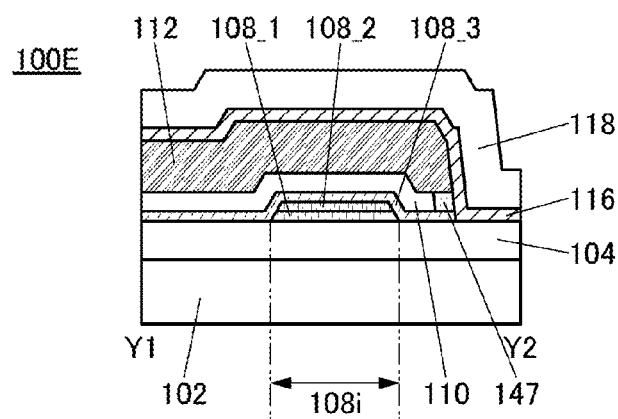

The insulating film 110 in the transistor 100A described above can have a structure similar to that in the transistor 100D. FIGS. 6A and 6B illustrate an example in this case. FIGS. 6A and 6B are cross-sectional views of a transistor 100E.

<1-7. Structural Example 4 of Semiconductor Device>

Next, a structure of a semiconductor device different from that in FIGS. 1A to 1C will be described with reference to FIGS. 7A and 7B.

Figure 7A:
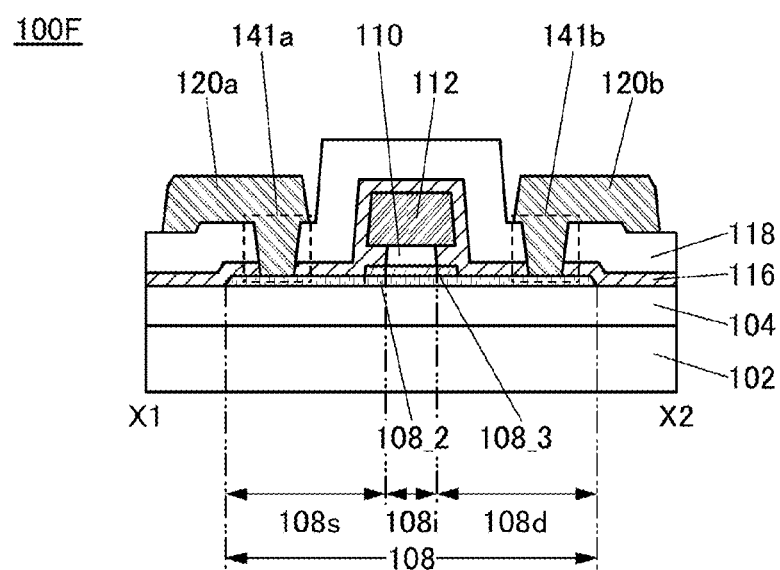
FIGS. 7A and 7B show cross-sectional views of a semiconductor device.
Figure 7B:
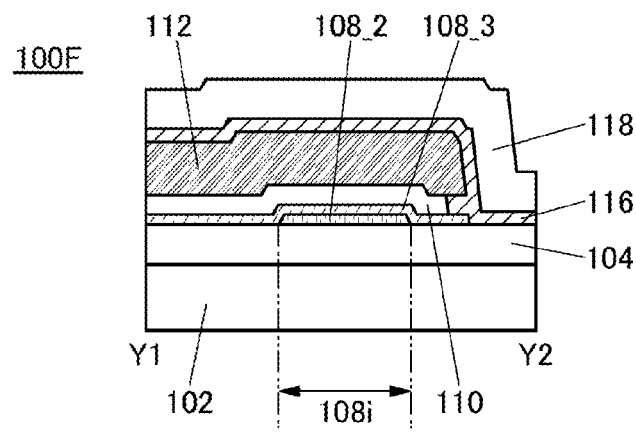

FIGS. 7A and 7B are cross-sectional views of a transistor 100F. The transistor 100F is different from the transistor 100 described above in the shape of the insulating film 110 and the shape of the insulating film 116. Except that, the transistor 100F has a structure and an effect similar to those of the transistor 100 described above.

The insulating film 110 included in the transistor 100F is positioned further inward than the oxide semiconductor film 112. In other words, side surfaces of the insulating film 110 are positioned further inward than lower end portions of the oxide semiconductor film 112. For example, the structure in FIGS. 7A and 7B can be obtained by side etching of the insulating film 110 with an etchant or the like after processing of the oxide semiconductor film 112. Furthermore, when the insulating film 116 is formed after the formation of the insulating film 110 having the above structure, the insulating film 116 is also formed under the oxide semiconductor film 112 and in contact with the oxide semiconductor film 108 under the oxide semiconductor film 112.

In the above structure, inner end portions of the source region 108s and the drain region 108d are positioned further inward than the lower end portions of the oxide semiconductor film 112. Thus, the transistor 100F includes Lov regions.

In the transistor including the Lov regions, electric field concentration is relieved and no high-resistance region is formed between the channel region 108i and the source region 108s or the drain region 108d; accordingly, the on-state current of the transistor can be increased.

Figure 8A:
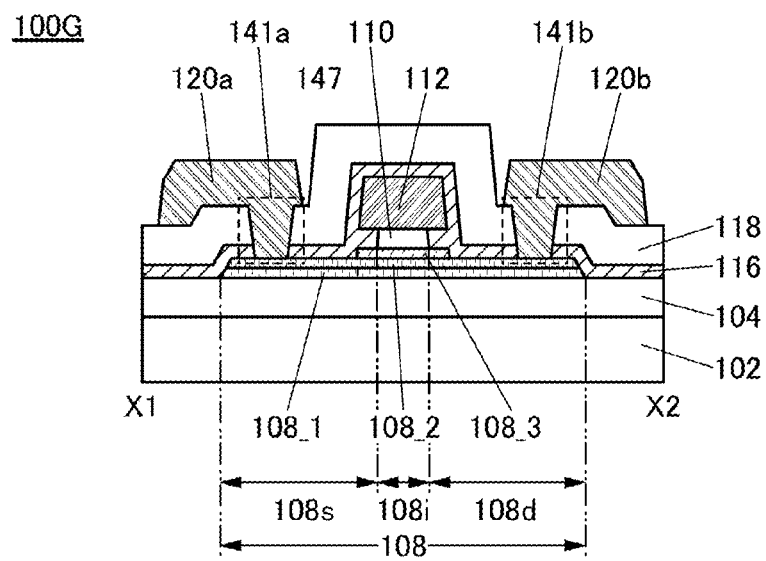
FIGS. 8A and 8B show cross-sectional views of a semiconductor device.
Figure 8B:
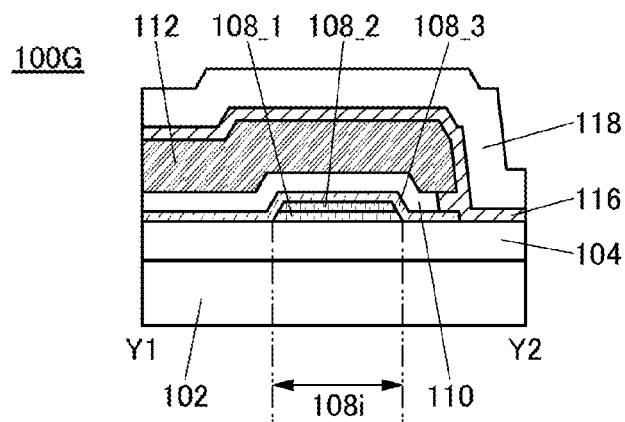

The insulating film 110 and the insulating film 116 in the transistor 100A described above can have structures similar to those in the transistor 100F. FIGS. 8A and 8B illustrate an example in this case. FIGS. 8A and 8B are cross-sectional views of a transistor 100G.

<1-8. Structural Example 5 of Semiconductor Device>

Next, a structure of a semiconductor device different from that in FIGS. 1A to 1C will be described with reference to FIGS. 9A to 9C.

Figure 9A:
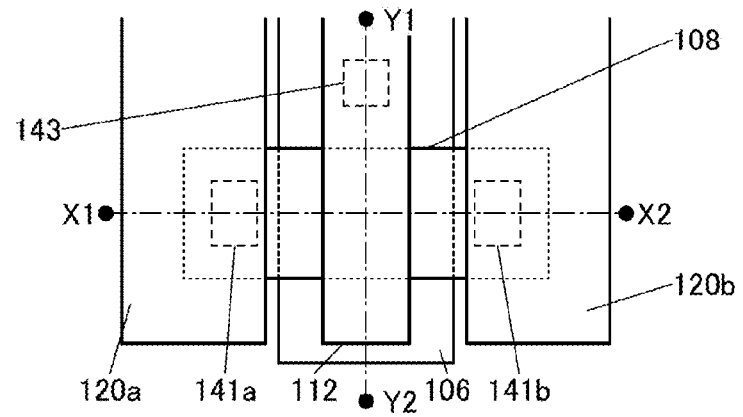
FIGS. 9A to 9C show a top view and cross-sectional views of a semiconductor device.

FIG. 9A is a top view of a transistor 150. FIG. 9B is a cross-sectional view taken along dashed-dotted line X1-X2 in FIG. 9A. FIG. 9C is a cross-sectional view taken along dashed-dotted line Y1-Y2 in FIG. 9A.

Figure 9B:
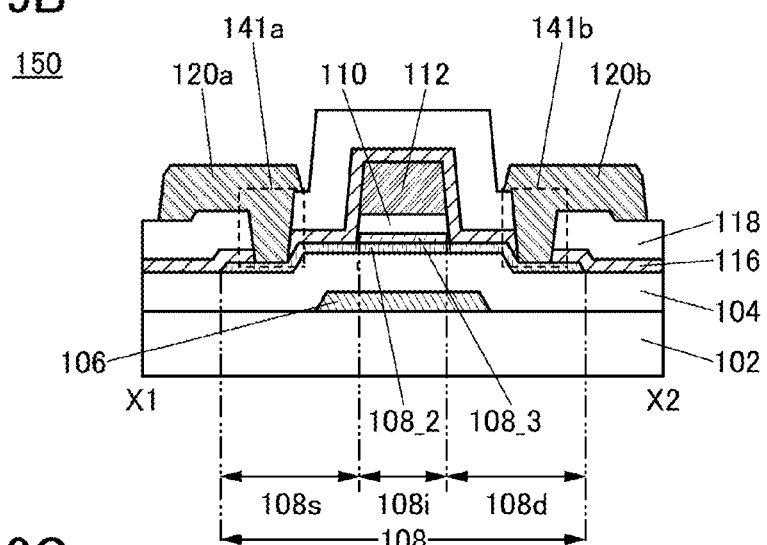
Figure 9C:
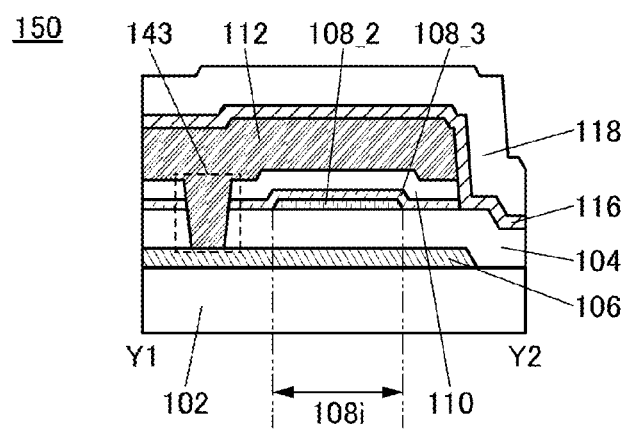

The transistor 150 in FIGS. 9A to 9C includes a conductive film 106 formed over the substrate 102, the insulating film 104 over the conductive film 106, the oxide semiconductor film 108 over the insulating film 104, the insulating film 110 over the oxide semiconductor film 108, the oxide semiconductor film 112 over the insulating film 110, and the insulating film 116 over the insulating film 104, the oxide semiconductor film 108, and the oxide semiconductor film 112. The oxide semiconductor film 108 includes the channel region 108i overlapping with the oxide semiconductor film 112, the source region 108s in contact with the insulating film 116, and the drain region 108d in contact with the insulating film 116. The channel region 108i includes the layer 108_2 and the layer 108_3 which is in contact with a top surface of the layer 108_2 and covers side surfaces of the layer 108_2 in the channel width direction.

The oxide semiconductor film 112 is electrically connected to the conductive film 106 through an opening 143 provided in the insulating film 110, the layer 108_3, and the insulating film 104. Accordingly, the conductive film 106 and the oxide semiconductor film 112 are supplied with the same potential. Alternatively, the opening 143 is not necessarily provided, and the conductive film 106 and the oxide semiconductor film 112 may be supplied with different potentials.

As seen above, the transistor 150 includes the conductive film 106 and the opening 143 in addition to the components of the transistor 100 described above.

The conductive film 106 functions as a first gate electrode (also referred to as a bottom gate electrode), and the oxide semiconductor film 112 functions as a second gate electrode (also referred to as a top gate electrode). The insulating film 104 functions as a first gate insulating film, and the insulating film 110 functions as a second gate insulating film.

In this manner, unlike the transistor 100 described above, the transistor 150 in FIGS. 9A to 9C has a dual-gate structure in which a conductive film and an oxide semiconductor film which function as gate electrodes are provided over and under the oxide semiconductor film 108. As in the transistor 150, two or more gate electrodes may be provided in the semiconductor device of one embodiment of the present invention.

As illustrated in FIG. 9C, the oxide semiconductor film 108 faces the conductive film 106 functioning as a first gate electrode and the oxide semiconductor film 112 functioning as a second gate electrode and is positioned between the conductive film and the oxide semiconductor film which function as gate electrodes.

Furthermore, the length of the oxide semiconductor film 112 in the channel width (W) direction is larger than the length of the oxide semiconductor film 108 in the channel width (W) direction. In the channel width (W) direction, the whole oxide semiconductor film 108 is covered with the oxide semiconductor film 112 with the insulating film 110 positioned therebetween. Since the oxide semiconductor film 112 is connected to the conductive film 106 through the opening 143 provided in the insulating film 104, the layer 108_3, and the insulating film 110, a side surface of the oxide semiconductor film 108 in the channel width (W) direction faces the oxide semiconductor film 112.

In other words, in the channel width (W) direction of the transistor 150, the conductive film 106 and the oxide semiconductor film 112 are connected to each other through the opening 143 provided in the insulating film 104, the layer 108_3, and the insulating film 110, and the conductive film 106 and the oxide semiconductor film 112 surround the oxide semiconductor film 108 with the insulating film 104, the layer 108_3, and the insulating film 110 positioned therebetween.

Such a structure enables the oxide semiconductor film 108 included in the transistor 150 to be electrically surrounded by electric fields of the conductive film 106 functioning as a first gate electrode and the oxide semiconductor film 112 functioning as a second gate electrode. A device structure of a transistor, like that of the transistor 150, in which electric fields of a first gate electrode and a second gate electrode electrically surround an oxide semiconductor film in which a channel region is formed can be referred to as a surrounded channel (S-channel) structure.

Since the transistor 150 has the S-channel structure, an electric field for inducing a channel can be effectively applied to the oxide semiconductor film 108 by the conductive film 106 or the oxide semiconductor film 112; therefore, the current drive capability of the transistor 150 can be improved and high on-state current characteristics can be obtained. Since the on-state current can be increased, it is possible to reduce the size of the transistor 150. In addition, since the oxide semiconductor film 108 is surrounded by the conductive film 106 and the oxide semiconductor film 112, the mechanical strength of the oxide semiconductor film 108 can be increased.

When seen in the channel width (W) direction of the transistor 150, an opening different from the opening 143 may be formed on the side of the oxide semiconductor film 108 on which the opening 143 is not formed.

When a transistor has a pair of gate electrodes between which a semiconductor film is positioned as in the transistor 150, one of the gate electrodes may be supplied with a signal A, and the other gate electrode may be supplied with a fixed potential $V_b$. Alternatively, one of the gate electrodes may be supplied with the signal A, and the other gate electrode may be supplied with a signal B. Alternatively, one of the gate electrodes may be supplied with a fixed potential $V_a$, and the other gate electrode may be supplied with the fixed potential $V_b$.

The signal A is, for example, a signal for controlling the on/off state. The signal A may be a digital signal with two kinds of potentials, a potential $V_1$ and a potential $V_2$ ($V_1 > V_2$). For example, the potential $V_1$ can be a high power supply potential, and the potential $V_2$ can be a low power supply potential. The signal A may be an analog signal.

The fixed potential $V_b$ is, for example, a potential for controlling a threshold voltage $V_{thA}$ of the transistor. The fixed potential $V_b$ may be the potential $V_1$ or the potential $V_2$. The fixed potential $V_b$ may be different from the potential $V_1$ or the potential $V_2$. When the fixed potential $V_b$ is low, the threshold voltage $V_{thA}$ can be high in some cases. As a result, the drain current flowing when the gate-source voltage $V_{gs}$ is 0 V can be reduced, and leakage current in a circuit including the transistor can be reduced in some cases. The fixed potential $V_b$ may be, for example, lower than the low power supply potential. When the fixed potential $V_b$ is high, the threshold voltage $V_{thA}$ can be low in some cases. As a result, the drain current flowing when the gate-source voltage $V_{gs}$ is VDD and the operating speed of the circuit including the transistor can be increased in some cases. The fixed potential $V_b$ may be, for example, higher than the low power supply potential.

The signal B is, for example, a signal for controlling the on/off state. The signal B may be a digital signal with two kinds of potentials, a potential $V_3$ and a potential $V_4$ ($V_3 > V_4$). For example, the potential $V_3$ can be a high power supply potential, and the potential $V_4$ can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential $V_1$ and the potential $V_2$ of the signal A may be different from the potential $V_3$ and the potential $V_4$ of the signal B. For example, if a gate insulating film for the gate to which the signal B is input is thicker than a gate insulating film for the gate to which the signal A is input, the potential amplitude of the signal B ($V_3-V_4$) may be larger than the potential amplitude of the signal A ($V_1-V_2$). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor can function by itself as a NAND circuit, a NOR circuit, or the like in the following case: the transistor is turned on only when the signal A has the potential $V_1$ and the signal B has the potential $V_3$, or the transistor is turned off only when the signal A has the potential $V_2$ and the signal B has the potential $V_4$. The signal B may be a signal for controlling the threshold voltage $V_{thA}$. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not necessarily changed as frequently as the potential of the signal A.

When both the signal A and the signal B are analog signals, the signal B may be an analog signal having the same potential as the signal A, an analog signal whose potential is a constant times the potential of the signal A, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential $V_a$ or the fixed potential $V_b$ is high (low). When both the fixed potential $V_a$ and the fixed potential $V_b$ are high (low), the effective resistance can be lower (higher) than that of a transistor with only one gate in some cases.

Except the above-mentioned points, the transistor 150 has a structure and an effect similar to those of the transistor 100 described above.

Figure 10A:
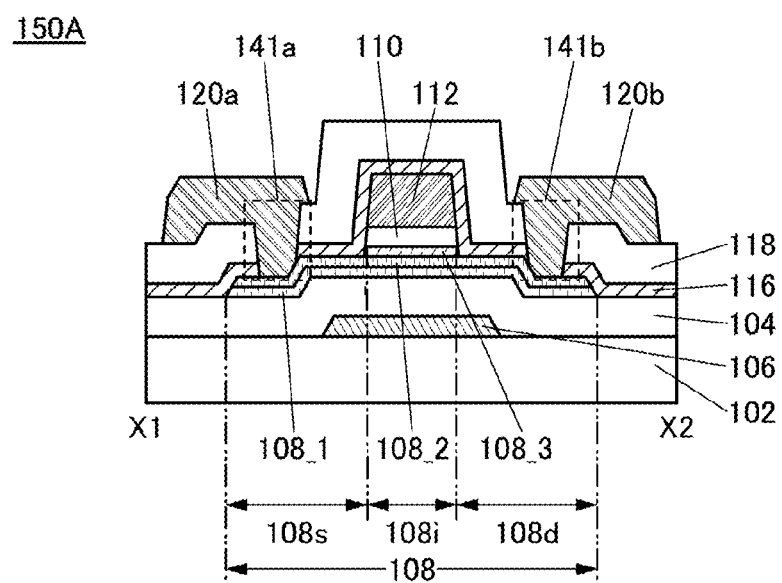
FIGS. 10A and 10B show cross-sectional views of a semiconductor device.
Figure 10B:
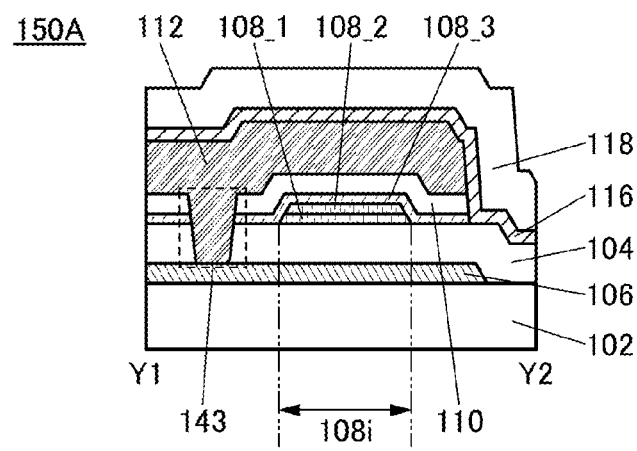

As in the transistor 150, the conductive film 106 and the opening 143 may be provided in the transistor 100A described above. FIGS. 10A and 10B illustrate an example in this case. FIG. 10A is a cross-sectional view taken along dashed-dotted line X1-X2 in FIG. 9A. FIG. 10B is a cross-sectional view taken along dashed-dotted line Y1-Y2 in FIG. 9A.

<1-9. Structural Example 6 of Semiconductor Device>

Next, a structure of a semiconductor device different from that in FIGS. 1A to 1C will be described with reference to FIGS. 11A to 11C.

Figure 11A:
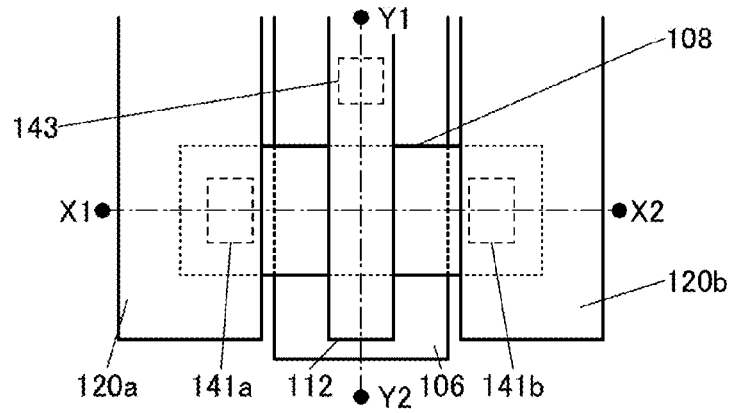
FIGS. 11A to 11C show a top view and cross-sectional views of a semiconductor device.

FIG. 11A is a top view of a transistor 160. FIG. 11B is a cross-sectional view taken along dashed-dotted line X1-X2 in FIG. 11A. FIG. 11C is a cross-sectional view taken along dashed-dotted line Y1-Y2 in FIG. 11A.

Figure 11B:
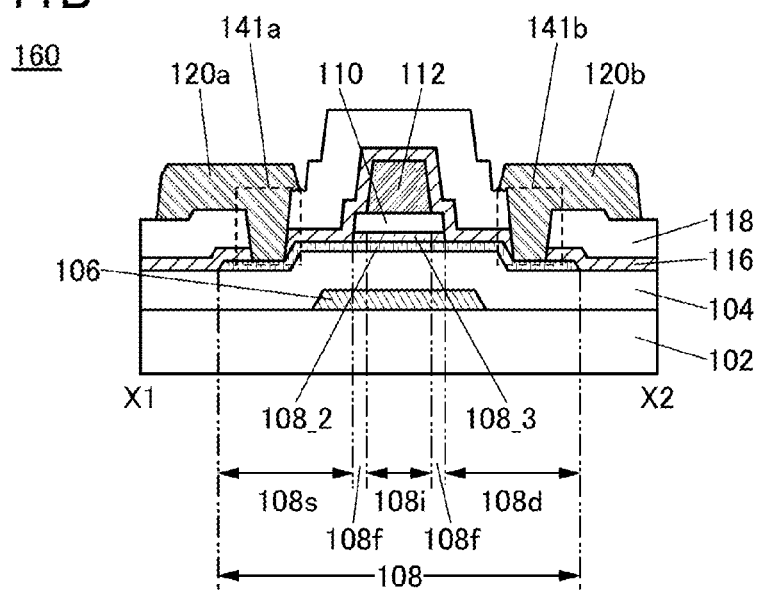
Figure 11C:
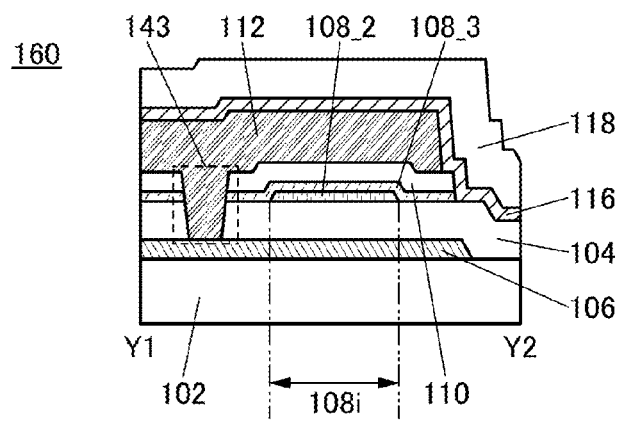

The transistor 160 in FIGS. 11A to 11C is different from the transistor 150 described above in the shape of the oxide semiconductor film 112. Specifically, lower end portions of the oxide semiconductor film 112 included in the transistor 160 are positioned further inward than upper end portions of the insulating film 110. In other words, side end portions of the insulating film 110 are positioned further outward than side end portions of the oxide semiconductor film 112.

For example, the above structure can be obtained in the following manner: after being processed using the same mask, the oxide semiconductor film 112 and the insulating film 110 are processed by a wet etching method and a dry etching method, respectively.

When the oxide semiconductor film 112 has the above structure, regions 108f are formed in the oxide semiconductor film 108 in some cases. The regions 108f are formed between the channel region 108i and the source region 108s and between the channel region 108i and the drain region 108d.

The regions 108f function as high-resistance regions or low-resistance regions. The high-resistance regions have the same level of resistance as the channel region 108i and do not overlap with the oxide semiconductor film 112 functioning as a gate electrode. In the case where the regions 108f are high-resistance regions, the regions 108f function as offset regions. To suppress a decrease in the on-state current of the transistor 160, the regions 108f functioning as offset regions may each have a length of 1 μm or less in the channel length (L) direction.

The low-resistance regions have a resistance that is lower than that of the channel region 108i and higher than that of the source region 108s and the drain region 108d. In the case where the regions 108f are low-resistance regions, the regions 108f function as lightly doped drain (LDD) regions. The regions 108f functioning as LDD regions can relieve an electric field in the drain region, thereby reducing a change in the threshold voltage of the transistor due to the electric field in the drain region.

The regions 108f serving as low-resistance regions are formed by the following method. For example, hydrogen and/or nitrogen are/is supplied from the insulating film 116 to the regions 108f. Alternatively, an impurity element is added from above the oxide semiconductor film 112 with the use of the insulating film 110 and the oxide semiconductor film 112 as masks, so that the impurity is added to the oxide semiconductor film 108 through the insulating film 110.

Figure 12A:
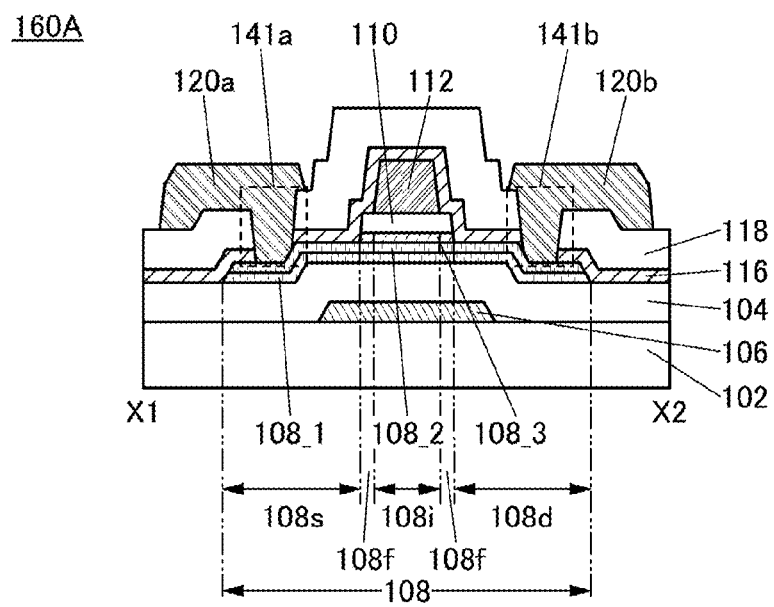
FIGS. 12A and 12B show cross-sectional views of a semiconductor device.
Figure 12B:
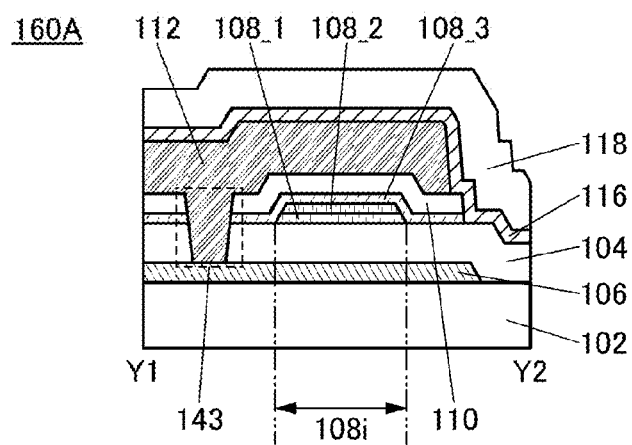

By changing the shape of the oxide semiconductor film 112 functioning as a second gate electrode, the transistor 150 described above can have a structure similar to that of the transistor 160. FIGS. 12A and 12B illustrate an example in this case. FIGS. 12A and 12B are cross-sectional views of a transistor 160A. The cross-sectional view in FIG. 12A is taken along dashed-dotted line X1-X2 in FIG. 11A, and the cross-sectional view in FIG. 12B is taken along dashed-dotted line Y1-Y2 in FIG. 11A.

<1-10. Structural Example 7 of Semiconductor Device>

Next, a structure of a semiconductor device different from that in FIGS. 11A to 11C will be described with reference to FIGS. 13A and 13B.

Figure 13A:
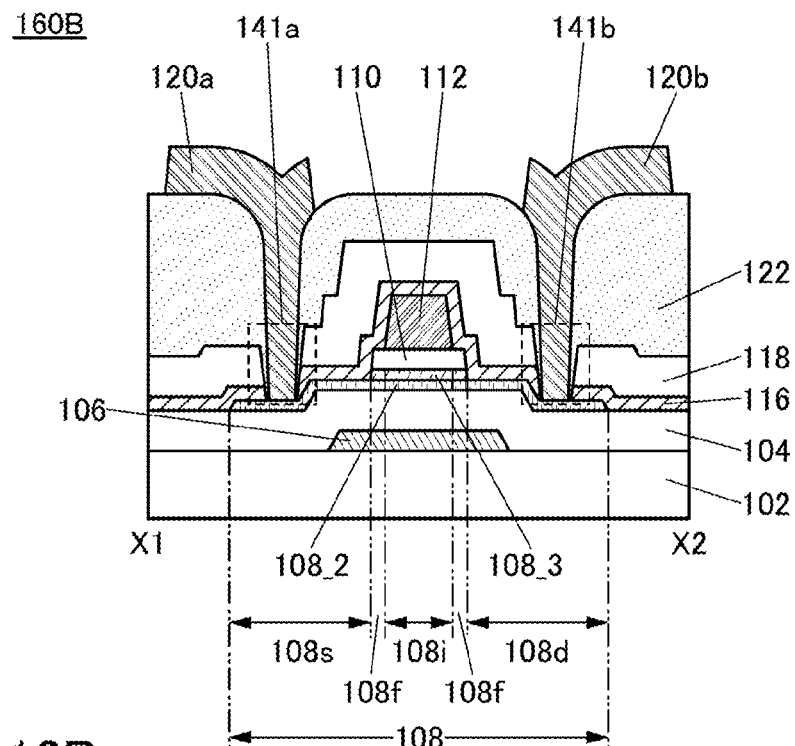
FIGS. 13A and 13B show cross-sectional views of a semiconductor device.
Figure 13B:
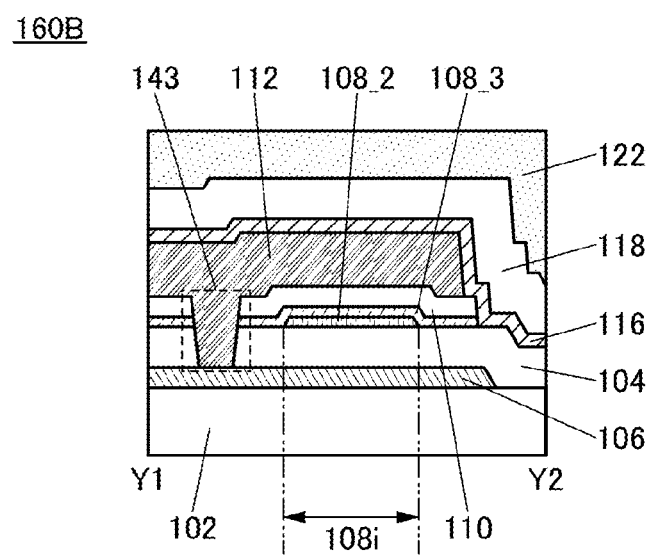

FIGS. 13A and 13B are cross-sectional views of a transistor 160B. A top view of the transistor 160B is similar to that of the transistor 160 in FIG. 11A and will be described with reference to FIG. 11A. The cross-sectional view in FIG. 13A is taken along dashed-dotted line X1-X2 in FIG. 11A, and the cross-sectional view in FIG. 13B is taken along dashed-dotted line Y1-Y2 in FIG. 11A.

The transistor 160B is different from the transistor 160 described above in that an insulating film 122 functioning as a planarization insulating film is provided. Except that, the transistor 160B has a structure and an effect similar to those of the transistor 160 described above.

The insulating film 122 has a function of covering unevenness and the like caused by the transistor or the like. The insulating film 122 has an insulating property and is formed using an inorganic material or an organic material. Examples of the inorganic material include a silicon oxide film, a silicon oxynitride film, a silicon nitride oxide film, a silicon nitride film, an aluminum oxide film, and an aluminum nitride film. Examples of the organic material include photosensitive resin materials such as an acrylic resin and a polyimide resin.

Note that the size of each opening in the insulating film 122 is not limited to that in FIGS. 13A and 13B, in which the openings are smaller than the openings 141a and 141b, and may be larger than or equal to the size of each of the openings 141a and 141b, for example.

In addition, the structure is not limited to the example in FIGS. 13A and 13B, in which the conductive films 120a and 120b are provided over the insulating film 122; for example, the insulating film 122 may be provided over the conductive films 120a and 120b formed over the insulating film 118.

Figure 14A:
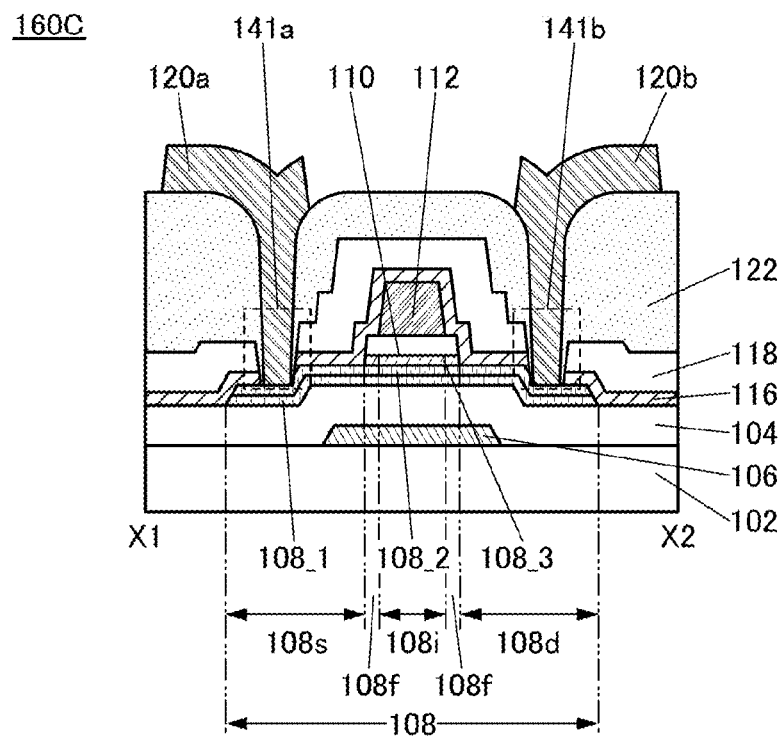
FIGS. 14A and 14B show cross-sectional views of a semiconductor device.
Figure 14B:
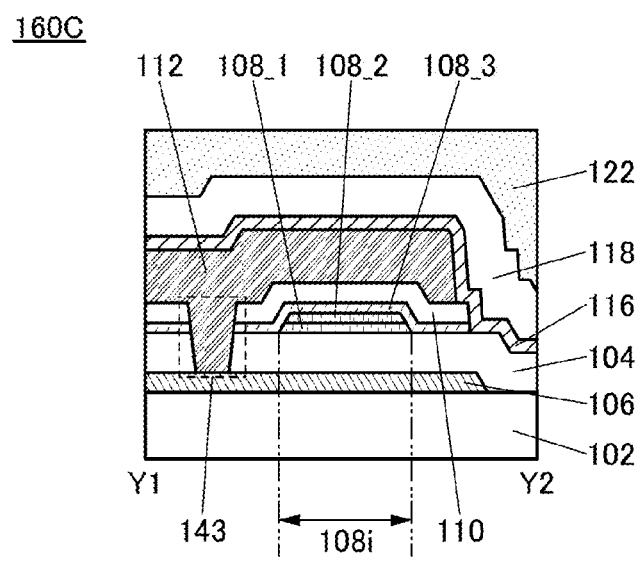

With the insulating film 122, the transistor 160A described above can have a structure similar to that of the transistor 160B. FIGS. 14A and 14B illustrate an example in this case. FIGS. 14A and 14B are cross-sectional views of a transistor 160C. The cross-sectional view in FIG. 14A is taken along dashed-dotted line X1-X2 in FIG. 11A, and the cross-sectional view in FIG. 14B is taken along dashed-dotted line Y1-Y2 in FIG. 11A.

<1-11. Method 1 for Manufacturing Semiconductor Device>

Next, an example of a method for manufacturing the transistor 100 in FIGS. 1A to 1C will be described with reference to FIGS. 16A to 16D, FIGS. 17A to 17D, and FIGS. 18A to 18C. Note that FIGS. 16A to 16D, FIGS. 17A to 17D, and FIGS. 18A to 18C are cross-sectional views in the channel length (L) direction and the channel width (W) direction and illustrate a method for manufacturing the transistor 100.

First, the insulating film 104 is formed over the substrate 102, and an oxide semiconductor film is formed over the insulating film 104. Then, the oxide semiconductor film is processed into an island shape, whereby the layer 108_2 is formed (see FIG. 16A).

The insulating film 104 can be formed by a sputtering method, a CVD method, an evaporation method, a pulsed laser deposition (PLD) method, a printing method, a coating method, or the like as appropriate. In this embodiment, as the insulating film 104, a 400-nm-thick silicon nitride film and a 50-nm-thick silicon oxynitride film are formed with a PECVD apparatus.

After the insulating film 104 is formed, oxygen may be added to the insulating film 104. As oxygen added to the insulating film 104, an oxygen radical, an oxygen atom, an oxygen atomic ion, an oxygen molecular ion, or the like may be used. Oxygen can be added by an ion doping method, an ion implantation method, a plasma treatment method, or the like. Alternatively, a film that suppresses oxygen release may be formed over the insulating film 104, and then, oxygen may be added to the insulating film 104 through the film.

The above film that suppresses oxygen release can be formed using the following conductive material: a metal element selected from indium, zinc, gallium, tin, aluminum, chromium, tantalum, titanium, molybdenum, nickel, iron, cobalt, and tungsten; an alloy containing the metal element as a component; an alloy containing any of the metal elements in combination; a metal nitride containing the metal element; a metal oxide containing the metal element; a metal nitride oxide containing the metal element; or the like.

In the case where oxygen is added by plasma treatment in which oxygen is excited by a microwave to generate high-density oxygen plasma, the amount of oxygen added to the insulating film 104 can be increased.

The layer 108_2 can be formed by a sputtering method, a coating method, a pulsed laser deposition method, a laser ablation method, a thermal CVD method, or the like. Note that the oxide semiconductor film can be processed into the layer 108_2 in the following manner: a mask is formed over the oxide semiconductor film by a lithography process, and then, the oxide semiconductor film is partly etched using the mask. Alternatively, the island-shaped layer 108_2 may be directly formed over the insulating film 104 by a printing method.

As a power supply device for generating plasma when the oxide semiconductor film is formed by a sputtering method, an RF power supply device, an AC power supply device, a DC power supply device, or the like can be used as appropriate. As a sputtering gas for forming the oxide semiconductor film, a rare gas (typically argon), oxygen, or a mixed gas of a rare gas and oxygen is used as appropriate. In the mixed gas of a rare gas and oxygen, the proportion of oxygen to the rare gas is preferably increased.

To increase the crystallinity of the oxide semiconductor film formed by a sputtering method, for example, the oxide semiconductor film is preferably deposited at a substrate temperature higher than or equal to 150° C. and lower than or equal to 750° C., higher than or equal to 150° C. and lower than or equal to 450° C., or higher than or equal to 200° C. and lower than or equal to 350° C.

In this embodiment, as the layer 108_2, a 30-nm-thick oxide semiconductor film is deposited with a sputtering apparatus using an In—Ga—Zn metal oxide (In:Ga:Zn=4:2:4.1 [atomic ratio]) as a sputtering target.

After the layer 108_2 is formed, the layer 108_2 may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing nitrogen or a rare gas such as helium, neon, argon, xenon, or krypton. Alternatively, the heat treatment may be performed in an inert gas atmosphere first, and then, in an oxygen atmosphere. It is preferable that the above inert gas atmosphere and the above oxygen atmosphere do not contain hydrogen, water, and the like. The treatment time may be longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By depositing the oxide semiconductor film while it is heated or by performing heat treatment after the formation of the oxide semiconductor film, the hydrogen concentration in the oxide semiconductor film, which is measured by secondary ion mass spectrometry, can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

Note that the transistor 100A described above can be formed in the following manner: an oxide semiconductor film having a stacked-layer structure is formed in the step of forming the layer 108_2 and is processed into an island shape to form the layer 108_1 and the layer 108_2.

Figure 16A:
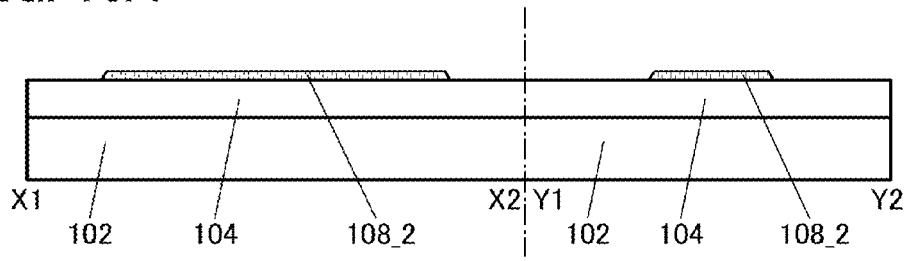
FIGS. 16A to 16D are cross-sectional views illustrating a method for manufacturing a semiconductor device.
Figure 16B:
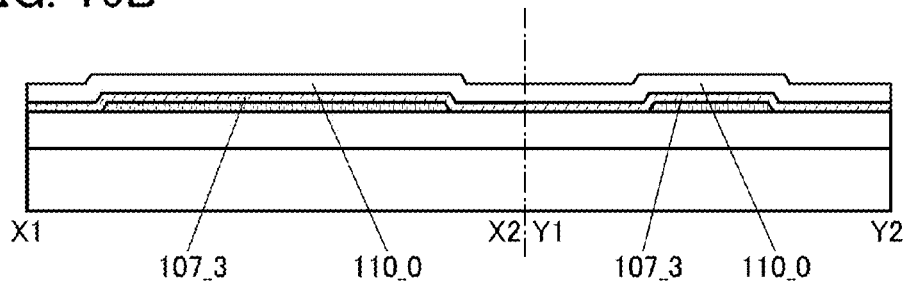

Next, an oxide semiconductor film 107_3 and an insulating film 110_0 are formed over the insulating film 104 and the layer 108_2 (see FIG. 16B).

The oxide semiconductor film 107_3 is formed to cover side surfaces of the layer 108_2. Note that the oxide semiconductor film 107_3 can be formed using a material and a method similar to those of the layer 108_2 described above.

In this embodiment, as the oxide semiconductor film 107_3, a 5-nm-thick oxide semiconductor film is deposited with a sputtering apparatus using an In—Ga—Zn metal oxide (In:Ga:Zn=1:1:1.2 [atomic ratio]) as a sputtering target.

As the insulating film 110_0, a silicon oxide film or a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. As examples of the oxidizing gas, oxygen, ozone, dinitrogen monoxide, and nitrogen dioxide can be given.

A silicon oxynitride film having few defects can be formed as the insulating film 110_0 by a PECVD method under the conditions that the flow rate of the oxidizing gas is more than 20 times and less than 100 times, or more than or equal to 40 times and less than or equal to 80 times the flow rate of the deposition gas and that the pressure in a treatment chamber is lower than 100 Pa or lower than or equal to 50 Pa.

As the insulating film 110_0, a dense silicon oxide film or a dense silicon oxynitride film can be formed under the following conditions: the substrate placed in a vacuum-evacuated treatment chamber of a PECVD apparatus is held at a temperature higher than or equal to 280° C. and lower than or equal to 400° C., the pressure in the treatment chamber into which a source gas is introduced is set to be higher than or equal to 20 Pa and lower than or equal to 250 Pa, preferably higher than or equal to 100 Pa and lower than or equal to 250 Pa, and a high-frequency power is supplied to an electrode provided in the treatment chamber.

The insulating film 110_0 may be formed by a PECVD method using a microwave. A microwave refers to a wave in the frequency range of 300 MHz to 300 GHz. In a microwave, electron temperature and electron energy are low. Furthermore, in the power supplied in a PECVD apparatus using a microwave, the proportion of power used for plasma generation, that is, power used for ionization of molecules is high, whereas the proportion of power used for electron acceleration is low. Thus, plasma with high density (high-density plasma) can be generated. This method causes little plasma damage to the deposition surface or a deposit, so that the insulating film 110_0 having few defects can be formed.

Alternatively, the insulating film 110_0 can also be formed by a CVD method using an organosilane gas. As the organosilane gas, the following silicon-containing compound can be used: tetraethyl orthosilicate (TEOS) (chemical formula: $Si(OC_2H_5)_4$), tetramethylsilane (TMS) (chemical formula: $Si(CH_3)_4$), tetramethylcyclotetrasoxane (TMCTS), octamethylcyclotetrasiloxane (OMCTS), hexamethyldisilazane (HMDS), triethoxysilane ($SiH(OC_2H_5)_3$), trisdimethylaminosilane ($SiH(N(CH_3)_2)_3$), or the like. By a CVD method using an organosilane gas, the insulating film 110_0 having high coverage can be formed.

In this embodiment, as the insulating film 110_0, a 100-nm-thick silicon oxynitride film is formed with a PECVD apparatus.

Next, an oxide semiconductor film 112_0 is formed over the insulating film 110_0. In the formation of the oxide semiconductor film 112_0, oxygen is added from the oxide semiconductor film 112_0 to the insulating film 110_0 (see FIG. 16C).

The oxide semiconductor film 112_0 is preferably formed by a sputtering method in an atmosphere containing an oxygen gas. Since the atmosphere in which the oxide semiconductor film 112_0 is formed contains an oxygen gas, oxygen can be favorably added to the insulating film 110_0.

Figure 16C:
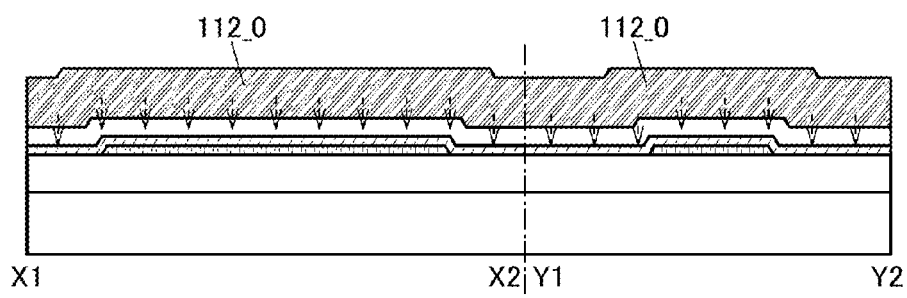

In FIG. 16C, oxygen added to the insulating film 110_0 is schematically shown by arrows. For the oxide semiconductor film 112_0, a material similar to that of the layer 108_2 described above can be used.

In this embodiment, as the oxide semiconductor film 112_0, a 100-nm-thick oxide semiconductor film is deposited with a sputtering apparatus using an In—Ga—Zn metal oxide (In:Ga:Zn=4:2:4.1 [atomic ratio]) as a sputtering target.

Figure 16D:
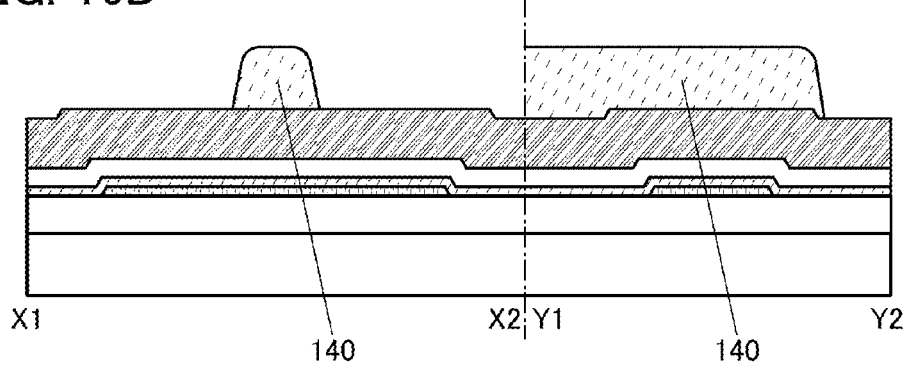

Subsequently, a mask 140 is formed by a lithography process in a desired position over the oxide semiconductor film 112_0 (see FIG. 16D).

Figure 17A:
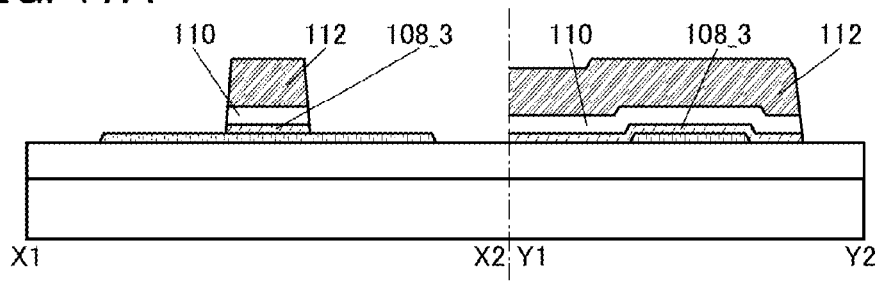
FIGS. 17A to 17D are cross-sectional views illustrating a method for manufacturing a semiconductor device.

Next, the oxide semiconductor film 112_0, the insulating film 110_0, and the oxide semiconductor film 107_3 are processed by etching from above the mask 140, and then, the mask 140 is removed, so that the island-shaped oxide semiconductor film 112, the island-shaped insulating film 110, and the island-shaped layer 108_3 are formed (see FIG. 17A).

Note that a surface of the layer 108_2 is partly exposed when the layer 108_3 is formed. The exposed regions of the layer 108_2 serve as the source region 108s and the drain region 108d later.

In this embodiment, the oxide semiconductor film 112_0, the insulating film 110_0, and the oxide semiconductor film 107_3 are processed by a dry etching method.

In the processing into the oxide semiconductor film 112, the insulating film 110, and the layer 108_3, the thickness of the layer 108_2 is decreased in a region not overlapping with the oxide semiconductor film 112 in some cases. In other cases, in the processing into the oxide semiconductor film 112, the insulating film 110, and the layer 108_3, the thickness of the insulating film 104 is decreased in a region not overlapping with the layer 108_2.

Figure 17B:
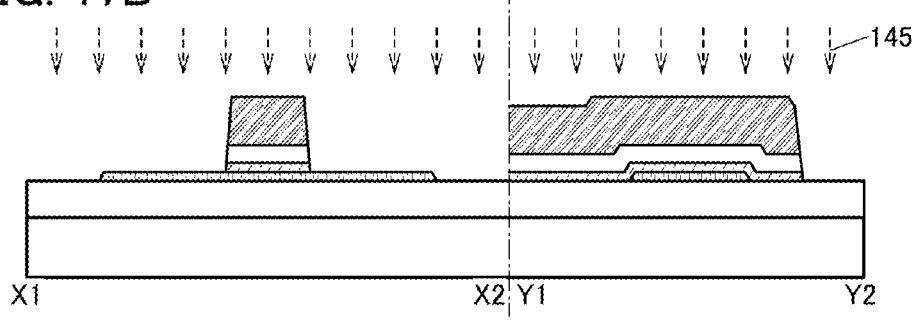
Figure 17C:
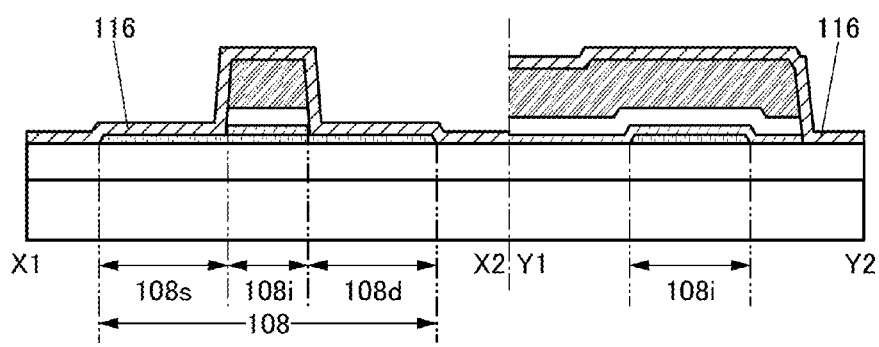

Next, an impurity element 145 is added from above the insulating film 104, the layer 108_2, and the oxide semiconductor film 112 (see FIG. 17B).

The impurity element 145 can be added by an ion doping method, an ion implantation method, a plasma treatment method, or the like. In a plasma treatment method, an impurity element can be added using plasma generated in a gas atmosphere containing the impurity element. A dry etching apparatus, an ashing apparatus, a PECVD apparatus, a high-density PECVD apparatus, or the like can be used to generate plasma.

As a source gas of the impurity element 145, at least one of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas (e.g., argon) can be used. Alternatively, at least one of $B_2H_6$, $PH_3$, $N_2$, $NH_3$, $AlH_3$, $AlCl_3$, $F_2$, HF, and $H_2$ which are diluted with a rare gas can be used. At least one of $B_2H_6$, $PH_3$, $N_2$, $NH_3$, $AlH_3$, $AlCl_3$, $F_2$, HF, and $H_2$ which are diluted with a rare gas is used to add the impurity element 145 to the layer 108_2 and the oxide semiconductor film 112, whereby at least one of a rare gas, hydrogen, boron, carbon, nitrogen, fluorine, phosphorus, sulfur, and chlorine can be added to the layer 108_2 and the oxide semiconductor film 112.

Alternatively, after being added to the layer 108_2 and the oxide semiconductor film 112 with the use of a rare gas as a source gas, the impurity element 145 may be added thereto with the use of at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ as a source gas.

Alternatively, after being added to the layer 108_2 and the oxide semiconductor film 112 with the use of at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ as a source gas, the impurity element 145 may be added thereto with the use of a rare gas as a source gas.

The addition of the impurity element 145 may be controlled by appropriately setting the implantation conditions such as the accelerating voltage and the dose. For example, in the case where argon is added by an ion implantation method, the accelerating voltage may be higher than or equal to 10 kV and lower than or equal to 100 kV and the dose may be greater than or equal to $1\times10^{13}$ ions/cm$^2$ and less than or equal to $1\times10^{16}$ ions/cm$^2$, for example, $1\times10^{14}$ ions/cm$^2$. In the case where phosphorus ions are added by an ion implantation method, the accelerating voltage may be 30 kV and the dose may be greater than or equal to $1\times10^{13}$ ions/cm$^2$ and less than or equal to $5\times10^{16}$ ions/cm$^2$, for example, $1\times10^{15}$ ions/cm$^2$.

One embodiment of the present invention is not limited to the example described in this embodiment, in which the impurity element 145 is added after the mask 140 is removed; for example, the impurity element 145 may be added with the mask 140 left.

In this embodiment, as the impurity element 145, argon is added to the layer 108_2 and the oxide semiconductor film 112 with the use of a doping apparatus. Note that one embodiment of the present invention is not limited thereto, and for example, the step of adding the impurity element 145 is not necessarily performed.

Next, the insulating film 116 is formed over the insulating film 104, the layer 108_2, and the oxide semiconductor film 112. As a result of the formation of the insulating film 116, regions of the layer 108_2 which are in contact with the insulating film 116 serve as the source region 108s and the drain region 108d. In addition, the layer 108_3 and regions of the layer 108_2 which are not in contact with the insulating film 116 serve as the channel region 108i. In this manner, the oxide semiconductor film 108 of one embodiment of the present invention is formed (see FIG. 17C).

Thus, the oxide semiconductor film 108 includes the channel region 108i overlapping with the oxide semiconductor film 112, the source region 108s in contact with the insulating film 116, and the drain region 108d in contact with the insulating film 116. The channel region 108i includes the layer 108_2 and the layer 108_3 which is in contact with a top surface of the layer 108_2 and covers side surfaces of the layer 108_2 in the channel width direction.

Note that the insulating film 116 can be formed using a material selected from the above-mentioned materials. In this embodiment, as the insulating film 116, a 100-nm-thick silicon nitride film is formed with a PECVD apparatus.

With the silicon nitride film used as the insulating film 116, hydrogen in the silicon nitride film enters the oxide semiconductor film 112, the source region 108s, and the drain region 108d in contact with the insulating film 116; consequently, the carrier densities in the oxide semiconductor film 112, the source region 108s, and the drain region 108d can be increased.

Figure 17D:
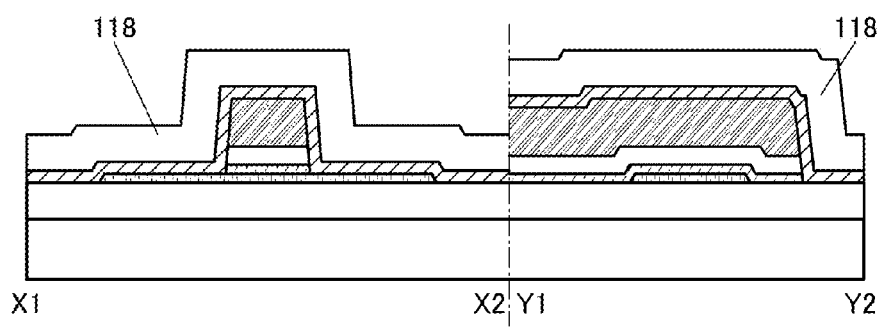

Next, the insulating film 118 is formed over the insulating film 116 (see FIG. 17D).

The insulating film 118 can be formed using a material selected from the above-mentioned materials. In this embodiment, as the insulating film 118, a 300-nm-thick silicon oxynitride film is formed with a PECVD apparatus.

Figure 18A:
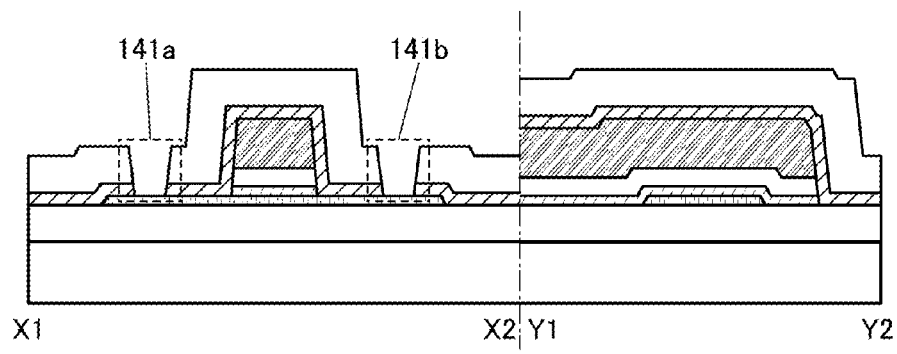
FIGS. 18A to 18C are cross-sectional views illustrating a method for manufacturing a semiconductor device.

Subsequently, a mask is formed by a lithography process in a desired position over the insulating film 118, and then, the insulating film 118 and the insulating film 116 are partly etched, so that the opening 141a reaching the source region 108s and the opening 141b reaching the drain region 108d are formed (see FIG. 18A).

As a method for etching the insulating film 118 and the insulating film 116, a wet etching method and/or a dry etching method can be used as appropriate. In this embodiment, the insulating film 118 and the insulating film 116 are processed by a dry etching method.

Figure 18B:
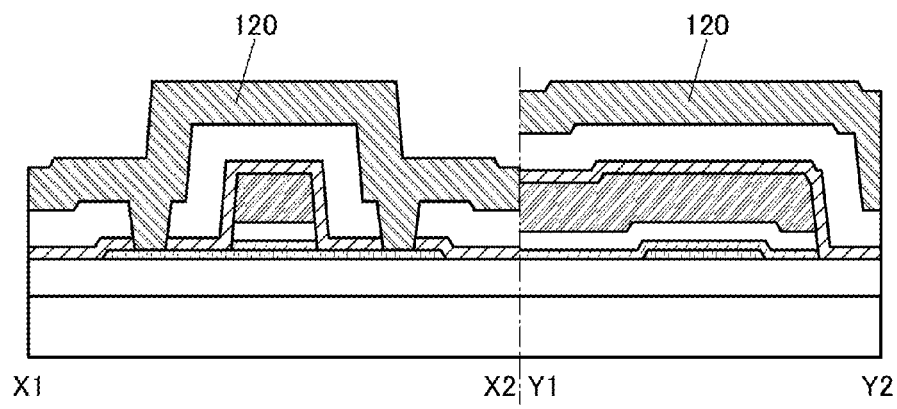

Next, a conductive film 120 is formed over the insulating film 118 to cover the openings 141a and 141b (see FIG. 18B).

The conductive film 120 can be formed using a material that can be used for the conductive films 120a and 120b. In this embodiment, as the conductive film 120, a stack including a 50-nm-thick titanium film, a 400-nm-thick aluminum film, and a 100-nm-thick titanium film is formed with a sputtering apparatus.

Figure 18C:
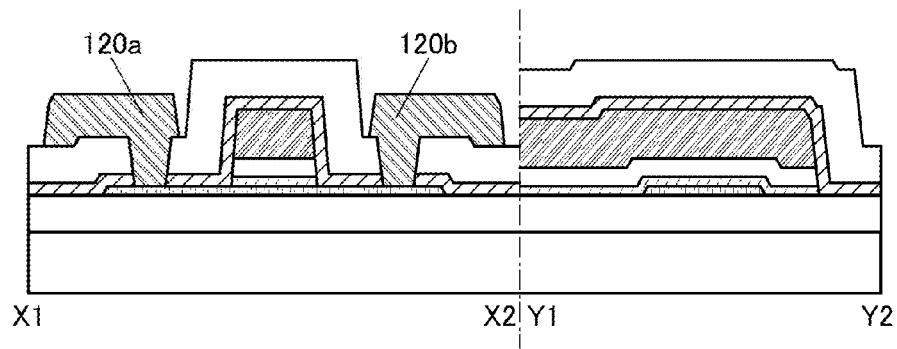

Subsequently, a mask is formed by a lithography process in a desired position over the conductive film 120, and then, the conductive film 120 is partly etched, so that the conductive films 120a and 120b are formed (see FIG. 18C).

As a method for processing the conductive film 120, a wet etching method and/or a dry etching method can be used as appropriate. In this embodiment, the conductive film 120 is processed into the conductive films 120a and 120b by a dry etching method.

Through the above steps, the transistor 100 in FIGS. 1A to 1C can be manufactured.

Note that a film or a layer included in the transistor 100 (e.g., an insulating film, an oxide semiconductor film, or a conductive film) can be formed by a sputtering method, a chemical vapor deposition (CVD) method, a vacuum evaporation method, a pulsed laser deposition (PLD) method, or an atomic layer deposition (ALD) method. Alternatively, a coating method or a printing method can be used. Although a sputtering method and a plasma-enhanced chemical vapor deposition (PECVD) method are typical deposition methods, a thermal CVD method may also be used. As an example of a thermal CVD method, a metal organic chemical vapor deposition (MOCVD) method can be given.

Deposition by a thermal CVD method is performed in the following manner: a source gas and an oxidizer are supplied at a time to a chamber in which the pressure is set to an atmospheric pressure or a reduced pressure, and the source gas and the oxidizer react with each other in the vicinity of the substrate or over the substrate. As seen above, no plasma is generated during deposition by a thermal CVD method, which has an advantage in that no defect due to plasma damage is formed.

Deposition by an ALD method is performed in the following manner: a source gas for reaction is introduced into a chamber in which the pressure is set to an atmospheric pressure or a reduced pressure, and reaction is caused; then, this sequence is repeated. An inert gas (e.g., argon or nitrogen) may be introduced as a carrier gas together with the source gas. For example, two or more kinds of source gases may be sequentially supplied to the chamber. In this case, an inert gas is introduced between reaction of a first source gas and introduction of a second source gas to prevent the source gases from being mixed. Alternatively, the first source gas may be exhausted by vacuum evacuation instead of the introduction of the inert gas, and then, the second source gas may be introduced. The first source gas is adsorbed on the surface of the substrate and reaction is caused to form a first layer, and then, the second source gas is introduced and adsorption and reaction are caused to form a second layer over the first layer; in this manner, a thin film is formed. The sequence of the gas introduction is controlled and repeated plural times until a desired thickness is obtained, whereby a thin film with excellent step coverage can be formed. The thickness of the thin film can be precisely adjusted by the number of times the gas introduction is repeated; therefore, an ALD method is suitable for manufacturing a minute FET.

Films such as the conductive film, the insulating film, and the oxide semiconductor film can be formed by a thermal CVD method such as an MOCVD method. For example, in the case where an In—Ga—Zn—O film is deposited, trimethylindium (In(CH$_3$)$_3$), trimethylgallium (Ga(CH$_3$)$_3$), and dimethylzinc (Zn(CH$_3$)$_2$) are used. Without being limited to the above combination, triethylgallium (Ga(C$_2$H$_5$)$_3$) can be used instead of trimethylgallium, and diethylzinc (Zn(C$_2$H$_5$)$_2$) can be used instead of dimethylzinc.

For example, in the case where a hafnium oxide film is formed with a deposition apparatus employing an ALD method, two kinds of gases are used, namely, ozone (O$_3$) as an oxidizer and a source gas which is obtained by vaporizing liquid containing a solvent and a hafnium precursor (hafnium alkoxide or hafnium amide such as tetrakis(dimethyl-amide)hafnium (TDMAH, Hf[N(CH$_3$)$_2$]$_4$) or tetrakis(ethylmethylamide)hafnium).

For example, in the case where an aluminum oxide film is formed with a deposition apparatus employing an ALD method, two kinds of gases are used, namely, H$_2$O as an oxidizer and a source gas which is obtained by vaporizing liquid containing a solvent and an aluminum precursor (e.g., trimethylaluminum (TMA, Al(CH$_3$)$_3$)). Examples of another material include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing an ALD method, hexachlorodisilane is adsorbed on a surface on which a film is to be deposited, and radicals of an oxidizing gas (O$_2$ or dinitrogen monoxide) are supplied to react with the adsorbate.

For example, in the case where a tungsten film is formed with a deposition apparatus employing an ALD method, a WF$_6$ gas and a B$_2$H$_6$ gas are sequentially introduced to form an initial tungsten film, and then, a WF$_6$ gas and an H$_2$ gas are used to form a tungsten film. Note that an SiH$_4$ gas may be used instead of a B$_2$H$_6$ gas.

For example, in the case where an oxide semiconductor film such as an In—Ga—Zn—O film is formed with a deposition apparatus employing an ALD method, an In(CH$_3$)$_3$ gas and an O$_3$ gas are used to form an In—O layer, a Ga(CH$_3$)$_3$ gas and an O$_3$ gas are used to form a Ga—O layer, and then, a Zn(CH$_3$)$_2$ gas and an O$_3$ gas are used to form a Zn—O layer. Note that the order of these layers is not limited to this example. A mixed compound layer such as an In—Ga—O layer, an In—Zn—O layer, or a Ga—Zn—O layer may be formed using these gases. Although an H$_2$O gas which is obtained by bubbling water with an inert gas such as Ar may be used instead of an O$_3$ gas, it is preferable to use an O$_3$ gas, which does not contain H.

<1-12. Method 2 for Manufacturing Semiconductor Device>

Next, an example of a method for manufacturing the transistor 160B in FIGS. 13A and 13B will be described with reference to FIGS. 19A to 19D, FIGS. 20A to 20D, FIGS. 21A to 21C, and FIGS. 22A to 22C. Note that FIGS. 19A to 19D, FIGS. 20A to 20D, FIGS. 21A to 21C, and FIGS. 22A to 22C are cross-sectional views in the channel length (L) direction and the channel width (W) direction and illustrate a method for manufacturing the transistor 160B.

First, the conductive film 106 is formed over the substrate 102. Then, the insulating film 104 is formed over the substrate 102 and the conductive film 106, and an oxide semiconductor film is formed over the insulating film 104. After that, the oxide semiconductor film is processed into an island shape, whereby the layer 108_2 is formed (see FIG. 19A).

The conductive film 106 can be formed using a material and a method similar to those of the oxide semiconductor film 112 or the conductive films 120a and 120b. In this embodiment, as the conductive film 106, a 100-nm-thick tungsten film is formed by a sputtering method.

Note that the transistor 160C described above can be formed in the following manner: an oxide semiconductor film having a stacked-layer structure is formed in the step of forming the layer 108_2 and is processed into an island shape to form the layer 108_1 and the layer 108_2.

Figure 19A:
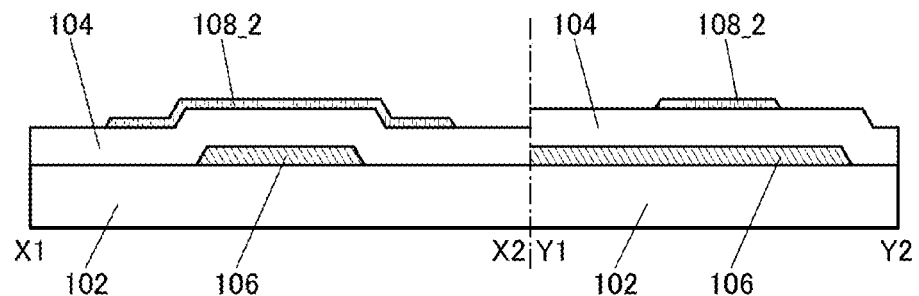
FIGS. 19A to 19D are cross-sectional views illustrating a method for manufacturing a semiconductor device.
Figure 19B:
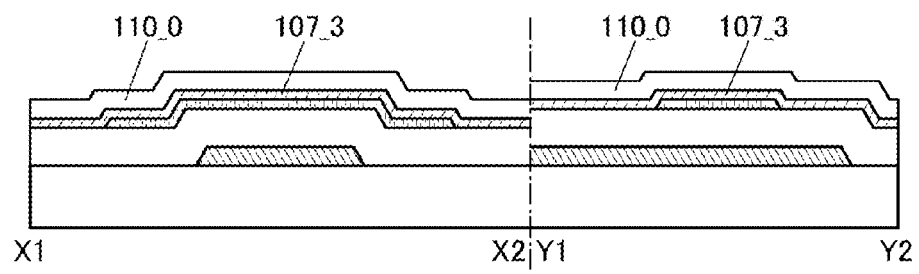

Next, the oxide semiconductor film 107_3 and the insulating film 110_0 are formed over the insulating film 104 and the layer 108_2 (see FIG. 19B).

The oxide semiconductor film 107_3 is formed to cover side surfaces of the layer 108_2. Note that the oxide semiconductor film 107_3 can be formed using a material and a method similar to those of the layer 108_2 described above.

In this embodiment, as the oxide semiconductor film 107_3, a 15-nm-thick oxide semiconductor film is deposited with a sputtering apparatus using an In—Ga—Zn metal oxide (In:Ga:Zn=1:1:1.2 [atomic ratio]) as a sputtering target.

Figure 19C:
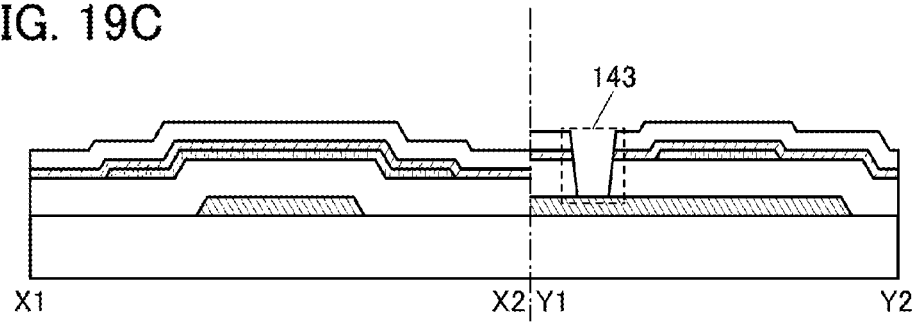

Subsequently, a mask is formed by a lithography process in a desired position over the insulating film 110_0, and then, the insulating film 110_0, the oxide semiconductor film 107_3, and the insulating film 104 are partly etched, so that the opening 143 reaching the conductive film 106 is formed (see FIG. 19C).

As a method for forming the opening 143, a wet etching method and/or a dry etching method can be used as appropriate. In this embodiment, the opening 143 is formed by a dry etching method.

Next, the oxide semiconductor film 112_0 is formed over the insulating film 110_0 to cover the opening 143. In the formation of the oxide semiconductor film 112_0, oxygen is added from the oxide semiconductor film 112_0 to the insulating film 110_0 (see FIG. 19D).

Figure 19D:
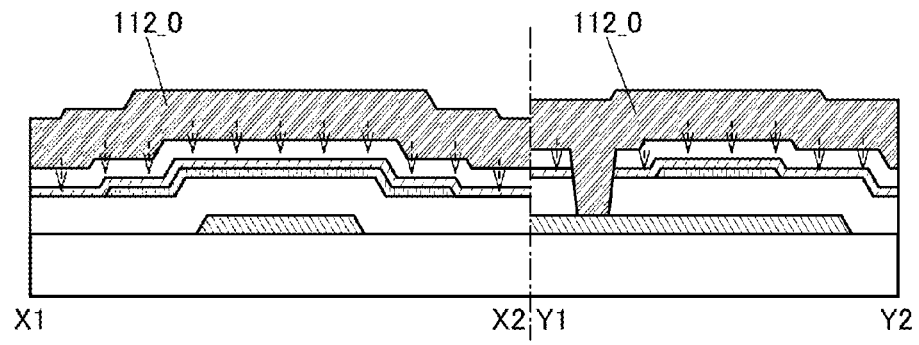

In FIG. 19D, oxygen added to the insulating film 110_0 is schematically shown by arrows. Furthermore, the oxide semiconductor film 112_0 formed to cover the opening 143 is electrically connected to the conductive film 106.

Figure 20A:
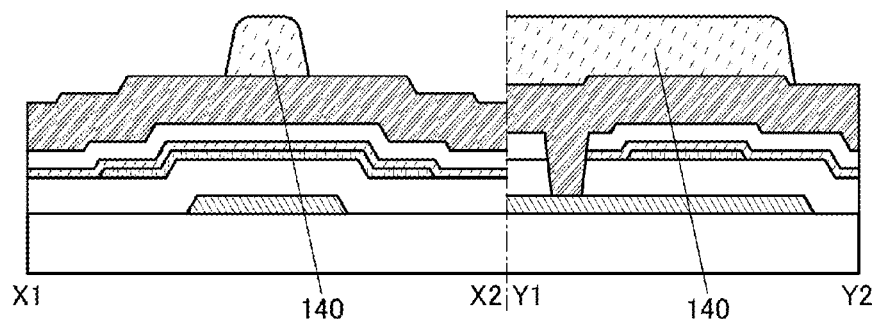
FIGS. 20A to 20D are cross-sectional views illustrating a method for manufacturing a semiconductor device.

Subsequently, the mask 140 is formed by a lithography process in a desired position over the oxide semiconductor film 112_0 (see FIG. 20A).

Figure 20B:
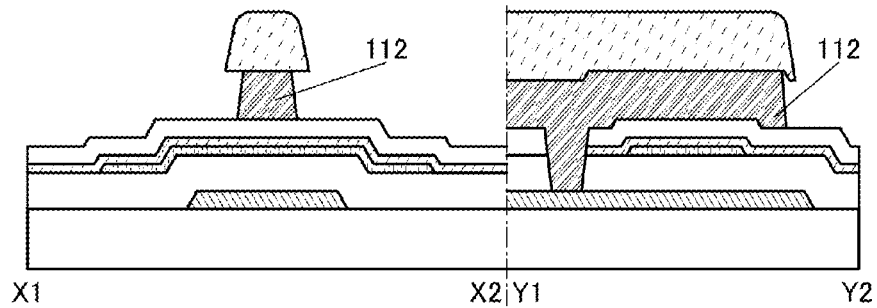

Then, the oxide semiconductor film 112_0 is processed into the island-shaped oxide semiconductor film 112 by etching from above the mask 140 (see FIG. 20B).

In this embodiment, the oxide semiconductor film 112_0 is processed by a wet etching method.

Figure 20C:
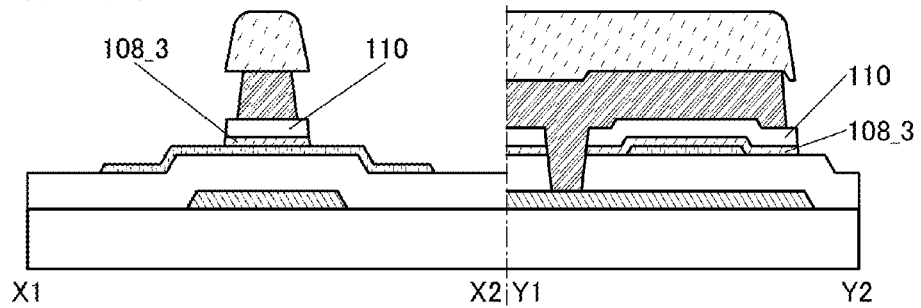

In succession to the above step, the insulating film 110_0 and the oxide semiconductor film 107_3 are processed into the island-shaped insulating film 110 and the island-shaped layer 108_3 by etching from above the mask 140 (see FIG. 20C).

Note that a surface of the layer 108_2 is partly exposed when the layer 108_3 is formed. The exposed regions of the layer 108_2 serve as the source region 108s and the drain region 108d later.

In this embodiment, the oxide semiconductor film 112_0, the insulating film 110_0, and the oxide semiconductor film 107_3 are processed by a dry etching method.

Figure 20D:
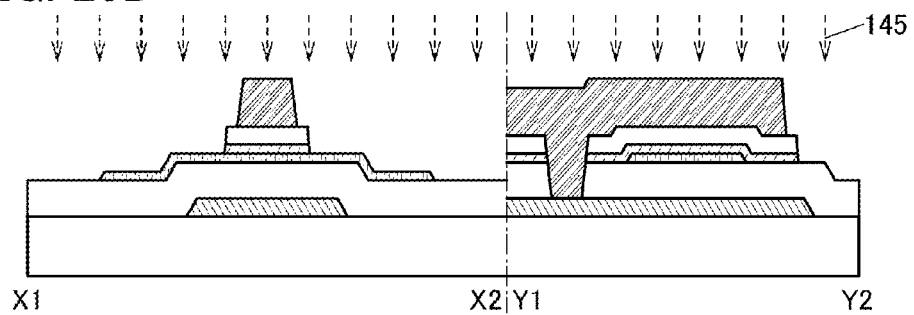

Next, the mask 140 is removed, and then, the impurity element 145 is added from above the insulating film 104, the layer 108_2, and the oxide semiconductor film 112 (see FIG. 20D).

In the addition of the impurity element 145, a large number of impurities are added to the exposed regions of the layer 108_2 (regions which serve as the source region 108s and the drain region 108d later). In contrast, since the impurity element 145 is added to regions of the layer 108_2 which do not overlap with the oxide semiconductor film 112 but overlap with the insulating film 110 and the layer 108_3 (regions which serve as the regions 108f later) through the insulating film 110 and the layer 108_3, the amount of the added impurity element 145 is smaller than that in the source region 108s and the drain region 108d.

In this embodiment, as the impurity element 145, argon is added to the layer 108_2 and the oxide semiconductor film 112 with the use of a doping apparatus. Note that one embodiment of the present invention is not limited thereto, and for example, the step of adding the impurity element 145 is not necessarily performed. In the case where the step of adding the impurity element 145 is not performed, the regions 108f have the same level of impurity concentration as the channel region 108i.

Next, the insulating film 116 is formed over the insulating film 104, the layer 108_2, the insulating film 110, and the oxide semiconductor film 112. As a result of the formation of the insulating film 116, regions of the layer 108_2 which are in contact with the insulating film 116 serve as the source region 108s and the drain region 108d. In addition, the layer 108_3 and regions of the layer 108_2 which are not in contact with the insulating film 116 serve as the channel region 108i. In this manner, the oxide semiconductor film 108 of one embodiment of the present invention is formed (see FIG. 21A).

Thus, the oxide semiconductor film 108 includes the channel region 108i overlapping with the oxide semiconductor film 112, the source region 108s in contact with the insulating film 116, and the drain region 108d in contact with the insulating film 116. The channel region 108i includes the layer 108_2 and the layer 108_3 which is in contact with a top surface of the layer 108_2 and covers side surfaces of the layer 108_2 in the channel width direction.

Note that the regions 108f are formed between the channel region 108i and the source region 108s and between the channel region 108i and the drain region 108d.

Figure 21A:
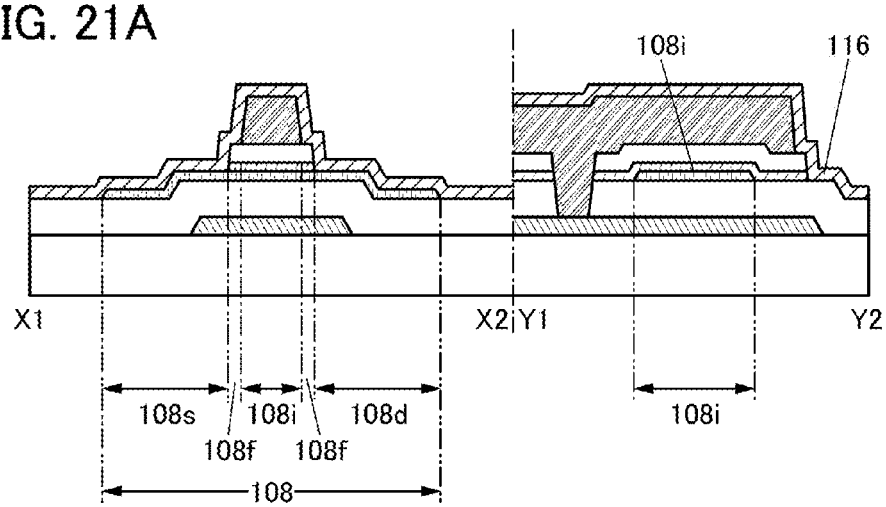
FIGS. 21A to 21C are cross-sectional views illustrating a method for manufacturing a semiconductor device.
Figure 21B:
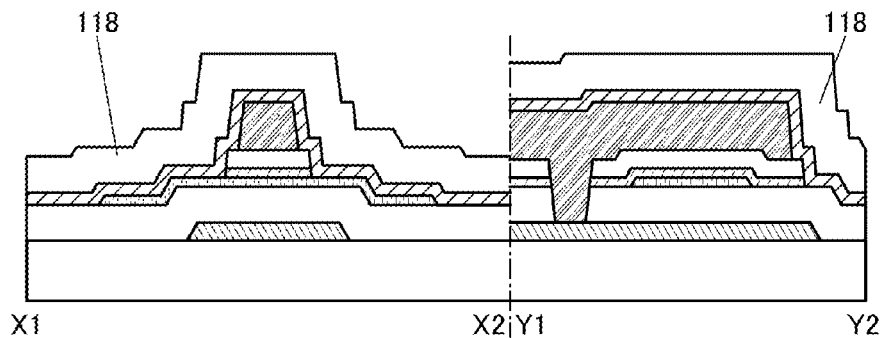

Next, the insulating film 118 is formed over the insulating film 116 (see FIG. 21B).

Figure 21C:
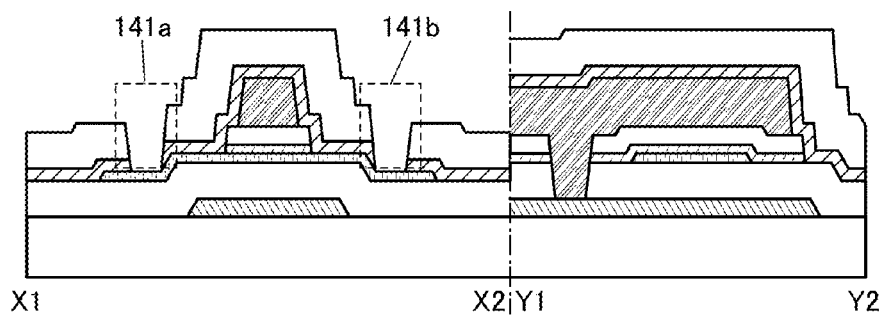

Subsequently, a mask is formed by a lithography process in a desired position over the insulating film 118, and then, the insulating film 118 and the insulating film 116 are partly etched, so that the opening 141a reaching the source region 108s and the opening 141b reaching the drain region 108d are formed (see FIG. 21C).

Figure 22A:
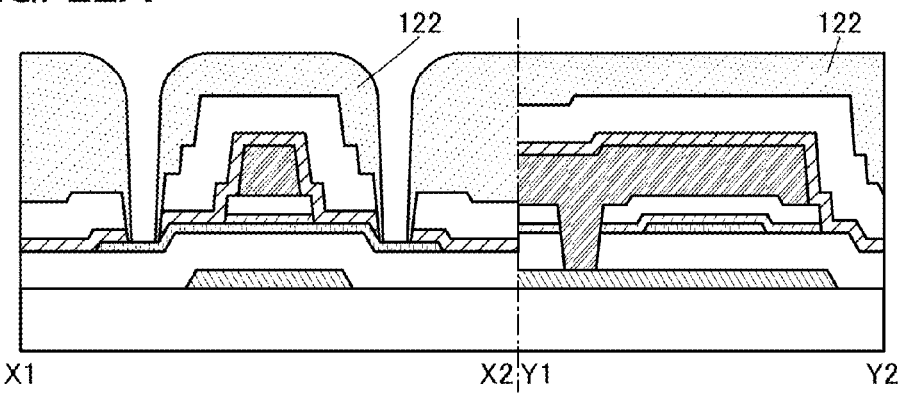
FIGS. 22A to 22C are cross-sectional views illustrating a method for manufacturing a semiconductor device.

Next, the insulating film 122 is formed over the insulating film 118 (see FIG. 22A).

Note that the insulating film 122 functions as a planarization insulating film. Furthermore, the insulating film 122 has openings in positions overlapping with the opening 141a and the opening 141b.

In this embodiment, the insulating film 122 having the openings is formed in the following manner: a photosensitive acrylic-based resin is applied with a spin coater, and then, desired regions of the acrylic-based resin are exposed to light.

Figure 22B:
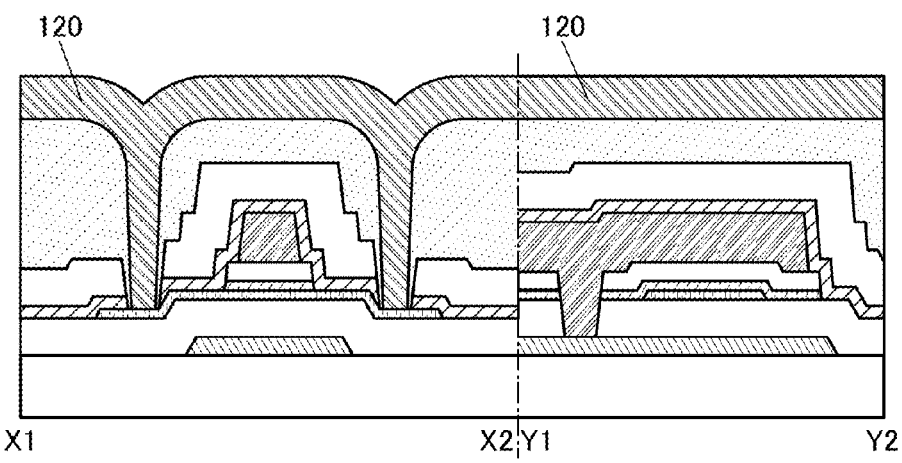

Next, the conductive film 120 is formed over the insulating film 122 to cover the openings 141a and 141b (see FIG. 22B).

Figure 22C:
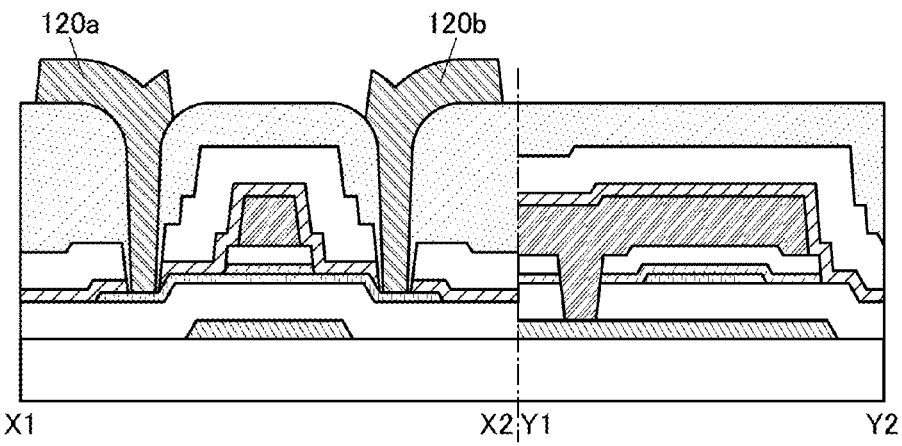

Subsequently, a mask is formed by a lithography process in a desired position over the conductive film 120, and then, the conductive film 120 is partly etched, so that the conductive films 120a and 120b are formed (see FIG. 22C).

In this embodiment, the conductive film 120 is processed by a dry etching method. In some cases, an upper portion of the insulating film 122 is partly removed when the conductive film 120 is processed.

Through the above steps, the transistor 160B in FIGS. 13A and 13B can be manufactured.

In the manufacture of the transistor 160B, the description in <1-11. Method 1 for Manufacturing Semiconductor Device> can be referred to for the insulating film 104, the layer 108_2, the layer 108_3, the insulating film 110_0, the oxide semiconductor film 112_0, the impurity element 145, the insulating film 116, the insulating film 118, the openings 141a and 141b, and the conductive film 120.

One embodiment of the present invention is not limited to the example described in this embodiment, in which the transistor includes an oxide semiconductor film. In one embodiment of the present invention, the transistor does not necessarily include an oxide semiconductor film. For example, a channel region, the vicinity of the channel region, a source region, or a drain region of the transistor may be formed using a material containing silicon (Si), germanium (Ge), silicon germanium (SiGe), gallium arsenide (GaAs), or the like.

The structures and the methods described in this embodiment can be combined as appropriate with any of the structures and the methods described in the other embodiments.

Embodiment 2

In this embodiment, the structure and the like of an oxide semiconductor will be described with reference to FIGS. 23A to 23E, FIGS. 24A to 24E, FIGS. 25A to 25D, FIGS. 26A and 26B, and FIG. 27.

<2-1. Structure of Oxide Semiconductor>

An oxide semiconductor is classified into a single-crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single-crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that includes a void. Because of its instability, an a-like OS has physical properties similar to those of an amorphous oxide semiconductor.

<2-2. CAAC-OS>

First, a CAAC-OS will be described.

A CAAC-OS is one of oxide semiconductors and has a plurality of c-axis aligned crystal parts (also referred to as pellets).

Figure 23A:
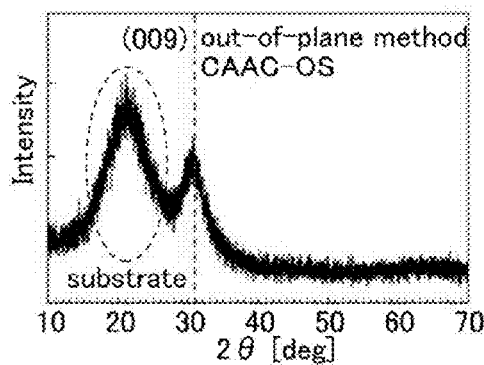
FIGS. 23A to 23E show results of structural analysis by XRD of a CAAC-OS and a single-crystal oxide semiconductor and selected-area electron diffraction patterns of a CAAC-OS.

Analysis of a CAAC-OS by X-ray diffraction (XRD) will be described. For example, when the structure of a CAAC-OS including an $InGaZnO_4$ crystal, which is classified into the space group R-3m, is analyzed by an out-of-plane method, a peak appears at a diffraction angle (2θ) of around 31° as shown in FIG. 23A. This peak is derived from the (009) plane of the $InGaZnO_4$ crystal, which indicates that crystals in the CAAC-OS have c-axis alignment and that the c-axes are aligned in the direction substantially perpendicular to a surface over which the CAAC-OS is formed (also referred to as a formation surface) or a top surface of the CAAC-OS. Note that a peak sometimes appears at 2θ of around 36° in addition to the peak at 2θ of around 31°. The peak at 2θ of around 36° is attributed to a crystal structure classified into the space group Fd-3m; thus, this peak is preferably not exhibited in the CAAC-OS.

Figure 23B:
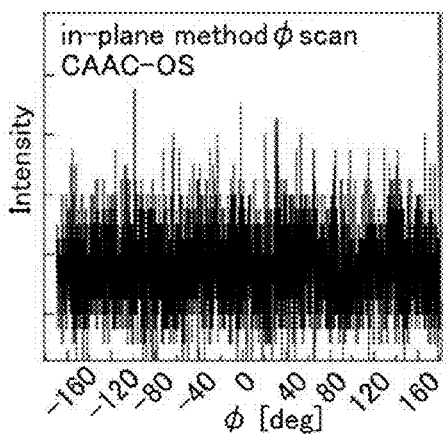
Figure 23C:
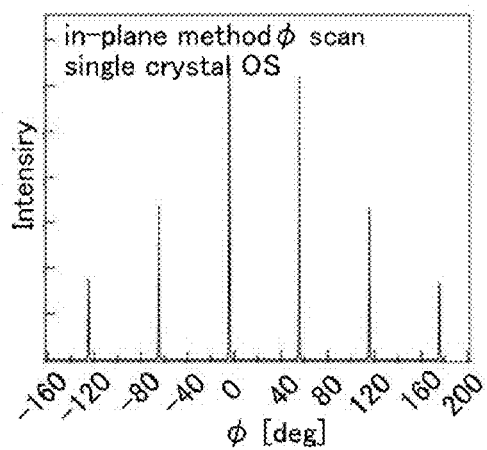
Figure 23D:
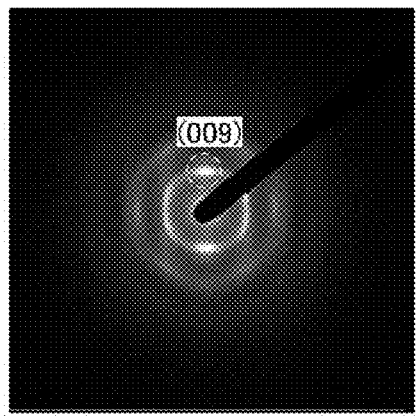

On the other hand, in structural analysis of the CAAC-OS by an in-plane method in which an X-ray is incident on the CAAC-OS in the direction parallel to the formation surface, a peak appears at 2θ of around 56°. This peak is derived from the (110) plane of the $InGaZnO_4$ crystal. When analysis (φ scan) is performed with 2θ fixed at around 56° while the sample is rotated around a normal vector to the sample surface as an axis (φ axis), as shown in FIG. 23B, a peak is not clearly observed. In contrast, in the case where single-crystal $InGaZnO_4$ is subjected to φ scan with 2θ fixed at around 56°, as shown in FIG. 23C, six peaks which are derived from crystal planes equivalent to the (110) plane are observed. Accordingly, the structural analysis using XRD shows that the directions of the a-axes and b-axes are irregularly oriented in the CAAC-OS.

Figure 23E:
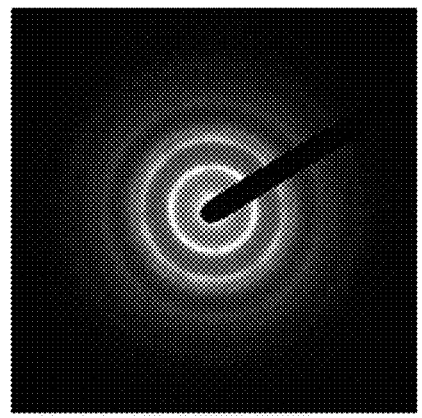

Next, a CAAC-OS analyzed by electron diffraction will be described. For example, when an electron beam with a probe diameter of 300 nm is incident on a CAAC-OS including an $InGaZnO_4$ crystal in the direction parallel to the formation surface of the CAAC-OS, a diffraction pattern (also referred to as a selected-area electron diffraction pattern) in FIG. 23D can be obtained. This diffraction pattern includes spots derived from the (009) plane of the $InGaZnO_4$ crystal. Thus, the results of electron diffraction also indicate that pellets included in the CAAC-OS have c-axis alignment and that the c-axes are aligned in the direction substantially perpendicular to the formation surface or the top surface of the CAAC-OS. Meanwhile, FIG. 23E shows a diffraction pattern obtained in such a manner that an electron beam with a probe diameter of 300 nm is incident on the same sample in the direction perpendicular to the sample surface. In FIG. 23E, a ring-like diffraction pattern is observed. Thus, the results of electron diffraction using an electron beam with a probe diameter of 300 nm also indicate that the a-axes and b-axes of the pellets included in the CAAC-OS do not have regular alignment. The first ring in FIG. 23E is probably derived from the (010) plane, the (100) plane, and the like of the $InGaZnO_4$ crystal. The second ring in FIG. 23E is probably derived from the (110) plane and the like.

In a combined analysis image (also referred to as a high-resolution transmission electron microscope (TEM) image) of a bright-field image and a diffraction pattern of a CAAC-OS, which is obtained using a TEM, a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 24A:
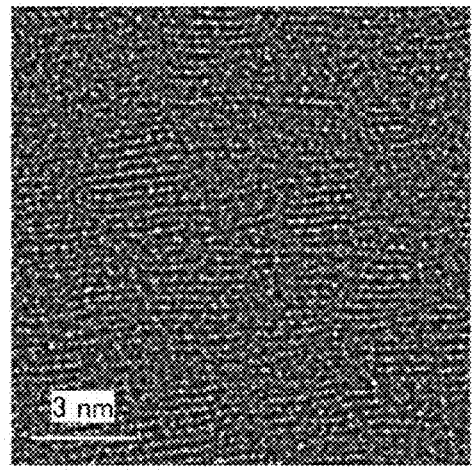
FIGS. 24A to 24E show a cross-sectional TEM image and plan-view TEM images of a CAAC-OS and images obtained through analysis thereof.

FIG. 24A shows a high-resolution TEM image of a cross section of the CAAC-OS which is observed in the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 24A shows pellets in which metal atoms are arranged in a layered manner. FIG. 24A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS and is parallel to the formation surface or the top surface of the CAAC-OS.

Figure 24B:
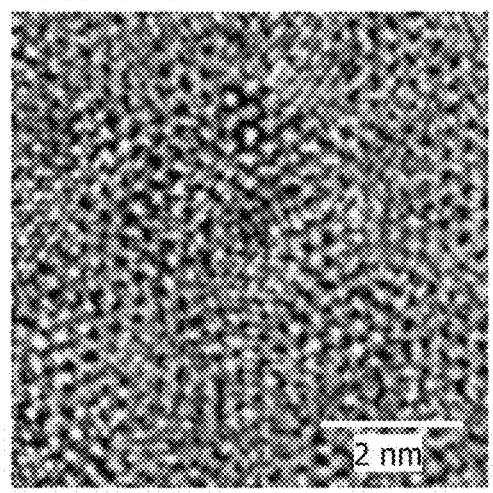
Figure 24C:
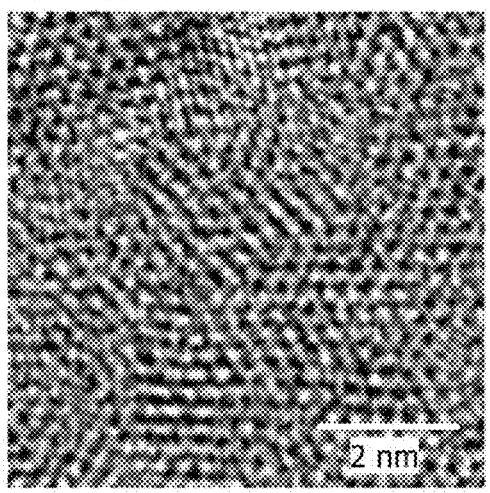
Figure 24D:
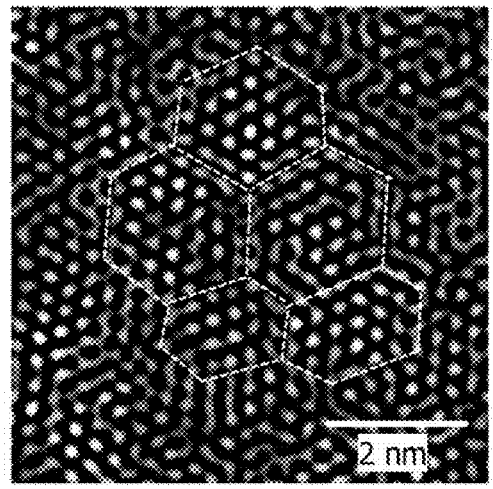
Figure 24E:
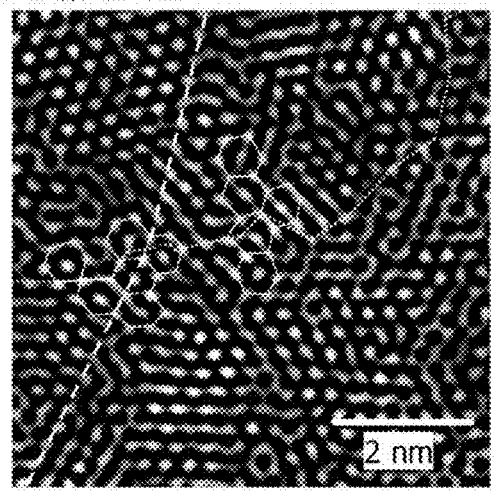

FIGS. 24B and 24C show Cs-corrected high-resolution TEM images of a plane of the CAAC-OS observed in the direction substantially perpendicular to the sample surface. FIGS. 24D and 24E are images obtained by image processing of FIGS. 24B and 24C. The method of image processing is as follows. The image in FIG. 24B is subjected to fast Fourier transform (FFT), so that an FFT image is obtained. Then, mask processing is performed on the obtained FFT image such that part in the range from 2.8 $nm^{-1}$ to 5.0 $nm^{-1}$ from the reference point is left. After the mask processing, the FFT image is subjected to inverse fast Fourier transform (IFFT), so that a processed image is obtained. The image obtained in this manner is referred to as an FFT filtering image. The FFT filtering image is a Cs-corrected high-resolution TEM image from which a periodic component is extracted and shows a lattice arrangement.

In FIG. 24D, a portion in which the lattice arrangement is broken is shown by dashed lines. A region surrounded by dashed lines corresponds to one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 24E, a dotted line is drawn between a region with a regular lattice arrangement and another region with a regular lattice arrangement. No clear crystal grain boundary can be observed even in the vicinity of the dotted line. When lattice points around a lattice point in the vicinity of the dotted line are joined, a distorted hexagon can be formed. That is, a lattice arrangement is distorted so that formation of a crystal grain boundary is inhibited. This is probably because the following features of the CAAC-OS can allow distortion: a low density of the atomic arrangement in the a-b plane direction, an interatomic bond distance changed by substitution of a metal element, and the like.

As described above, the CAAC-OS has c-axis alignment, its pellets (nanocrystals) are connected in the a-b plane direction, and its crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (e.g., silicon) having stronger bonding force to oxygen than a metal element contained in an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having few impurities and oxygen vacancies is an oxide semiconductor with a low carrier density (specifically, lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be regarded as an oxide semiconductor having stable characteristics.

<2-3. nc-OS>

Next, an nc-OS will be described.

Analysis of an nc-OS by XRD will be described. When the structure of an nc-OS is analyzed by an out-of-plane method, a peak indicating orientation does not appear. That is, a crystal of an nc-OS does not have orientation.

Figure 25A:
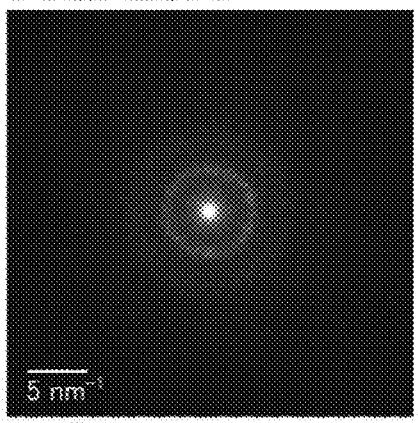
FIGS. 25A to 25D show electron diffraction patterns and a cross-sectional TEM image of an nc-OS.
Figure 25B:
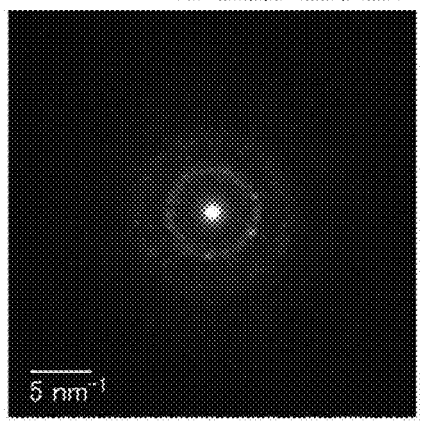

For example, when an electron beam with a probe diameter of 50 nm is incident on a 34-nm-thick region of a thinned nc-OS including an $InGaZnO_4$ crystal in the direction parallel to the formation surface, a ring-like diffraction pattern (nanobeam electron diffraction pattern) shown in FIG. 25A is observed. FIG. 25B shows a diffraction pattern (nanobeam electron diffraction pattern) obtained when an electron beam with a probe diameter of 1 nm is incident on the same sample. In FIG. 25B, a plurality of spots is observed in a ring-like region. Thus, ordering in an nc-OS is not observed with an electron beam with a probe diameter of 50 nm but is observed with an electron beam with a probe diameter of 1 nm.

Figure 25C:
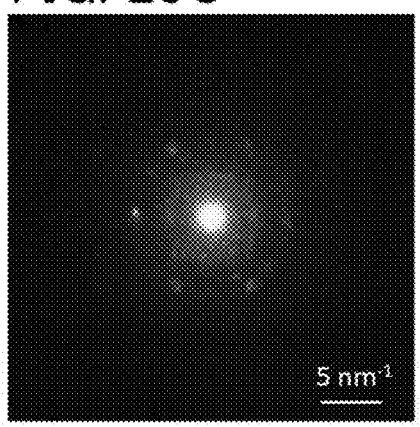

When an electron beam with a probe diameter of 1 nm is incident on a region with a thickness less than 10 nm, an electron diffraction pattern in which spots are arranged in an approximately hexagonal shape as shown in FIG. 25C is observed in some cases. This means that an nc-OS has a well-ordered region, that is, a crystal, in the thickness range of less than 10 nm. Note that an electron diffraction pattern having regularity is not observed in some regions because crystals are aligned in various directions.

Figure 25D:
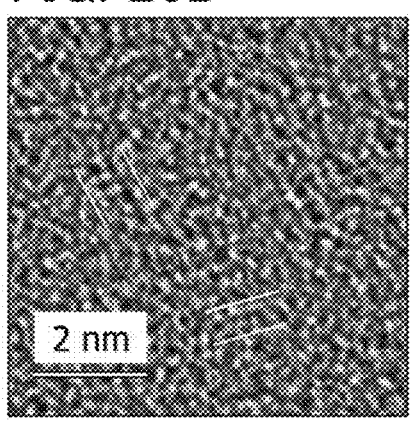

FIG. 25D shows a Cs-corrected high-resolution TEM image of a cross section of an nc-OS observed in the direction substantially parallel to the formation surface. In the high-resolution TEM image, the nc-OS has a region in which a crystal part is observed as indicated by additional lines and a region in which a crystal part is not clearly observed. In most cases, the size of a crystal part included in the nc-OS is greater than or equal to 1 nm and less than or equal to 10 nm, specifically greater than or equal to 1 nm and less than or equal to 3 nm. Note that an oxide semiconductor including a crystal part whose size is greater than 10 nm and less than or equal to 100 nm may be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

<2-4. a-Like OS>

An a-like OS has a structure between the structure of an nc-OS and the structure of an amorphous oxide semiconductor.

Figure 26A:
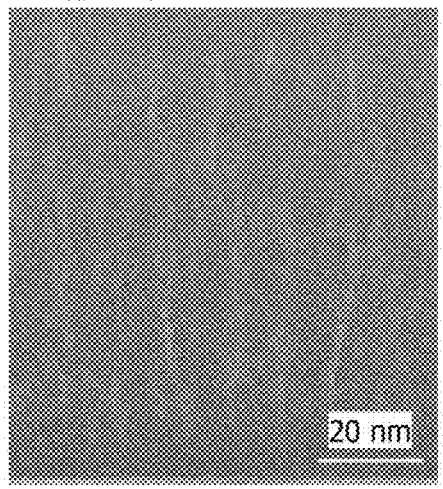
FIGS. 26A and 26B show cross-sectional TEM images of an a-like OS.
Figure 26B:
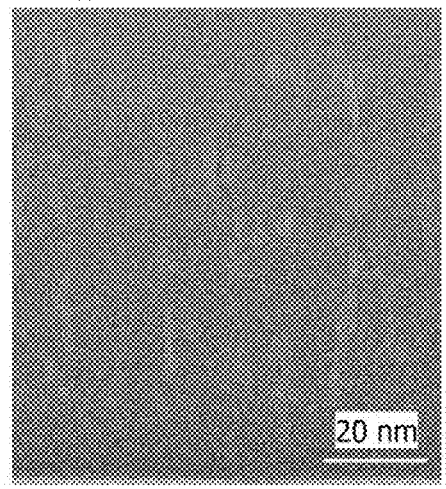

FIGS. 26A and 26B show high-resolution cross-sectional TEM images of an a-like OS. The high-resolution cross-sectional TEM image of the a-like OS in FIG. 26A is taken at the start of the electron irradiation. The high-resolution cross-sectional TEM image of the a-like OS in FIG. 26B is taken after the irradiation with electrons (e$^-$) at $4.3 \times 10^8$ e$^-$/nm$^2$. FIGS. 26A and 26B show that striped bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it includes a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion in which the spacing between lattice fringes is greater than or equal to 0.28 nm and less than or equal to 0.30 nm is regarded as a crystal part of InGaZnO$_4$ in the following description. Each lattice fringe corresponds to the a-b plane of the InGaZnO$_4$ crystal.

Figure 27:
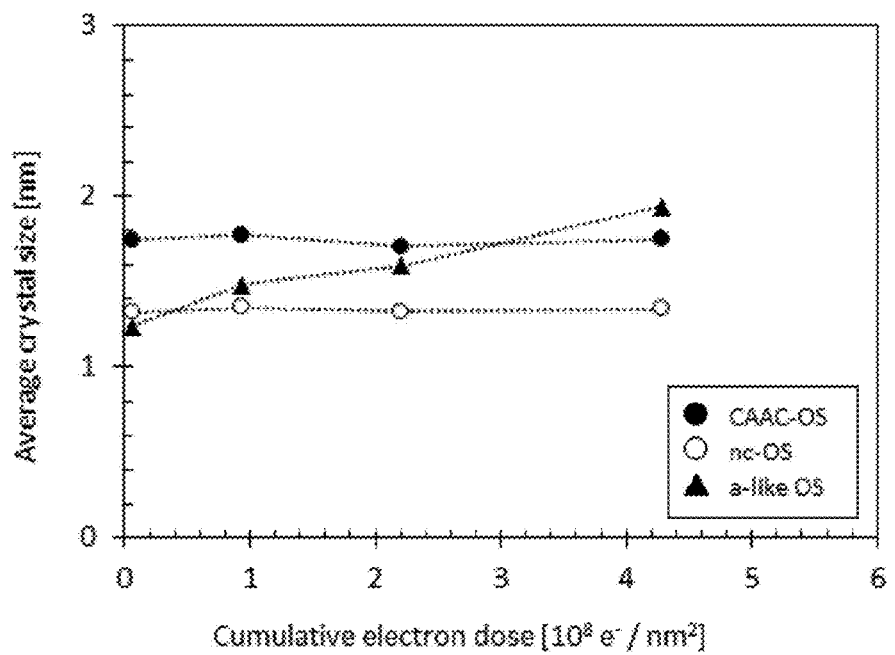
FIG. 27 shows a change in a crystal part of an In—Ga—Zn oxide induced by electron irradiation.

FIG. 27 shows a change in the average size of crystal parts (at 22 points to 30 points) in each sample. Note that the crystal part size corresponds to the length of a lattice fringe. FIG. 27 indicates that the crystal part size in the a-like OS increases with an increase in the cumulative electron dose in obtaining TEM images, for example. As shown in FIG. 27, a crystal part with a size of approximately 1.2 nm (also referred to as an initial nucleus) at the start of TEM observation grows to a size of approximately 1.9 nm at a cumulative electron (e$^-$) dose of $4.2 \times 10^8$ e$^-$/nm$^2$. In contrast, the crystal part sizes in the nc-OS and the CAAC-OS show few changes from the start of electron irradiation to a cumulative electron dose of $4.2 \times 10^8$ e$^-$/nm$^2$. As shown in FIG. 27, the crystal part sizes in the nc-OS and the CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of the electron beam irradiation were as follows: the accelerating voltage was 300 kV; the current density was $6.7 \times 10^5$ e$^-$/(nm$^2$·s); and the diameter of an irradiation region was 230 nm.

In this manner, growth of the crystal part in the a-like OS may be induced by electron irradiation. In contrast, in the nc-OS and the CAAC-OS, growth of the crystal part is hardly induced by electron irradiation. That is, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single-crystal oxide semiconductor having the same composition. The density of the nc-OS and the density of the CAAC-OS are each higher than or equal to 92.3% and lower than 100% of the density of the single-crystal oxide semiconductor having the same composition. It is difficult to deposit an oxide semiconductor having a density lower than 78% of the density of the single-crystal oxide semiconductor.

For example, in the case of an oxide semiconductor having an atomic ratio of In:Ga:Zn=1:1:1, the density of single-crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$, for example. In the case of the oxide semiconductor having an atomic ratio of In:Ga:Zn=1:1:1, the density of the nc-OS and the density of the CAAC-OS are each higher than or equal to 5.9 g/cm$^3$ and lower than 6.3 g/cm$^3$, for example.

In the case where an oxide semiconductor having a certain composition does not exist in a single-crystal state, single-crystal oxide semiconductors with different compositions are combined at an adequate ratio, which makes it possible to calculate a density equivalent to that of a single-crystal oxide semiconductor with the desired composition. The density of a single-crystal oxide semiconductor having the desired composition may be calculated using a weighted average with respect to the combination ratio of the single-crystal oxide semiconductors with different compositions. Note that it is preferable to use as few kinds of single-crystal oxide semiconductors as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

The structures described in this embodiment can be combined as appropriate with any of the structures described in the other embodiments.

Embodiment 3

In this embodiment, an example of a display device that includes the transistor described in the above embodiment will be described below with reference to FIG. 28, FIG. 29, and FIG. 30.

Figure 28:
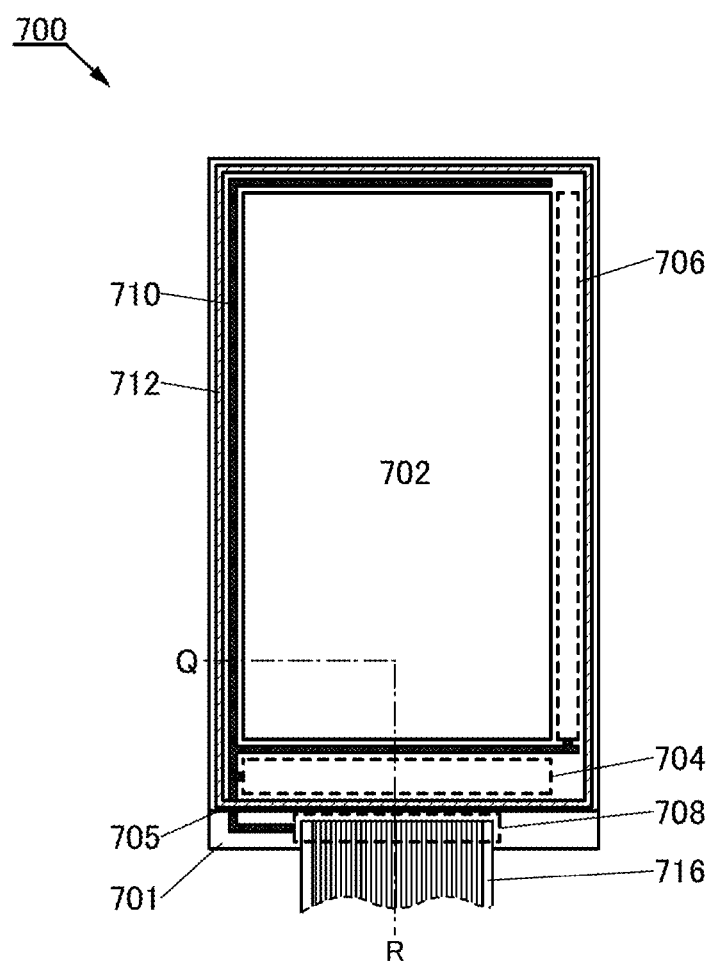
FIG. 28 shows a top view of one embodiment of a display device.

FIG. 28 is a top view illustrating an example of a display device. A display device 700 in FIG. 28 includes a pixel portion 702 provided over a first substrate 701, a source driver circuit portion 704 and a gate driver circuit portion 706 which are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 28, a display element is provided between the first substrate 701 and the second substrate 705.

In the display device 700, a flexible printed circuit (FPC) terminal portion 708 which is electrically connected to the pixel portion 702, the source driver circuit portion 704, and the gate driver circuit portion 706 is provided in a region different from the region which is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single-crystal semiconductor film or a polycrystalline semiconductor film) may be mounted on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are semiconductor devices of embodiments of the present invention can be used.

The display device 700 can include a variety of elements. As examples of the elements, electroluminescent (EL) element (e.g., an EL element containing organic and inorganic materials, an organic EL element, an inorganic EL element, or an LED), a light-emitting transistor (a transistor which emits light depending on current), an electron emitter, a liquid crystal element, an electronic ink display, an electrophoretic element, an electrowetting element, a plasma display panel (PDP), a micro electro mechanical system (MEMS) display (e.g., a grating light valve (GLV), a digital micromirror device (DMD), a digital micro shutter (DMS) element, or an interferometric modulator display (IMOD) element), and a piezoelectric ceramic display can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ between color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and approximately 20% to 30% of power consumption can be reduced in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

In this embodiment, a structure including a liquid crystal element as a display element and a structure including an EL element as a display element will be described with reference to FIG. 29 and FIG. 30. FIG. 29 is a cross-sectional view taken along dashed-dotted line Q-R in FIG. 28 and illustrates the structure including a liquid crystal element as a display element. FIG. 30 is a cross-sectional view taken along dashed-dotted line Q-R in FIG. 28 and illustrates the structure including an EL element as a display element.

Portions common to FIG. 29 and FIG. 30 will be described first, and then, different portions will be described.

<3-1. Portions Common to Display Devices>

Figure 29:
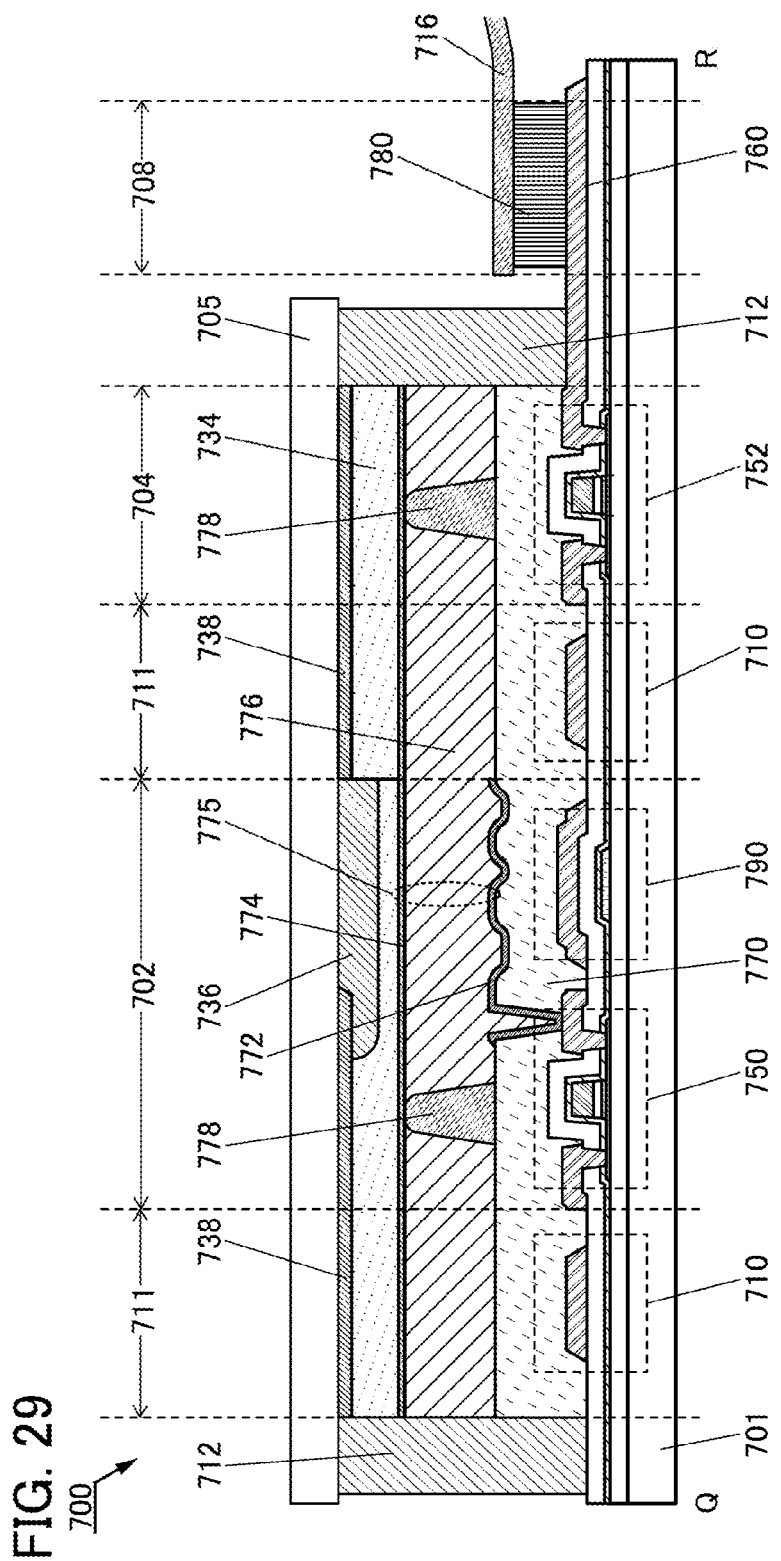
FIG. 29 shows a cross-sectional view of one embodiment of a display device.
Figure 30:
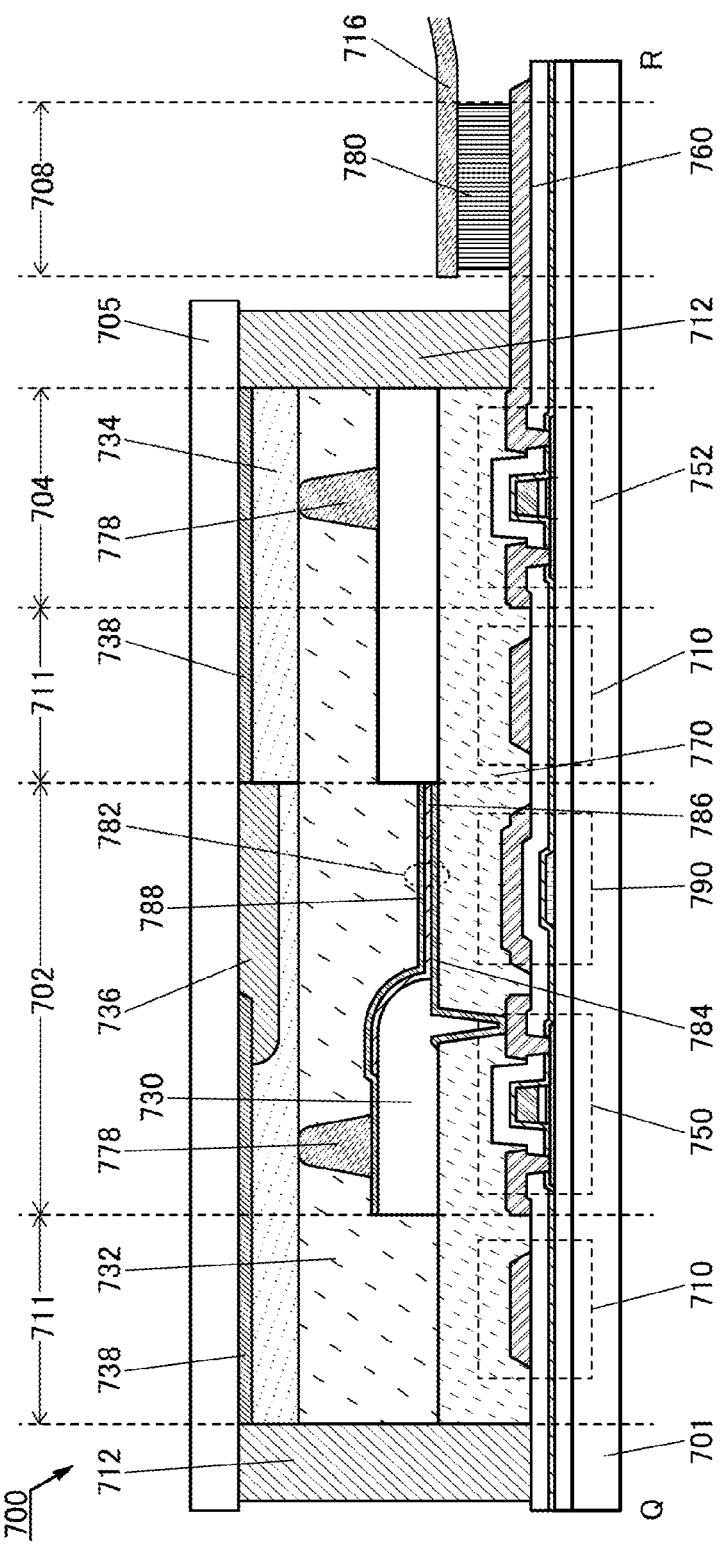
FIG. 30 shows a cross-sectional view of one embodiment of a display device.

The display device 700 in each of FIG. 29 and FIG. 30 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100 described above. Note that the transistor 750 and the transistor 752 may each have the structure of any of the other transistors described in the above embodiments.

The transistor used in this embodiment includes an oxide semiconductor film which is highly purified and in which formation of an oxygen vacancy is suppressed. The transistor can have low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device which includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, the transistor capable of high-speed operation can also be used in the pixel portion, whereby a high-quality image can be provided.

The capacitor 790 includes a lower electrode and an upper electrode. The lower electrode is formed by processing an oxide semiconductor film formed through the same process as a first oxide semiconductor film of the transistor 750. The upper electrode is formed by processing a conductive film formed through the same process as conductive films functioning as a source electrode and a drain electrode of the transistor 750. Furthermore, insulating films functioning as a second insulating film and a third insulating film of the transistor 750 are provided between the lower electrode and the upper electrode. That is, the capacitor 790 has a stacked-layer structure in which the insulating films functioning as a dielectric are positioned between the pair of electrodes.

In FIG. 29 and FIG. 30, a planarization insulating film 770 is provided over the transistor 750, the transistor 752, and the capacitor 790.

The planarization insulating film 770 can be formed using a heat-resistant organic material such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed using any of these materials. A structure without the planarization insulating film 770 may also be employed.

The signal line 710 is formed through the same process as the conductive films functioning as source electrodes and drain electrodes of the transistors 750 and 752. Note that the signal line 710 may be formed using a conductive film which is formed through a process different from the process of forming the source electrodes and the drain electrodes of the transistors 750 and 752. For example, an oxide semiconductor film formed through the same process as an oxide semiconductor film functioning as a gate electrode may be used. In the case where the signal line 710 is formed using a material containing copper, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<3-2. Structural Example of Display Device Including Liquid Crystal Element>

The display device 700 in FIG. 29 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 29 can display an image in such a manner that transmission or non-transmission of light is controlled by the alignment state in the liquid crystal layer 776 which is changed depending on the voltage applied between the conductive film 772 and the conductive film 774.

The conductive film 772 is connected to the conductive film functioning as a source electrode or a drain electrode of the transistor 750. The conductive film 772 is formed over the planarization insulating film 770 and functions as a pixel electrode, that is, one electrode of the display element. The conductive film 772 functions as a reflective electrode. The display device 700 in FIG. 29 is a reflective color liquid crystal display device which displays an image by utilizing external light that is reflected by the conductive film 772 and then extracted through the coloring film 736.

A conductive film that transmits visible light or a conductive film that reflects visible light can be used as the conductive film 772. For example, a material containing an element selected from indium (In), zinc (Zn), and tin (Sn) may be used for the conductive film that transmits visible light. For example, a material containing aluminum or silver may be used for the conductive film that reflects visible light. In this embodiment, a conductive film that reflects visible light is used as the conductive film 772.

Note that projections and depressions are provided in part of the planarization insulating film 770 in the pixel portion 702 of the display device 700 in FIG. 29. For example, the projections and depressions can be formed in the following manner: the planarization insulating film 770 is formed using a resin film, and projections and depressions are formed on the surface of the resin film. The conductive film 772 functioning as a reflective electrode is formed along the projections and depressions. Accordingly, external light that is incident on the conductive film 772 can be diffusely reflected by the surface of the conductive film 772, whereby visibility can be improved.

Note that the display device 700 is not limited to the example in FIG. 29, which illustrates a reflective color liquid crystal display device, and may be a transmissive color liquid crystal display device in which a conductive film that transmits visible light is used as the conductive film 772. In a transmissive color liquid crystal display device, projections and depressions are not necessarily provided on the planarization insulating film 770.

Although not illustrated in FIG. 29, alignment films may be provided on the conductive film 772 side in contact with the liquid crystal layer 776 and on the conductive film 774 side in contact with the liquid crystal layer 776. Although not illustrated in FIG. 29, an optical member (optical substrate) or the like, such as a polarizing member, a retardation member, or an anti-reflection member, may be provided as appropriate. For example, circular polarization may be obtained by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material which exhibits a blue phase has a small viewing angle dependence.

In the case where a liquid crystal element is used as a display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. Examples of a possible vertical alignment mode include a multi-domain vertical alignment (MVA) mode, a patterned vertical alignment (PVA) mode, and an ASV mode.

<3-3. Display Device Including Light-Emitting Element>

The display device 700 in FIG. 30 includes a light-emitting element 782. The light-emitting element 782 includes a conductive film 784, an EL layer 786, and a conductive film 788. The display device 700 in FIG. 30 can display an image by utilizing light emission from the EL layer 786 of the light-emitting element 782.

The conductive film 784 is connected to the conductive film functioning as a source electrode or a drain electrode of the transistor 750. The conductive film 784 is formed over the planarization insulating film 770 and functions as a pixel electrode, that is, one electrode of the display element. A conductive film that transmits visible light or a conductive film that reflects visible light can be used as the conductive film 784. For example, a material containing an element selected from indium (In), zinc (Zn), and tin (Sn) may be used for the conductive film that transmits visible light. For example, a material containing aluminum or silver may be used for the conductive film that reflects visible light.

In the display device 700 in FIG. 30, an insulating film 730 is provided over the planarization insulating film 770 and the conductive film 784. The insulating film 730 covers part of the conductive film 784. Note that the light-emitting element 782 has a top-emission structure. Therefore, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 784 side or a dual-emission structure in which light is emitted to both the conductive film 784 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 30, in which the coloring film 736 is provided. For example, a structure without the coloring film 736 may also be employed in the case where the EL layer 786 is formed by separate coloring.

The structures described in this embodiment can be combined as appropriate with any of the structures described in the other embodiments.

Embodiment 4

In this embodiment, an example of a circuit configuration of a semiconductor device which can hold stored data even when not powered and does not have a limitation on the number of write cycles will be described with reference to FIG. 31.

<4-1. Circuit Configuration>

Figure 31:
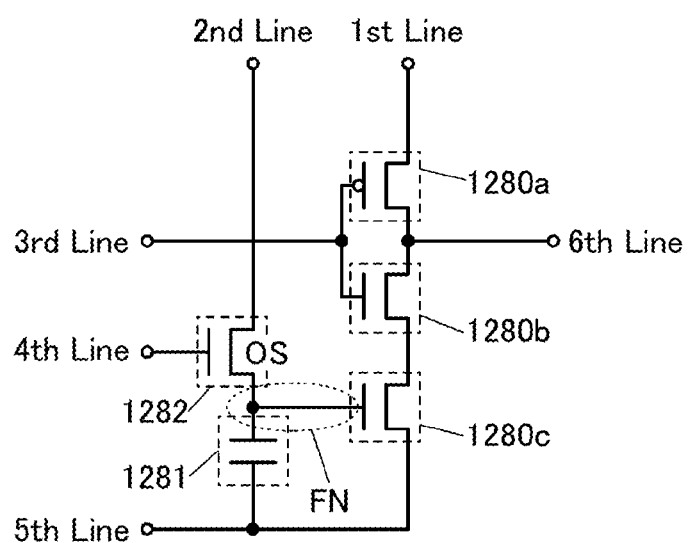
FIG. 31 illustrates a circuit configuration of a semiconductor device.

FIG. 31 illustrates a circuit configuration of a semiconductor device. In FIG. 31, a first wiring (1st Line) is electrically connected to one of a source electrode and a drain electrode of a p-channel transistor 1280a. The other of the source electrode and the drain electrode of the p-channel transistor 1280a is electrically connected to one of a source electrode and a drain electrode of an n-channel transistor 1280b. The other of the source electrode and the drain electrode of the n-channel transistor 1280b is electrically connected to one of a source electrode and a drain electrode of an n-channel transistor 1280c.

A second wiring (2nd Line) is electrically connected to one of a source electrode and a drain electrode of a transistor 1282. The other of the source electrode and the drain electrode of the transistor 1282 is electrically connected to one electrode of a capacitor 1281 and a gate electrode of the n-channel transistor 1280c.

A third wiring (3rd Line) is electrically connected to gate electrodes of the p-channel transistor 1280a and the n-channel transistor 1280b. A fourth wiring (4th Line) is electrically connected to a gate electrode of the transistor 1282. A fifth wiring (5th Line) is electrically connected to the other electrode of the capacitor 1281 and the other of the source electrode and the drain electrode of the n-channel transistor 1280c. A sixth wiring (6th Line) is electrically connected to the other of the source electrode and the drain electrode of the p-channel transistor 1280a and the one of the source electrode and the drain electrode of the n-channel transistor 1280b.

Note that the transistor 1282 can be formed using an oxide semiconductor (OS). Therefore, in FIG. 31, "OS" is written beside the transistor 1282. Note that the transistor 1282 may be formed using a material other than an oxide semiconductor.

In FIG. 31, "FN", which denotes a floating node, is written at a connection portion of the other of the source electrode and the drain electrode of the transistor 1282, the one electrode of the capacitor 1281, and the gate electrode of the n-channel transistor 1280c. When the transistor 1282 is turned off, a potential supplied to the floating node, the one electrode of the capacitor 1281, and the gate electrode of the n-channel transistor 1280c can be held.

The circuit configuration in FIG. 31 utilizes the advantage that the potential of the gate electrode of the n-channel transistor 1280c can be held, whereby writing, holding, and reading of data can be performed as described below.

<4-2. Writing and Holding of Data>

First, writing and holding of data will be described. The potential of the fourth wiring is set to a potential at which the transistor 1282 is turned on, so that the transistor 1282 is turned on. Accordingly, the potential of the second wiring is supplied to the gate electrode of the n-channel transistor 1280c and the capacitor 1281. That is, predetermined charge is applied to the gate electrode of the n-channel transistor 1280c (writing). After that, the potential of the fourth wiring is set to a potential at which the transistor 1282 is turned off, so that the transistor 1282 is turned off. Accordingly, charge applied to the gate electrode of the n-channel transistor 1280c is held (holding).

Since the off-state current of the transistor 1282 is extremely low, the charge in the gate electrode of the n-channel transistor 1280c is held for a long time.

<4-3. Data Reading>

Next, data reading will be described. When the potential of the third wiring is set to a low-level potential, the p-channel transistor 1280a is turned on and the n-channel transistor 1280b is turned off. In this case, the potential of the first wiring is supplied to the sixth wiring. On the other hand, when the potential of the third wiring is set to a high-level potential, the p-channel transistor 1280a is turned off and the n-channel transistor 1280b is turned on. In this case, the potential of the sixth wiring depends on the amount of charge held in the floating node (FN). Therefore, the stored data can be read out by measuring the potential of the sixth wiring (reading).

The transistor 1282, whose channel formation region is formed using an oxide semiconductor, has extremely low off-state current. The off-state current of the transistor 1282 including an oxide semiconductor is less than or equal to one hundred-thousandth of the off-state current of a transistor formed using a silicon semiconductor or the like; thus, loss of charge accumulated in the floating node (FN) due to leakage current of the transistor 1282 is negligible. That is, the transistor 1282 including an oxide semiconductor makes it possible to provide a nonvolatile memory circuit which can hold data even when not powered.

By using the semiconductor device having the above-described circuit configuration for a memory device such as a register or a cache memory, data in the memory device can be prevented from being lost owing to the stop of the supply of a power supply voltage. Furthermore, shortly after the supply of the power supply voltage is restarted, the memory device can return to the same state as before the power supply is stopped. Therefore, the power supply can be stopped even for a short time when the whole memory device or one or a plurality of logic circuits included in the memory device is in a standby state. Accordingly, power consumption can be suppressed.

The structures, the methods, and the like described in this embodiment can be combined as appropriate with any of the structures, the methods, and the like described in the other embodiments.

Embodiment 5

In this embodiment, a configuration of a pixel circuit that can be used for the semiconductor device of one embodiment of the present invention will be described below with reference to FIG. 32A.

<5-1. Configuration of Pixel Circuit>

Figure 32A:
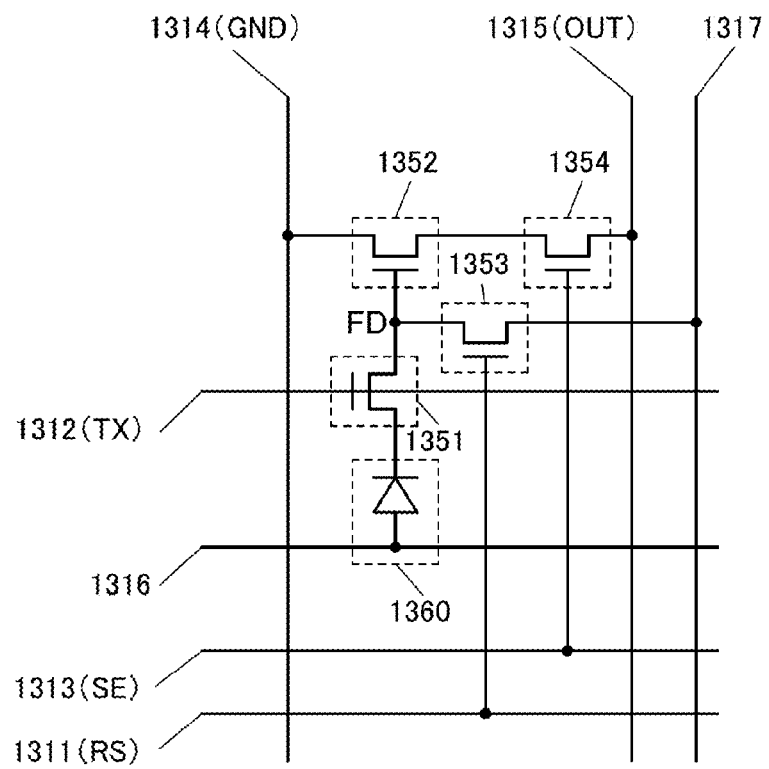
FIG. 32A illustrates a configuration of a pixel circuit.

FIG. 32A illustrates a configuration of a pixel circuit. The circuit in FIG. 32A includes a photoelectric conversion element 1360, a transistor 1351, a transistor 1352, a transistor 1353, and a transistor 1354.

An anode of the photoelectric conversion element 1360 is connected to a wiring 1316, and a cathode of the photoelectric conversion element 1360 is connected to one of a source electrode and a drain electrode of the transistor 1351. The other of the source electrode and the drain electrode of the transistor 1351 is connected to a charge accumulation portion (FD). A gate electrode of the transistor 1351 is connected to a wiring 1312 (TX). One of a source electrode and a drain electrode of the transistor 1352 is connected to a wiring 1314 (GND). The other of the source electrode and the drain electrode of the transistor 1352 is connected to one of a source electrode and a drain electrode of the transistor 1354. A gate electrode of the transistor 1352 is connected to the charge accumulation portion (FD). One of a source electrode and a drain electrode of the transistor 1353 is connected to the charge accumulation portion (FD). The other of the source electrode and the drain electrode of the transistor 1353 is connected to a wiring 1317. A gate electrode of the transistor 1353 is connected to a wiring 1311 (RS). The other of the source electrode and the drain electrode of the transistor 1354 is connected to a wiring 1315 (OUT). A gate electrode of the transistor 1354 is connected to a wiring 1313 (SE). Note that all the above connections are electrical connections.

A potential such as GND, VSS, or VDD may be supplied through the wiring 1314. Here, a potential or a voltage has a relative value. Therefore, the potential GND is not necessarily 0 V.

The photoelectric conversion element 1360 is a light-receiving element and has a function of generating current corresponding to the amount of light that enters the pixel circuit. The transistor 1353 has a function of controlling accumulation of charge in the charge accumulation portion (FD) by the photoelectric conversion element 1360. The transistor 1354 has a function of outputting a signal corresponding to the potential of the charge accumulation portion (FD). The transistor 1352 has a function of resetting the potential of the charge accumulation portion (FD). The transistor 1352 has a function of controlling selection of the pixel circuit at the time of reading.

Note that the charge accumulation portion (FD) is a charge retention node and retains charge that is changed depending on the amount of light received by the photoelectric conversion element 1360.

Note that the transistor 1352 and the transistor 1354 only need to be connected in series between the wiring 1314 and the wiring 1315. Therefore, the wiring 1314, the transistor 1352, the transistor 1354, and the wiring 1315 may be arranged in this order, or the wiring 1314, the transistor 1354, the transistor 1352, and the wiring 1315 may be arranged in this order.

The wiring 1311 (RS) functions as a signal line for controlling the transistor 1353. The wiring 1312 (TX) functions as a signal line for controlling the transistor 1351. The wiring 1313 (SE) functions as a signal line for controlling the transistor 1354. The wiring 1314 (GND) functions as a signal line for supplying a reference potential (e.g., GND). The wiring 1315 (OUT) functions as a signal line for reading a signal output from the transistor 1352. The wiring 1316 functions as a signal line for outputting charge from the charge accumulation portion (FD) through the photoelectric conversion element 1360 and is a low potential line in the circuit in FIG. 32A. The wiring 1317 functions as a signal line for resetting the potential of the charge accumulation portion (FD) and is a high potential line in the circuit in FIG. 32A.

Next, the structure of each component in FIG. 32A will be described.

<5-2. Photoelectric Conversion Element>

An element including selenium or a selenium-containing compound (hereinafter referred to as a selenium-based material) or an element including silicon (e.g., an element in which a pin junction is formed) can be used as the photoelectric conversion element 1360. The photoelectric conversion element including a selenium-based material is preferably used in combination with a transistor including an oxide semiconductor, in which case high reliability can be achieved.

<5-3. Transistor>

Although a silicon semiconductor such as amorphous silicon, microcrystalline silicon, polycrystalline silicon, or single-crystal silicon can be used to form the transistor 1351, the transistor 1352, the transistor 1353, and the transistor 1354, an oxide semiconductor is preferably used to form the transistors. A transistor whose channel formation region is formed using an oxide semiconductor has extremely low off-state current. For example, the transistor described in Embodiment 1 can be used as a transistor whose channel formation region is formed using an oxide semiconductor.

In particular, when the transistor 1351 and the transistor 1353 which are connected to the charge accumulation portion (FD) have high leakage current, charge accumulated in the charge accumulation portion (FD) cannot be held for a sufficient time. The use of an oxide semiconductor at least for the two transistors prevents unwanted leakage of charge from the charge accumulation portion (FD).

Unwanted leakage of charge to the wiring 1314 or the wiring 1315 also occurs when the transistor 1352 and the transistor 1354 have high leakage current; thus, a transistor whose channel formation region is formed using an oxide semiconductor is preferably used as each of these transistors.

One embodiment of the present invention is not limited to the example in FIG. 32A, in which the transistor includes one gate electrode. For example, the transistor may include a plurality of gate electrodes. The transistor including a plurality of gate electrodes may include, for example, a first gate electrode and a second gate electrode (also referred to as a backgate electrode) which overlap with a semiconductor film in which a channel formation region is formed. The backgate electrode may be supplied with the same potential as the first gate electrode, a floating potential, or a potential different from that supplied to the first gate electrode, for example.

<5-4. Timing Chart of Circuit Operation>

An example of the operation of the circuit in FIG. 32A will be described with reference to a timing chart in FIG. 32B.

Figure 32B:
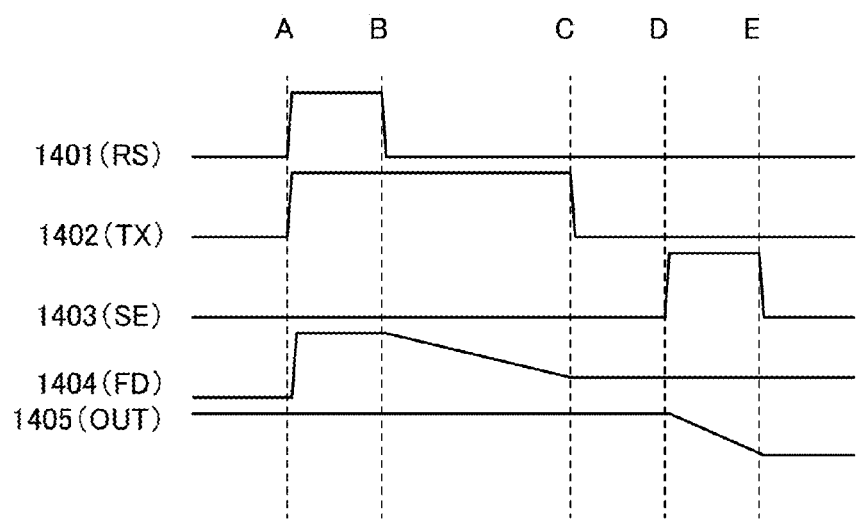
FIG. 32B shows a timing chart of the operation of the pixel circuit.

In FIG. 32B, the potential of each wiring is denoted by a signal which varies between two levels for simplicity. Note that each potential is an analog signal; therefore, in practice, the potential can have various levels depending on conditions without being limited to two levels. In FIG. 32B, a signal 1401 corresponds to the potential of the wiring 1311 (RS), a signal 1402 corresponds to the potential of the wiring 1312 (TX), a signal 1403 corresponds to the potential of the wiring 1313 (SE), a signal 1404 corresponds to the potential of the charge accumulation portion (FD), and a signal 1405 corresponds to the potential of the wiring 1315 (OUT). The potential of the wiring 1316 is always at a low level, and the potential of the wiring 1317 is always at a high level.

At time A, the potential of the wiring 1311 (signal 1401) and the potential of the wiring 1312 (signal 1402) are set to the high level, so that the potential of the charge accumulation portion (FD) (signal 1404) is initialized to the potential (high level) of the wiring 1317, and reset operation is started. Note that the potential of the wiring 1315 (signal 1405) is precharged to the high level.

At time B, the potential of the wiring 1311 (signal 1401) is set to the low level, so that the reset operation is terminated and accumulation operation is started. Here, a reverse bias is applied to the photoelectric conversion element 1360, so that the potential of the charge accumulation portion (FD) (signal 1404) starts to decrease owing to reverse current. Since irradiation of the photoelectric conversion element 1360 with light increases the reverse current, the rate of decrease in the potential of the charge accumulation portion (FD) (signal 1404) changes depending on the amount of irradiation light. In other words, the channel resistance between the source and the drain of the transistor 1354 changes depending on the amount of light delivered to the photoelectric conversion element 1360.

At time C, the potential of the wiring 1312 (signal 1402) is set to the low level to terminate the accumulation operation, so that the potential of the charge accumulation portion (FD) (signal 1404) becomes constant. Here, the potential is determined by the amount of charge generated by the photoelectric conversion element 1360 during the accumulation operation. That is, the potential changes depending on the amount of light delivered to the photoelectric conversion element 1360. Furthermore, since each of the transistors 1351 and 1353 is a transistor whose channel formation region is formed using an oxide semiconductor and which has extremely low off-state current, the potential of the charge accumulation portion (FD) can be kept constant until subsequent selection operation (read operation) is performed.

When the potential of the wiring 1312 (signal 1402) is set to the low level, the potential of the charge accumulation portion (FD) might change owing to parasitic capacitance between the wiring 1312 and the charge accumulation portion (FD). In the case where the potential change is significant, the amount of charge generated by the photoelectric conversion element 1360 during the accumulation operation cannot be obtained accurately. Examples of effective measures to reduce the potential change include reducing the capacitance between the gate electrode and the source electrode (or between the gate electrode and the drain electrode) of the transistor 1351, increasing the gate capacitance of the transistor 1352, and providing a storage capacitor in the charge accumulation portion (FD). In this embodiment, the potential change can be ignored by the adoption of these measures.

At time D, the potential of the wiring 1313 (signal 1403) is set to the high level to turn on the transistor 1354, so that the selection operation is started and the wiring 1314 and the wiring 1315 are electrically connected to each other through the transistor 1352 and the transistor 1354. Thus, the potential of the wiring 1315 (signal 1405) starts to decrease. Note that the precharge of the wiring 1315 is terminated before time D. Here, the rate at which the potential of the wiring 1315 (signal 1405) decreases depends on current between the source electrode and the drain electrode of the transistor 1352, that is, the amount of light delivered to the photoelectric conversion element 1360 during the accumulation operation.

At time E, the potential of the wiring 1313 (signal 1403) is set to the low level to turn off the transistor 1354, so that the selection operation is terminated and the potential of the wiring 1315 (signal 1405) becomes a constant value. Here, the constant value changes depending on the amount of light delivered to the photoelectric conversion element 1360. Therefore, the amount of light delivered to the photoelectric conversion element 1360 during the accumulation operation can be determined by measuring the potential of the wiring 1315.

Specifically, when the photoelectric conversion element 1360 is irradiated with intense light, the potential of the charge accumulation portion (FD), that is, the gate voltage of the transistor 1352 decreases. Therefore, the current flowing between the source electrode and the drain electrode of the transistor 1352 becomes low; as a result, the potential of the wiring 1315 (signal 1405) gradually decreases. Thus, a relatively high potential can be read out from the wiring 1315.

In contrast, when the photoelectric conversion element 1360 is irradiated with light with low intensity, the potential of the charge accumulation portion (FD), that is, the gate voltage of the transistor 1352 increases. Therefore, the current flowing between the source electrode and the drain electrode of the transistor 1352 becomes high; as a result, the potential of the wiring 1315 (signal 1405) rapidly decreases. Thus, a relatively low potential can be read out from the wiring 1315.

This embodiment can be implemented in an appropriate combination with any of the structures described in the other embodiments.

Embodiment 6

In this embodiment, a display device including the semiconductor device of one embodiment of the present invention will be described with reference to FIGS. 33A to 33C.

<6. Circuit Configuration of Display Device>

A display device illustrated in FIG. 33A includes a region including pixels (hereinafter referred to as a pixel portion 502), a circuit portion which is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to an input pulse signal such as a start pulse signal or a clock signal. Furthermore, the source driver 504b has a function of controlling the potentials of wirings supplied with data signals (hereinafter referred to as data lines DL_1 to DL_Y). Alternatively, the source driver 504b has a function of supplying an initialization signal. Without being limited thereto, another signal can be supplied from the source driver 504b.

The source driver 504b includes a plurality of analog switches, for example. The source driver 504b can output, as data signals, time-divided image signals obtained by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504a. For example, to the pixel circuit 501 in the m-th row and the n-th column (m is a natural number of X or less, and n is a natural number of Y or less), a pulse signal is input from the gate driver 504a through the scan line GL_m, and a data signal is input from the source driver 504b through the data line DL_n in accordance with the potential of the scan line GL_m.

Figure 33A:
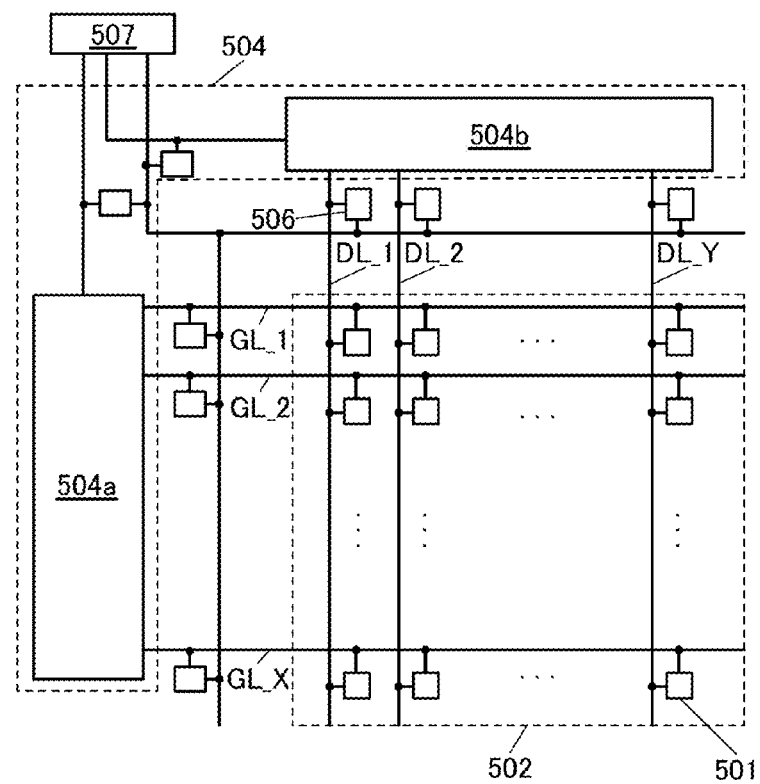
FIGS. 33A to 33C show a block diagram and circuit diagrams of a display device.

The protection circuit 506 in FIG. 33A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 33A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

One embodiment of the present invention is not limited to the example in FIG. 33A, in which the driver circuit portion 504 includes the gate driver 504a and the source driver 504b. For example, only the gate driver 504a may be formed, and a separately prepared substrate over which a source driver circuit is formed (e.g., a driver circuit board formed using a single-crystal semiconductor film or a polycrystalline semiconductor film) may be mounted.

Figure 33B:
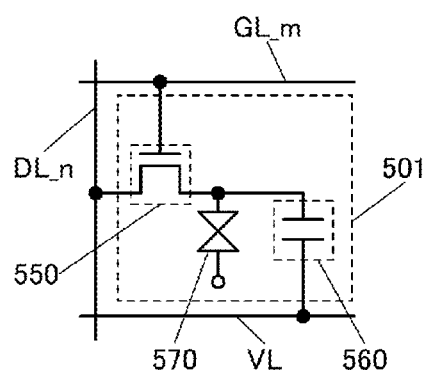

Each of the plurality of pixel circuits 501 in FIG. 33A can have the configuration illustrated in FIG. 33B, for example.

The pixel circuit 501 in FIG. 33B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 33B, the gate driver 504a in FIG. 33A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 33C:
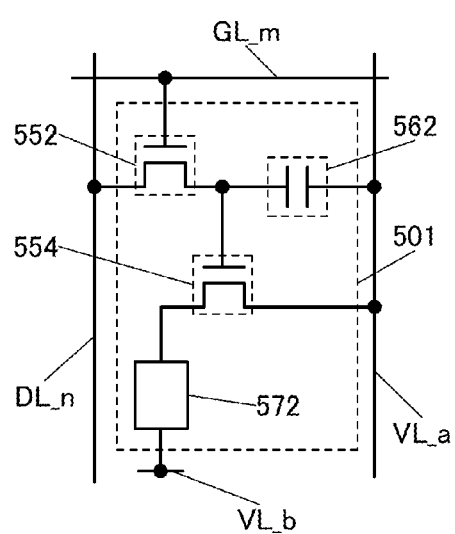

Alternatively, each of the plurality of pixel circuits 501 in FIG. 33A can have the configuration illustrated in FIG. 33C, for example.

The pixel circuit 501 in FIG. 33C includes transistors 552 and 554, a capacitor 562, and a light-emitting element 572. The transistor described in the above embodiment can be used as the transistor 552 and/or the transistor 554.

One of a source electrode and a drain electrode of the transistor 552 is electrically connected to a wiring through which a data signal is supplied (hereinafter referred to as a data line DL_n). A gate electrode of the transistor 552 is electrically connected to a wiring through which a gate signal is supplied (hereinafter referred to as a scan line GL_m).

The transistor 552 is configured to be turned on or off to control whether a data signal is written.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential VDD is supplied to one of the potential supply line VL_a and the potential supply line VL_b, and a low power supply potential VSS is supplied to the other of the potential supply line VL_a and the potential supply line VL_b.

In the display device including the pixel circuits 501 in FIG. 33C, the gate driver 504a in FIG. 33A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

The structures described in this embodiment can be combined as appropriate with any of the structures described in the other embodiments.

Embodiment 7

In this embodiment, a display module and electronic devices, each of which includes the semiconductor device of one embodiment of the present invention, will be described with reference to FIG. 34 and FIGS. 35A to 35G.

<7-1. Display Module>

Figure 34:
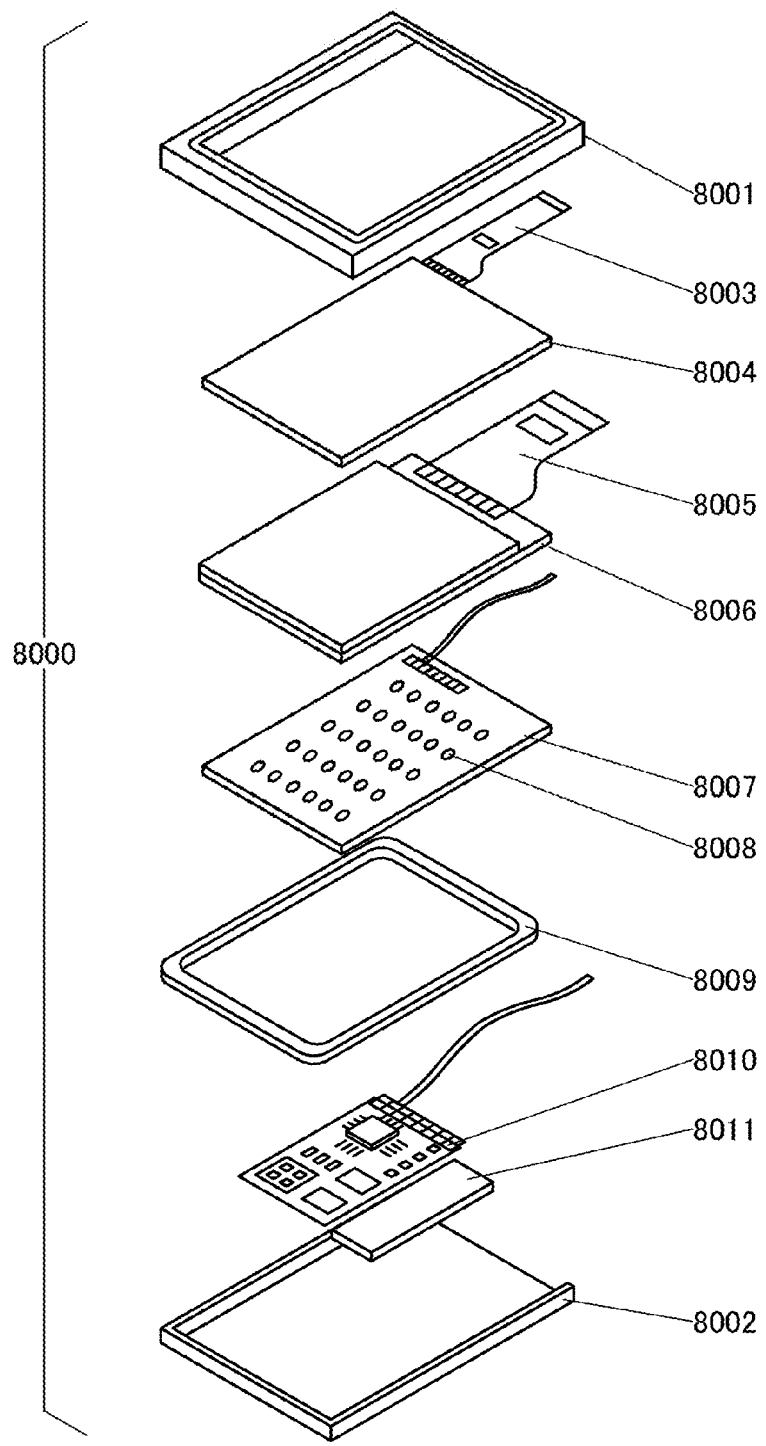
FIG. 34 illustrates a display module.

In a display module 8000 illustrated in FIG. 34, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for the display panel 8006, for example.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and overlap with the display panel 8006. Alternatively, a counter substrate (sealing substrate) of the display panel 8006 can have a touch panel function. Alternatively, a photosensor may be provided in each pixel of the display panel 8006 to form an optical touch panel.

The backlight 8007 includes a light source 8008. One embodiment of the present invention is not limited to the structure in FIG. 34, in which the light source 8008 is provided over the backlight 8007. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and functions as an electromagnetic shield for blocking electromagnetic waves generated by the operation of the printed board 8010. The frame 8009 may also function as a radiator plate.

The printed board 8010 includes a power supply circuit and a signal processing circuit for outputting a video signal and a clock signal. As a power source for supplying power to the power supply circuit, an external commercial power source or the separate battery 8011 may be used. The battery 8011 can be omitted in the case where a commercial power source is used.

The display module 8000 may be additionally provided with a member such as a polarizing plate, a retardation plate, or a prism sheet.

<7-2. Electronic Device>

FIGS. 35A to 35G illustrate electronic devices. These electronic devices can include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 35A to 35G can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Note that functions of the electronic devices in FIGS. 35A to 35G are not limited thereto, and the electronic devices can have a variety of functions. Although not illustrated in FIGS. 35A to 35G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 35A to 35G will be described in detail below.

Figure 35A:
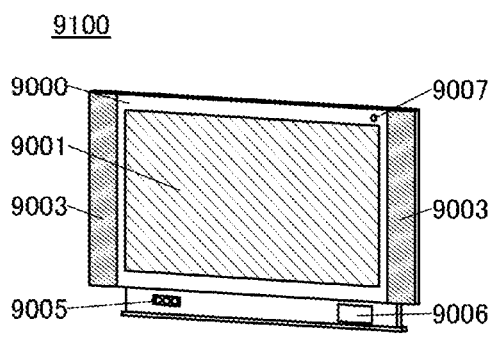
FIGS. 35A to 35G illustrate electronic devices.

FIG. 35A is a perspective view illustrating a television device 9100. The television device 9100 can include the display portion 9001 having a large screen size of, for example, 50 inches or more, or 100 inches or more.

Figure 35B:
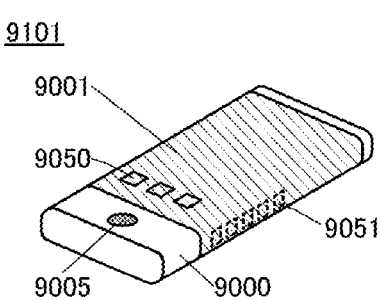

FIG. 35B is a perspective view of a portable information terminal 9101. The portable information terminal 9101 function as, for example, one or more of a telephone set, a notebook, and an information browsing system. Specifically, the portable information terminal 9101 can be used as a smartphone. Note that the portable information terminal 9101 may include a speaker, a connection terminal, a sensor, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 35C:
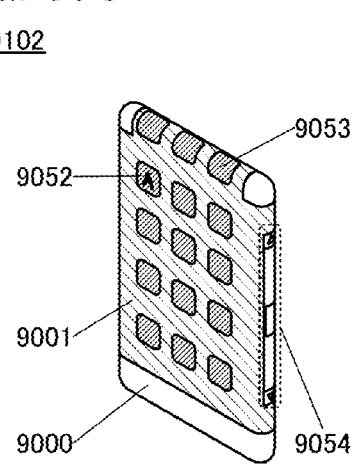

FIG. 35C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

Figure 35D:
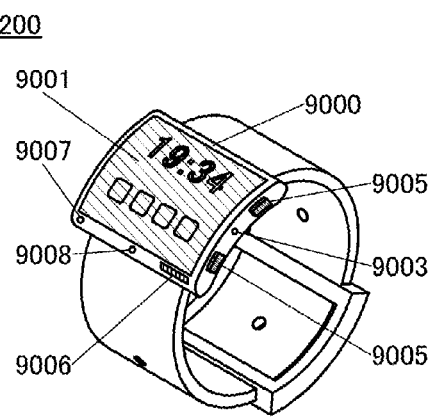

FIG. 35D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 35E:
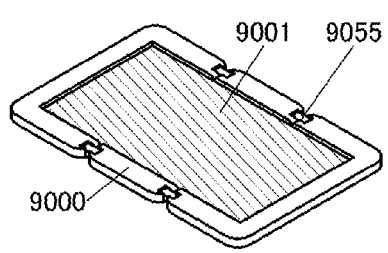
Figure 35F:
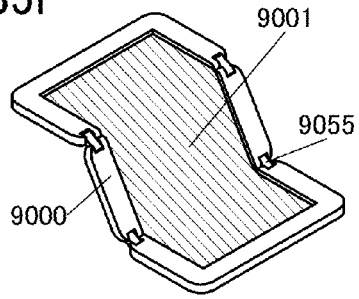
Figure 35G:
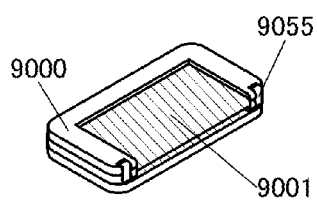

FIGS. 35E, 35F, and 35G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

Electronic devices described in this embodiment are characterized by having a display portion for displaying some sort of information. Note that the semiconductor device of one embodiment of the present invention can also be used for an electronic device that does not have a display portion.

The structures described in this embodiment can be combined as appropriate with any of the structures described in the other embodiments.

REFERENCE NUMERALS

100: transistor, 100A: transistor, 100B: transistor, 100C: transistor, 100D: transistor, 100E: transistor, 100F: transistor, 100G: transistor, 102: substrate, 104: insulating film, 106: conductive film, 107: oxide semiconductor film, 107_3: oxide semiconductor film, 108: oxide semiconductor film, 108_1: layer, 108_2: layer, 108_3: layer, 108d: drain region, 108f: region, 108i: channel region, 108s: source region, 110: insulating film, 110_0: insulating film, 112: oxide semiconductor film, 112_0: oxide semiconductor film, 114: conductive film, 116: insulating film, 118: insulating film, 120: conductive film, 120a: conductive film, 120b: conductive film, 122: insulating film, 140: mask, 141a: opening, 141b: opening, 143: opening, 145: impurity element, 147: hollow region, 150: transistor, 160: transistor, 160A: transistor, 160B: transistor, 160C: transistor, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 700: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 730: insulating film, 732: sealing film, 734: insulating film, 736: coloring film, 738: light-blocking film, 750: transistor, 752: transistor, 760: connection electrode, 770: planarization insulating film, 772: conductive film, 774: conductive film, 775: liquid crystal element, 776: liquid crystal layer, 778: structure, 780: anisotropic conductive film, 782: light-emitting element, 784: conductive film, 786: EL layer, 788: conductive film, 790: capacitor, 1280a: p-channel transistor, 1280b: n-channel transistor, 1280c: n-channel transistor, 1281: capacitor, 1282: transistor, 1311: wiring, 1312: wiring, 1313: wiring, 1314: wiring, 1315: wiring, 1316: wiring, 1317: wiring, 1351: transistor, 1352: transistor, 1353: transistor, 1354: transistor, 1360: photoelectric conversion element, 1401: signal, 1402: signal, 1403: signal, 1404: signal, 1405: signal, 8000: display module, 8001: upper cover, 8002: lower cover, 8003: FPC, 8004: touch panel, 8005: FPC, 8006: display panel, 8007: backlight, 8008: light source, 8009: frame, 8010: printed board, 8011: battery, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9200: portable information terminal, 9201: portable information terminal.

This application is based on Japanese Patent Application serial no. 2015-104495 filed with Japan Patent Office on May 22, 2015, the entire contents of which are hereby incorporated by reference.

The invention claimed is:

1. A semiconductor device comprising a transistor,
wherein the transistor comprises:
   a first oxide semiconductor film over a first insulating film;
   a gate insulating film over the first oxide semiconductor film;
   a second oxide semiconductor film over the gate insulating film; and
   a second insulating film over the first oxide semiconductor film and the second oxide semiconductor film,
wherein the first oxide semiconductor film comprises:
   a channel region overlapping with the second oxide semiconductor film;
   a source region in contact with the second insulating film; and
   a drain region in contact with the second insulating film,
wherein the channel region comprises:
   a first layer; and
   a second layer which is in contact with a top surface of the first layer and covers a side surface of the first layer in a channel width direction, and
wherein the second oxide semiconductor film has a higher carrier density than the first oxide semiconductor film.

2. The semiconductor device according to claim 1, further comprising a region in which an upper end portion of the gate insulating film is aligned with or positioned further outward than a lower end portion of the second oxide semiconductor film.

3. The semiconductor device according to claim 1, wherein the second insulating film comprises at least one of nitrogen and hydrogen.

4. The semiconductor device according to claim 1, wherein the transistor further comprises:
   a third insulating film over the second insulating film;
   a source electrode connected to the source region through an opening in the second insulating film and the third insulating film; and
   a drain electrode connected to the drain region through an opening in the second insulating film and the third insulating film.

5. The semiconductor device according to claim 1, wherein the source region and the drain region each comprise a region having the same hydrogen concentration as the second oxide semiconductor film.

6. The semiconductor device according to claim 1, wherein the source region and the drain region each comprise at least one of hydrogen, boron, carbon, nitrogen, fluorine, phosphorus, sulfur, and a rare gas.

7. The semiconductor device according to claim 1, wherein at least one of the first oxide semiconductor film and the second oxide semiconductor film comprises oxygen, In, Zn, and M (M is Al, Ga, Y, or Sn).

8. The semiconductor device according to claim 1,
wherein at least one of the first oxide semiconductor film and the second oxide semiconductor film comprises a crystal part, and
wherein the crystal part has c-axis alignment.

9. A display device comprising:
the semiconductor device according to claim 1; and
a display element.

10. A semiconductor device comprising a transistor,
wherein the transistor comprises:
a first oxide semiconductor film over a first insulating film;
a gate insulating film over the first oxide semiconductor film;
a second oxide semiconductor film over the gate insulating film; and
a second insulating film over the first oxide semiconductor film and the second oxide semiconductor film,
wherein the first oxide semiconductor film comprises:
a channel region overlapping with the second oxide semiconductor film;
a source region in contact with the second insulating film; and
a drain region in contact with the second insulating film,
wherein the channel region comprises:
a first layer;
a second layer which is in contact with a top surface of the first layer and covers a side surface of the first layer in a channel width direction; and
a third layer in contact with a bottom surface of the first layer, and
wherein the second oxide semiconductor film has a higher carrier density than the first oxide semiconductor film.

11. The semiconductor device according to claim 10, further comprising a region in which an upper end portion of the gate insulating film is aligned with or positioned further outward than a lower end portion of the second oxide semiconductor film.

12. The semiconductor device according to claim 10, wherein the second insulating film comprises at least one of nitrogen and hydrogen.

13. The semiconductor device according to claim 10,
wherein the transistor further comprises:
a third insulating film over the second insulating film;
a source electrode connected to the source region through an opening in the second insulating film and the third insulating film; and
a drain electrode connected to the drain region through an opening in the second insulating film and the third insulating film.

14. The semiconductor device according to claim 10, wherein the source region and the drain region each comprise a region having the same hydrogen concentration as the second oxide semiconductor film.

15. The semiconductor device according to claim 10, wherein the source region and the drain region each comprise at least one of hydrogen, boron, carbon, nitrogen, fluorine, phosphorus, sulfur, and a rare gas.

16. The semiconductor device according to claim 10, wherein at least one of the first oxide semiconductor film and the second oxide semiconductor film comprises oxygen, In, Zn, and M (M is Al, Ga, Y, or Sn).

17. The semiconductor device according to claim 10,
wherein at least one of the first oxide semiconductor film and the second oxide semiconductor film comprises a crystal part, and
wherein the crystal part has c-axis alignment.

18. A semiconductor device comprising a transistor,
wherein the transistor comprises:
a first oxide semiconductor film over a first insulating film;
a gate insulating film over the first oxide semiconductor film;
a second oxide semiconductor film over the gate insulating film;
a conductive film over the second oxide semiconductor film; and
a second insulating film over the first oxide semiconductor film and the conductive film,
wherein the first oxide semiconductor film comprises:
a channel region overlapping with the second oxide semiconductor film;
a source region in contact with the second insulating film; and
a drain region in contact with the second insulating film,
wherein the channel region comprises:
a first layer; and
a second layer which is in contact with a top surface of the first layer and covers a side surface of the first layer in a channel width direction, and
wherein the second oxide semiconductor film has a higher carrier density than the first oxide semiconductor film.

19. The semiconductor device according to claim 18, further comprising a region in which an upper end portion of the gate insulating film is aligned with or positioned further outward than a lower end portion of the second oxide semiconductor film.

20. The semiconductor device according to claim 18, wherein the second insulating film comprises at least one of nitrogen and hydrogen.

21. The semiconductor device according to claim 18,
wherein the transistor further comprises:
a third insulating film over the second insulating film;
a source electrode connected to the source region through an opening in the second insulating film and the third insulating film; and
a drain electrode connected to the drain region through an opening in the second insulating film and the third insulating film.

22. The semiconductor device according to claim 18, wherein the source region and the drain region each comprise a region having the same hydrogen concentration as the second oxide semiconductor film.

23. The semiconductor device according to claim 18, wherein the source region and the drain region each comprise at least one of hydrogen, boron, carbon, nitrogen, fluorine, phosphorus, sulfur, and a rare gas.

24. The semiconductor device according to claim 18, wherein at least one of the first oxide semiconductor film and the second oxide semiconductor film comprises oxygen, In, Zn, and M (M is Al, Ga, Y, or Sn).

25. The semiconductor device according to claim 18,
wherein at least one of the first oxide semiconductor film and the second oxide semiconductor film comprises a crystal part, and
wherein the crystal part has c-axis alignment.

* * * * *